US012289983B2

United States Patent
Ko et al.

(10) Patent No.: US 12,289,983 B2
(45) Date of Patent: Apr. 29, 2025

(54) HOLE-TRANSPORTING INK COMPOSITION, LIGHT-EMITTING DEVICE, AND METHOD OF PREPARING THE LIGHT-EMITTING DEVICE

(71) Applicant: Samsung Display Co., Ltd., Yongin-si (KR)

(72) Inventors: Hyojin Ko, Yongin-si (KR); Changhee Lee, Yongin-si (KR); Dukki Kim, Yongin-si (KR); Sehun Kim, Yongin-si (KR); Youngil Kim, Yongin-si (KR); Seungmook Lee, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 800 days.

(21) Appl. No.: 17/333,354

(22) Filed: May 28, 2021

(65) Prior Publication Data

US 2021/0376244 A1 Dec. 2, 2021

(30) Foreign Application Priority Data

May 29, 2020 (KR) .......................... 10-2020-0065183

(51) Int. Cl.
*H10K 85/10* (2023.01)
*C09D 11/38* (2014.01)
(Continued)

(52) U.S. Cl.
CPC ............ *H10K 85/111* (2023.02); *C09D 11/38* (2013.01); *C09D 11/52* (2013.01); *H10K 50/115* (2023.02);
(Continued)

(58) Field of Classification Search
CPC ...... H10K 85/111; H10K 50/17; H10K 50/00; H10K 50/115; H10K 50/12; C09D 11/38;
(Continued)

(56) References Cited

U.S. PATENT DOCUMENTS

| 5,652,286 A | 7/1997 | Deng |
| 8,298,444 B2 | 10/2012 | Yamada et al. |

(Continued)

FOREIGN PATENT DOCUMENTS

| CN | 101679206 | 3/2010 |
| CN | 102227830 | 10/2011 |

(Continued)

OTHER PUBLICATIONS

Choi et al. (Journal of Polymer Science: Part A: Polymer Chemistry, vol. 48, 5189-5197 (2010).*

(Continued)

*Primary Examiner* — Shane Fang
(74) *Attorney, Agent, or Firm* — Womble Bond Dickinson (US) LLP

(57) ABSTRACT

According to one aspect of the invention, a hole-transporting ink composition for a light emitting device, the hole-transporting ink composition includes an adhesion-promoting compound represented by Formula 1 and a hole-transporting compound:

$$A_1-B_1-C_1 \quad \text{Formula 1}$$

wherein, in Formula 1, the variables are defined above.

8 Claims, 3 Drawing Sheets

(51) Int. Cl.
    *C09D 11/52*    (2014.01)
    *H10K 50/115*   (2023.01)
    *H10K 50/17*    (2023.01)
    *H10K 71/00*    (2023.01)
    *H10K 71/12*    (2023.01)

(52) U.S. Cl.
    CPC ............. *H10K 50/17* (2023.02); *H10K 71/00* (2023.02); *H10K 71/12* (2023.02)

(58) Field of Classification Search
    CPC ........ C09D 11/52; C09D 5/24; C09D 179/02; H01L 51/0094; H01L 51/0039; H01L 51/0035; H01L 51/0043; H01L 51/5056; H01L 51/5088; C08G 2261/3162; C08G 2261/76; C08G 2261/95; C08G 73/0246; C08L 79/02
    See application file for complete search history.

(56) References Cited

U.S. PATENT DOCUMENTS

| | | | |
|---|---|---|---|
| 8,747,700 B2 | 6/2014 | Nakaie et al. | |
| 9,093,650 B2 | 7/2015 | Kim et al. | |
| 10,153,439 B2 | 12/2018 | Nakaie et al. | |
| 10,193,075 B2 | 1/2019 | Nakaie et al. | |
| 10,326,111 B2 | 6/2019 | Yoo et al. | |
| 10,903,442 B2 | 1/2021 | Lee et al. | |
| 2001/0026878 A1* | 10/2001 | Woo | C09K 11/06 428/917 |
| 2006/0127562 A1 | 6/2006 | Lewis et al. | |
| 2010/0230639 A1 | 9/2010 | Yamada et al. | |
| 2010/0289728 A1* | 11/2010 | Nakatani | H10K 71/12 345/76 |
| 2011/0143047 A1 | 6/2011 | Kappaun et al. | |
| 2011/0195355 A1* | 8/2011 | Yamada et al. | C09K 11/06 430/74 |
| 2013/0112951 A1 | 5/2013 | Xia et al. | |
| 2014/0199527 A1 | 7/2014 | Yu et al. | |
| 2017/0005271 A1 | 1/2017 | Nakaie et al. | |
| 2017/0018600 A1 | 1/2017 | Ito et al. | |
| 2017/0200899 A1 | 7/2017 | Kim et al. | |
| 2017/0213986 A1 | 7/2017 | Nakaie et al. | |
| 2017/0283634 A1 | 10/2017 | Park et al. | |
| 2018/0248130 A1 | 8/2018 | Shin et al. | |
| 2018/0327622 A1 | 11/2018 | Pan et al. | |
| 2019/0027705 A1 | 1/2019 | Chen et al. | |
| 2019/0127608 A1 | 5/2019 | Kim et al. | |
| 2019/0259956 A1 | 8/2019 | Shin et al. | |
| 2019/0393287 A1 | 12/2019 | Kim | |
| 2020/0280001 A1 | 9/2020 | Kang et al. | |

FOREIGN PATENT DOCUMENTS

| | | |
|---|---|---|
| CN | 106103406 | 11/2016 |
| CN | 106575709 | 4/2017 |
| CN | 108137970 | 6/2018 |
| CN | 110649165 | 1/2020 |
| DE | 69603256 | 11/1999 |
| EP | 2143708 | 1/2010 |
| EP | 2339659 A1 | 6/2011 |
| EP | 3118187 A1 | 1/2017 |
| EP | 3174115 A1 | 5/2017 |
| JP | 2005085731 | 3/2005 |
| KR | 10-2017-0002740 | 1/2017 |
| KR | 10-2018-0099965 A | 9/2018 |
| KR | 10-2019-0031602 | 3/2019 |
| KR | 10-2019-0055281 | 5/2019 |
| KR | 10-2019-0103756 | 9/2019 |
| WO | 2011076323 | 6/2011 |

OTHER PUBLICATIONS

Satoru Ohisa et al: "Inhibition of solution-processed 1,4,5,8,9,11-hexaazatriphenylene-hexacarbonitrile crystallization by mixing additives for hole injection layers in organic light-emitting devices", Polymer Journal, vol. 49, No. 1, Sep. 28, 2016(Sep. 28, 2016), pp. 149-154, XP055405985, London ISSN: 0032-3896, DOI: 10.1038/pj.2016.92.

Extended European Search Report dated Mar. 18, 2020, issued in European Patent Application No. 21176740.5.

* cited by examiner

FIG. 4

| INK | INK COMPOSITION OF COMPARATIVE PREPARATION EXAMPLE 1 | | INK COMPOSITION OF PREPARATION EXAMPLE | |
|---|---|---|---|---|
| | 1 drop | 3 drop | 1 drop | 3 drop |
| Pixel | | | | |
| Wetting | dewet | OK | OK | OK |

HOLE-TRANSPORTING INK COMPOSITION, LIGHT-EMITTING DEVICE, AND METHOD OF PREPARING THE LIGHT-EMITTING DEVICE

CROSS-REFERENCE TO RELATED APPLICATION

This application claims priority from and the benefit of Korean Patent Application No.10-2020-0065183, filed on May 29, 2020,which is hereby incorporated by reference for all purposes as if fully set forth herein.

BACKGROUND

Field

Exemplary implementations of the invention relate generally to display devices and, more particularly, to a hole-transporting ink composition, a light-emitting device, and a method of preparing the light-emitting device.

Discussion of the Background

Organic light-emitting devices (OLEDs) are self-emission devices that, as compared with conventional devices, have wide viewing angles, high contrast ratios, short response times, and excellent characteristics in terms of luminance, driving voltage, and response speed, and produce full-color images.

OLEDs may include a first electrode located on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

The above information disclosed in this Background section is only for understanding of the background of the inventive concepts, and, therefore, it may contain information that does not constitute prior art.

SUMMARY

Hole-transporting ink compositions, light-emitting devices, and methods of preparing the light-emitting devices according the principles and exemplary implementations of the invention are capable of exhibiting excellent effects in terms of luminance, luminescence efficiency, lifespan, and driving voltage. According to the one or more exemplary implementations of the invention, a hole-transporting ink composition has improved wettability and excellent in-pixel uniformity (IPU) during a solution process. Therefore, a light-emitting device prepared by using the hole-transporting ink composition may exhibit excellent characteristics, such as high luminance, high efficiency, a long lifespan, and a low driving voltage.

Additional features of the inventive concepts will be set forth in the description which follows, and in part will be apparent from the description, or may be learned by practice of the inventive concepts.

According to one aspect of the invention, a hole-transporting ink composition for a light emitting device, the hole-transporting ink composition includes an adhesion-promoting compound represented by Formula 1 and a hole-transporting compound:

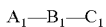   Formula 1 wherein, in Formula 1, $A_1$ is —Si$(Q_1)(Q_2)(Q_3)$, —S$(Q_1)$, —P(=O)$(Q_1)(Q_2)$, or —C(=O)$(Q_1)$, $B_1$ is a substituted or unsubstituted $C_1$-$C_{60}$ alkylene group, a substituted or unsubstituted $C_2$-$C_{60}$ alkenylene group, or a substituted or unsubstituted $C_2$-$C_{60}$ alkynylene group, $C_1$ is —O$(Q_4)$, —S$(Q_4)$, —C(=O)$(Q_4)$, —N$(Q_4)(Q_5)$, a substituted or unsubstituted acryl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ fluoroalkyl group, and $Q_1$ to $Q_5$ are each, independently from one another, hydrogen, deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, or a substituted or unsubstituted monovalent non-aromatic fused heteropolycyclic group.

The adhesion-promoting compound may include a silane compound or a thiol compound.

The adhesion-promoting compound may include a self-assembled monomolecule for forming a self-assembled monolayer.

The hole-transporting compound may include a compound represented by Formula 201 or 202, or the hole-transporting compound may include a polymeric compound including a repeating unit made from a compound represented by Formula 201 or 202: wherein, in Formulae 201 and 202, the variables are defined herein.

The hole-transporting ink composition may further include a solvent, the solvent may include a non-polar solvent, and the adhesion-promoting compound may be soluble in the non-polar solvent.

Based on 100 parts by weight of the hole-transporting ink composition, an amount of the adhesion-promoting compound may be in a range of about 0.1 parts by weight to about 10 parts by weight, and an amount of the hole-transporting compound may be in a range of about 0.1 parts by weight to about 50 parts by weight.

The hole-transporting ink composition may not include a luminescent material.

The hole-transporting ink composition may consist of the adhesion-promoting compound, the hole-transporting compound, and the solvent.

According to another aspect of the invention, a light-emitting device includes:
a first electrode;
a second electrode facing the first electrode; and
an interlayer disposed between the first electrode and the second electrode and including an emission layer, wherein the interlayer further includes a hole transport region disposed between the first electrode and the emission layer, and the hole transport region includes an adhesion-promoting compound represented by Formula 1 and a hole-transporting compound:

$$A_1\text{—}B_1\text{—}C_1 \quad \text{Formula 1}$$

wherein, in Formula 1, the variables are defined above.

The hole transport region may include a hole injection layer, a hole transport layer, an emission auxiliary layer, an electron blocking layer, or any combination thereof.

The hole transport region may include a self-assembled monolayer contacting the first electrode, and the self-assembled monolayer consists of the adhesion-promoting compound.

The self-assembled monolayer may have a thickness in a range of about 0.1 nm to about 100 nm.

The hole transport region may include a hole injection layer, and the hole injection layer may include the self-assembled monolayer and the hole-transporting compound.

The hole injection layer may be formed by using the hole-transporting ink composition including the adhesion-promoting compound and the hole-transporting compound.

The hole transport region may further include a p-dopant having a lowest unoccupied molecular orbital energy level of equal to or less than about −3.5 eV.

The emission layer may include a host and a dopant, and an amount of the host may be greater than an amount of the dopant.

The emission layer may include quantum dots.

The first electrode may be an anode, the second electrode may be a cathode, the interlayer may further include a hole transport region disposed between the first electrode and the emission layer and an electron transport region disposed between the emission layer and the second electrode, and the electron transport region may include a buffer layer, a hole blocking layer, an electron control layer, an electron transport layer, an electron injection layer, or any combination thereof.

The electron transport region may further include an alkali metal, an alkaline s earth metal, a rare earth metal, an alkali metal compound, an alkaline earth-metal compound, a rare earth metal compound, an alkali metal complex, an alkaline earth-metal complex, a rare earth metal complex, or any combination thereof According to a further aspect of the invention, a method of preparing a light-emitting device, the method includes the steps of:

providing a device workpiece, including a first electrode; a second electrode facing the first electrode, and an interlayer disposed between the first electrode and the second electrode and including an emission layer, wherein the interlayer further includes a hole transport region disposed between the first electrode and the emission layer, and the hole transport region includes an adhesion-promoting compound represented by Formula 1 and a hole-transporting compound, and disposing the hole transport region on the first electrode by forming the hole transport region with a solution including a hole-transporting ink composition including the adhesion-promoting compound and the hole-transporting compound:

$$A_1\text{—}B_1\text{—}C_1 \quad \text{Formula 1}$$

wherein, in Formula 1, the variables are defined herein.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 4 is a depiction of results of evaluating wettability and in-pixel uniformity of a comparative and exemplary embodiments of hole-transporting ink compositions.

DETAILED DESCRIPTION

Figure 1:
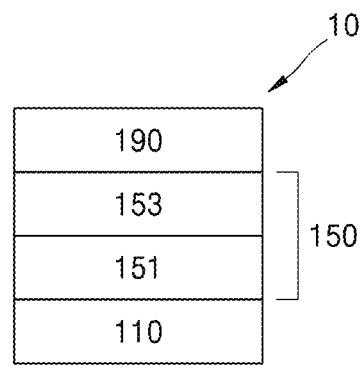
FIG. 1 is a schematic view of an exemplary embodiment illustrating a light-emitting device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other s element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be s schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hole-Transporting Ink Composition

An exemplary embodiment of a hole-transporting ink composition according to an aspect of the invention includes an adhesion-promoting compound and a hole-transporting compound, wherein the adhesion-promoting compound is represented by Formula 1:

$$A_1—B_1—C_1 \qquad \text{Formula 1}$$

wherein, in Formula 1, $A_1$ may be —Si($Q_1$)($Q_2$)($Q_3$), —S($Q_1$), —P(=O)($Q_1$)($Q_2$), or —C(=O)($Q_1$), $B_1$ may be a substituted or unsubstituted $C_1$-$C_{60}$ alkylene group, a substituted or unsubstituted $C_2$-$C_{60}$ alkenylene group, or a substituted or unsubstituted $C_2$-$C_{60}$ alkynylene group, $C_1$ may be —O($Q_4$), —S($Q_4$), —C(=O)($Q_4$), —N($Q_4$)($Q_5$), a substituted or unsubstituted acryl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ fluoroalkyl group, and $Q_1$ to $Q_5$ may each independently be hydrogen, deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In some exemplary embodiments, the adhesion-promoting compound may be a silane compound, a thiol compound, or any combination thereof.

In some exemplary embodiments, the adhesion-promoting compound may be a self-assembled monomolecule capable of forming a self-assembled monolayer.

For example, the adhesion-promoting compound may be (3-aminopropyl)trimethoxysilane, (3-aminopropyl)triethoxysilane, N-(2-aminoethyl)-3-aminopropyltrimethoxysilane, (3-glycidyloxy propyl)trimethoxysilane, 3-glycidoxypropylmethyl diethoxysilane, (1-hydroxyallyl)trimethylsilane, trimethoxy[2-(7-oxabicyclo[4.1.0]-3-heptyl)ethyl]silane, acetoxyethyl triethoxysilane, (3-mercaptopropyl)trimethoxysilane, 3-(2-aminoethyl) aminopropyl trimethoxysilane, 3-(2-aminoethyl) aminopropyl trimethoxysilane, amino methoxysilane (silanamine), aminoethylaminopropyl trimethoxysilane, 3-aminopropyl methyl diethoxysilane, phenylaminopropyl trimethoxysilane, methacryloxypropyl trimethoxysilane, 3-methacryloxypropyl methyl dimethoxysilane, 3-chloropropyl trimethoxysilane, vinyl triacetoxysilane, vinylbenzylaminoethyl aminopropyl trimethoxysilane, vinyl trimethoxysilane, 2-(3,4-epoxycyclohexyl)ethyl trimethoxysilane, 3-glycidoxypropyl methyl dimethoxysilane, glycidoxypropyl trimethoxysilane, methyl trimethoxysilane, tetraethoxysilane, octyl triethoxysilane, methyl triethoxysilane, methyl trimethoxysilane, tris-[3-(trimethoxysilyl)propyl] isocyanurate, hexadecyl trimethoxysilane, vinyl triethoxysilane, vinyl trimethoxysilane, vinyl-tris-(2-methoxyethoxy) silane, γ-methacryloxypropyl trimethoxysilane, methacrylamido silane, γ-methacryloxypropyl triethoxysilane, γ-methacryloxypropyl-tris-(2-propoxy)silane, β-(3,4-epoxycyclohexyl)ethyl trimethoxysilane, β-(3,4-epoxycyclohexyl)ethyl triethoxysilane, γ-glycidoxypropyl trimethoxysilane, γ-methacryloxypropyl triethoxysilane,3-glycidoxypropylmethyl diethoxysilane, γ-mercaptopropyl trimethoxysilane, γ-mercaptopropyl triethoxysilane, 3-octanoylthio-1-propyl triethoxysilane, 3-octanoylthio-1-propyltrialkoxysilane, γ-aminopropyl triethoxysilane, γ-aminopropyl triethoxysilane, γ-aminopropyl silsesquioxane, γ-aminopropyl trimethoxysilane, N-β-(aminoethyl)-γ-aminopropyl trimethoxysilane, benzylaminosilane, triaminofunctional silane, bis-(γ-triethoxysilylpropyl) amine, bis-(γ-trimethoxysilylpropyl)amine, polyazamide, N-β-(aminoethyl)γ-aminopropylmethyl dimethoxysilane, N-ethyl-3-trimethoxysilyl-methylpropamine, aminofunctional oligosiloxane, γ-ureidopropyl trialkoxysilane(gamma-ureidopropyl trialkoxysilane), γ-ureidopropyl triethoxysilane, γ-isocyanotopropyl triethoxysilane(gamma-isocyanatopropyl triethoxysilane), γ-isocyanotopropyl trimethoxysilane, phenethyl trichlorosilane, phenyl trichlorosilane, benzyl trichlorosilane, tolyl trichlorosilane, 2-[(trimethoxylyl)ethyl]-2-pyridine, 4-biphenylyl trimethoxysilane,octadecyl trichlorosilane, 1-naphtyltrimethoxysilane, 1-[(trimethoxylyl)methyl]naphthalene, (9-methylanthracenyl)trimethoxysilane, or any combination thereof.

The hole-transporting ink composition according to some exemplary embodiments includes the adhesion-promoting compound, so that, during a solution process, wettability and in-pixel uniformity (IPU) of the hole-transporting ink composition may be improved.

In detail, in the case of performing a solution process on a substrate or electrode by using the hole-transporting ink composition, the adhesion-promoting compound forms a self-assembled monolayer on a surface of a liquid-repellent substrate or electrode, so that a uniform layer may be formed by using the hole-transporting ink composition in an appropriate amount. Therefore, a light-emitting device prepared by using the hole-transporting ink composition may exhibit excellent characteristics, such as high luminance, high efficiency, a long lifespan, and a low driving voltage.

The hole-transporting ink composition may also include a hole-transporting compound. In some exemplary embodiments, the hole-transporting compound may be a compound including at least one hole-transporting moiety. For example, the hole-transporting compound may include a carbazole group, a dibenzofuran group, a dibenzothiophene group, an indolocarbazole group, a bis-carbazole group, an amine group, or any combination thereof.

In one or more exemplary embodiments, the hole-transporting compound may be a polymeric compound including a repeat unit that includes at least one hole-transporting moiety. For example, the hole-transporting compound may be a polymeric compound including a repeat unit represented by Formula HIL1:

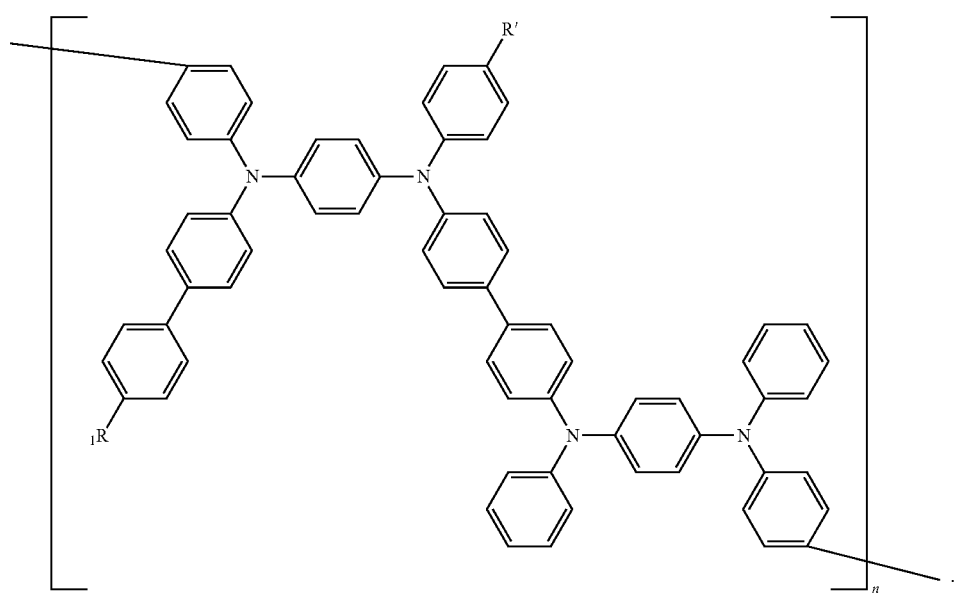

Formula HIL1

In Formula HIL1,

R and R' may each independently be hydrogen, deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and n may be an integer.

In addition, the hole-transporting compound may include poly(3,4-ethylenedioxythiophene)/poly(4-styrenesulfonate)/poly(4-styrenesulfonate) (PEDOT/PSS), polythiophene and a derivative thereof, polyaniline and a derivative thereof, polypyrrole and a derivative thereof, or any combination thereof.

The hole-transporting compound may be, for example, a compound having the following structure:

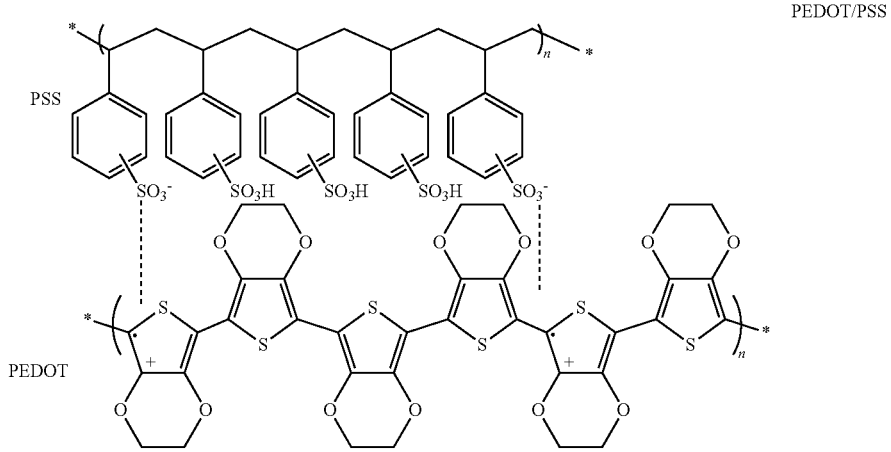

PEDOT/PSS (wherein n is an integer).

In some exemplary embodiments, examples of the hole-transporting compound are not limited to those described above, and any compound that may be included in a hole transport region of a light-emitting device to be described below may be used. For example, the hole-transporting compound may include a compound represented by Formula 201 or 202, or may include a polymeric compound including a repeat unit derived from the compound is represented by Formula 201 or 202.

In some exemplary embodiments, the hole-transporting ink composition may further include a solvent. For example, the solvent included in the hole-transporting ink composition may be a non-polar solvent. In addition, the adhesion-promoting compound included in the hole-transporting ink composition may be soluble in such a non-polar solvent.

In some exemplary embodiments, the solvent may include a $C_6$-$C_{20}$ aliphatic hydrocarbon, a $C_5$-$C_{20}$ aromatic hydrocarbon, chloroform, methylene chloride, ethylacetate, ethyleneglycol, diethyleneglycol, or any combination thereof.

In some exemplary embodiments, based on 100 parts by weight of the hole-transporting ink composition, an amount of the adhesion-promoting compound may be in a range of about 0.1 parts by weight to about 10 parts by weight, for example, about 0.5 parts by weight to about 8 parts by weight, or about 1 parts by weight to about 7 parts by weight, and an amount of the hole-transporting compound may be in a range of about 0.1 parts by weight to about 50 parts by weight, for example, about 0.5 parts by weight to about 40 parts by weight, or about 1 parts by weight to about 30 parts by weight.

In some exemplary embodiments, the hole-transporting ink composition may not include a luminescent material. That is, in the case of forming a certain layer among an interlayer of a light-emitting device by using the hole-transporting ink composition, the certain layer may not be an emission layer.

In some exemplary embodiments, the hole-transporting ink composition consists of the adhesion-promoting compound, the hole-transporting compound, and the solvent. For example, the hole-transporting ink composition may include, based on 100 parts by weight, the adhesion-promoting compound in the amount of about 0.1 parts by weight to about 10 parts by weight, the hole-transporting compound in the amount of about 0.1 parts by weight to about 50 parts by weight, and solvent of the remaining balance.

Light-Emitting Device

Some exemplary embodiments provide a light-emitting device including: a first electrode; a second electrode facing the first electrode; and an interlayer located between the first electrode and the second electrode and including an emission layer, wherein the interlayer further s includes a hole transport region located between the first electrode and the emission layer, and the hole transport region includes an adhesion-promoting compound represented by Formula 1 and a hole-transporting compound.

The adhesion-promoting compound and the hole-transporting compound included in the hole transport region of the light-emitting device may each be the same as described above.

Description of FIG. 1

Figure 2:
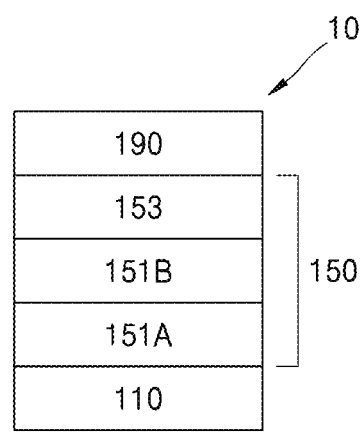
FIG. 2 is a schematic view of another exemplary embodiment illustrating a light-emitting device constructed according to principles of the invention.

FIG. 1 is a schematic view of an exemplary embodiment illustrating a light-emitting device constructed according to principles of the invention. The light-emitting device 10 may include a first electrode 110, an interlayer 150, and a second electrode 190, wherein the interlayer 150 includes a hole transport region 151 and an emission layer 153. In some exemplary embodiments, the hole transport region 151, as depicted in FIG. 2, may include a hole injection layer 151A, a hole transport layer 151B, an emission auxiliary layer, an electron blocking layer or any combination thereof In one or more exemplary embodiments, the hole transport region 151 may include a self-assembled monolayer that contacts the first electrode, and the self-assembled monolayer consists of the adhesion-promoting compound.

The light-emitting device according to some exemplary embodiments may have a structure in which the adhesion-promoting compound forms the self-assembled monolayer on the first electrode, thus having the hole transport region 151 uniformly formed.

In some exemplary embodiments, the thickness of the self-assembled monolayer may be in a range of about 0.1 nm to about 100 nm. In one or more exemplary embodiments, the thickness of the self-assembled monolayer may be in a range of about 0.5 nm to about 90 nm, or about 1 nm to about 75 nm.

In some exemplary embodiments, the hole transport region 151 may include a hole injection layer 151A, and the hole injection layer 151A may include the self-assembled monolayer and the hole-transporting compound.

For example, the hole injection layer may be formed by using the hole-transporting ink composition including the adhesion-promoting compound and the hole-transporting compound.

Hereinafter, the structure of the light-emitting device 10 according to some exemplary embodiments and a method of preparing the light-emitting device 10 will be described in connection with FIG. 1.

First Electrode 110

In FIG. 1, a substrate may be additionally located under the first electrode 110 or above the second electrode 190. The substrate may be a glass substrate or a plastic substrate.

The first electrode 110 may be formed by, for example, depositing or sputtering a material for forming the first electrode 110 on the substrate. When the first electrode 110 is an anode, a high work function material that can easily inject holes may be used as the material for forming the first electrode 110.

The first electrode 110 may be a reflective electrode, a semi-transmissive electrode, or a transmissive electrode. In some exemplary embodiments, when the first electrode 110 is a transmissive electrode, the material for forming the first electrode 110 may be indium tin oxide (ITO), indium zinc oxide (IZO), tin oxide ($SnO_2$), zinc oxide (ZnO), and any combination thereof, but the exemplary embodiments are not limited thereto. In one or more exemplary embodiments, when the first electrode 110 is a semi-transmissive electrode or a reflective electrode, the material for forming the first electrode 110 may be magnesium (Mg), silver (Ag), aluminum (Al), aluminum-lithium (Al—Li), calcium (Ca), magnesium-indium (Mg—In), magnesium-silver (Mg—Ag), or any combination thereof, but the exemplary embodiments are not limited thereto.

The first electrode 110 may have a single-layered structure consisting of a single layer or a multi-layered structure including a plurality of layers. For example, the first electrode 110 may have a three-layered structure of ITO/Ag/ITO, but the structure of the first electrode 110 is not limited thereto.

Interlayer 150

The interlayer 150 is located on the first electrode 110. The interlayer 150 includes an emission layer 153.

The interlayer 150 may further include the hole transport region 151 located between the first electrode 110 and the emission layer 153 and an electron transport region located between the emission layer 153 and the second electrode 190.

The interlayer 150 may further include metal-containing compounds, such as organometallic compounds, inorganic materials, such as quantum dots, and the like, in addition to various organic materials.

Hole Transport Region 151 in Interlayer 150

The hole transport region 151 may have: i) a single-layered structure consisting of a single layer consisting of a single material, ii) a single-layered structure consisting of a single layer consisting of a plurality of different materials, or iii) a multi-layered structure including a plurality of layers including different materials.

The hole transport region 151 may include a hole injection layer 151A, a hole transport layer 151B, an emission auxiliary layer, an electron blocking layer, or any combination thereof.

For example, the hole transport region 151 may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially stacked on the first electrode 110, but the exemplary embodiments are not limited thereto.

The hole transport region 151 may include a compound represented by Formula 201, a compound represented by Formula 202, or any combination thereof:

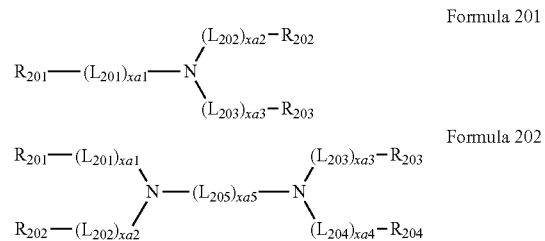

In Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be 0, 1, 2, or 3,
xa5 may be an integer from 1 to 10, and
$R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In some exemplary embodiments, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one or more exemplary embodiments, i) at least one of $R_{201}$ to $R_{203}$ in Formula 201 and ii) at least one of $R_{201}$ to $R_{204}$ in Formula 202 may each independently be a fluorenyl group, a spiro-bifluorenyl group, a benzofluorenyl group, an indeno phenanthrenyl group, a pyridinyl group, a pyrrolyl group, a thiophenyl group, a furanyl group, an indolyl group, a benzoindolyl group, an isoindolyl group, a benzoisoindolyl group, a benzosilolyl group, a benzothiophenyl group, a benzofuranyl group, a carbazolyl group, a dibenzosilolyl group, a dibenzothiophenyl group, or a dibenzofuranyl group, each unsubstituted or substituted with at least one of deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a phenanthrenyl group, an indenyl group, a fluorenyl group, a dimethylfluorenyl group, a diphenyl fluorenyl group, a spiro-bifluorenyl group, a benzofluorenyl group, a dimethyl benzofluorenyl group, a diphenyl benzofluorenyl group, an indeno phenanthrenyl group, a dimethylindeno phenanthrenyl group, a diphenylindeno phenanthrenyl group, a pyridinyl group, a pyrrolyl group, a thiophenyl group, a furanyl group, an indolyl group, a phenyl indolyl group, a benzoindolyl group, a phenylbenzoindolyl group, an isoindolyl group, a phenyl isoindolyl group, a benzoisoindolyl group, a phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyl dibenzosilolyl group, a diphenyl dibenzosilolyl group, a dibenzothiophenyl group, and a dibenzofuranyl group, but the exemplary embodiments are not limited thereto.

In one or more exemplary embodiments, the hole transport region 151 may include a polymeric compound including a repeat unit that is derived from the compound represented by Formula 201 or 202.

In one or more exemplary embodiments, the compound represented by Formula 201 or 202 may include at least one carbazole group.

In one or more exemplary embodiments, the compound represented by Formula 201 may not include a carbazole group.

In one or more exemplary embodiments, the compound represented by Formula 201 may be represented by Formula 201A-1:

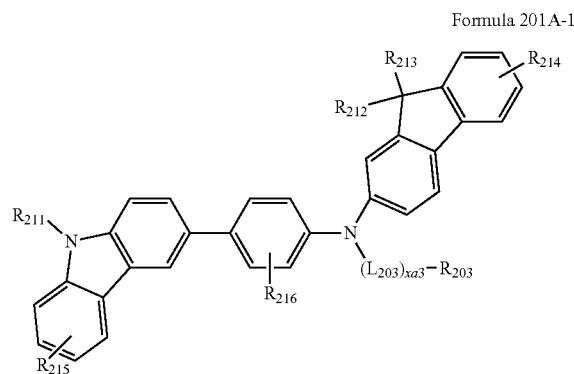

Formula 201A-1

In Formula 201A-1, $L_{203}$, xa3, and $R_{203}$ may each be the same as described above, and $R_{211}$ to $R_{216}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a phenanthrenyl group, an indenyl group, a fluorenyl group, a dimethylfluorenyl group, a diphenylfluorenyl group, a spiro-bifluorenyl group, a benzofluorenyl group, a dimethylbenzofluorenyl group, a diphenylbenzofluorenyl group, an indeno phenanthrenyl group, a dimethylindeno phenanthrenyl group, a diphenylindeno phenanthrenyl group, a pyridinyl group, a pyrrolyl group, a thiophenyl group, a furanyl group, an indolyl group, a phenylindolyl group, a benzoindolyl group, a phenylbenzoindolyl group, an isoindolyl group, a phenylisoindolyl group, a benzoisoindolyl group, a phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyldibenzosilolyl group, a diphenyldibenzosilolyl group, a dibenzothiophenyl group, or a dibenzofuranyl group.

The hole transport region 151 may include one of Compounds $HT_1$ to $HT_{44}$, m-MTDATA, TDATA, 2-TNATA, NPB(NPD), β-NPB, Spiro-TPD, Spiro-NPB, methylated-NPB, TAPC, HMTPD, 4,4′,4″-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof, but the exemplary embodiments are not limited thereto:

HT1
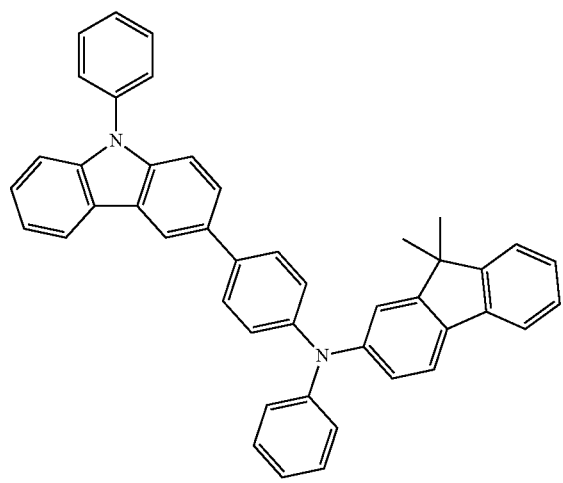
HT3
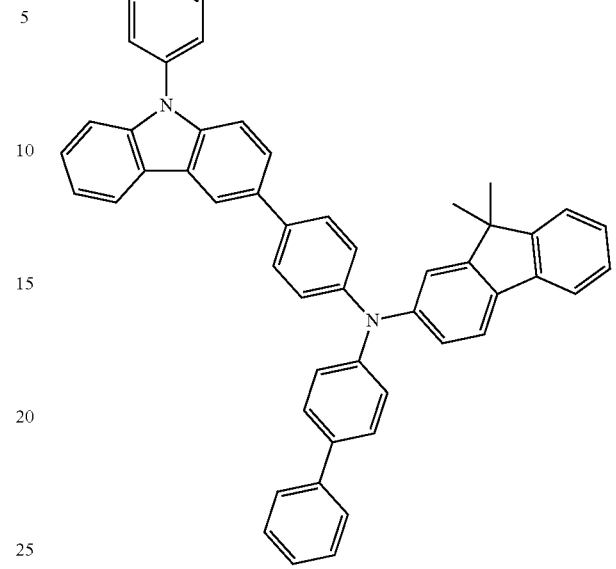
HT2
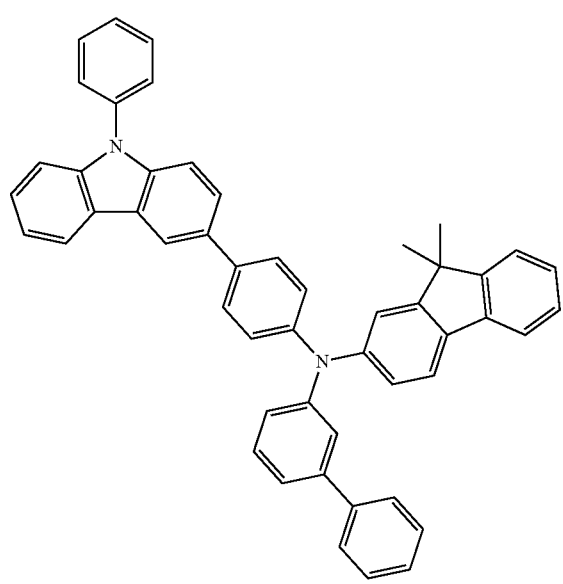
HT4
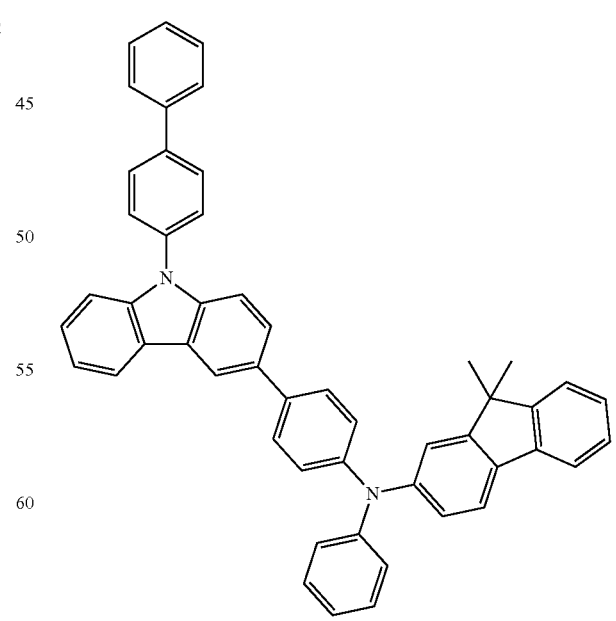

HT5
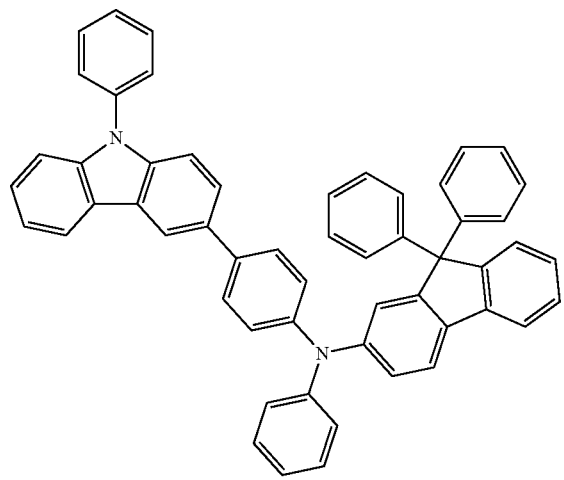
HT6
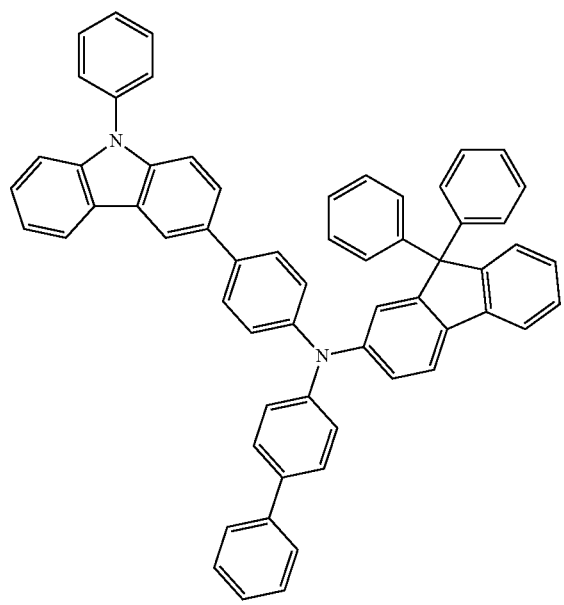
HT7
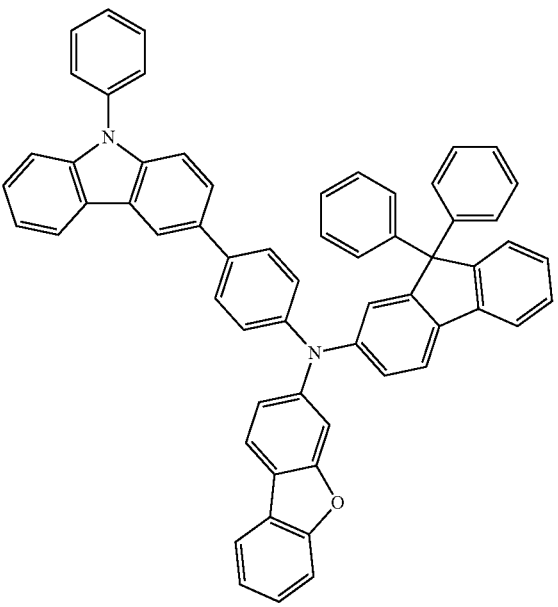
HT8
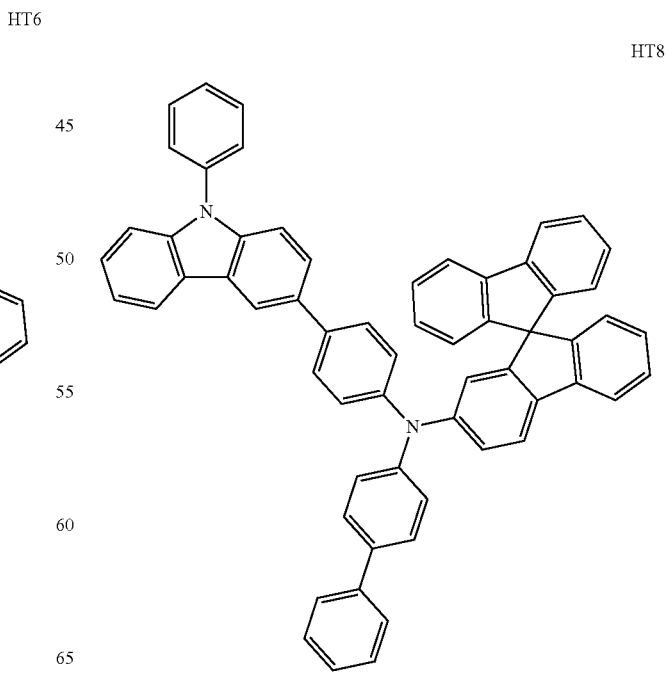

HT9
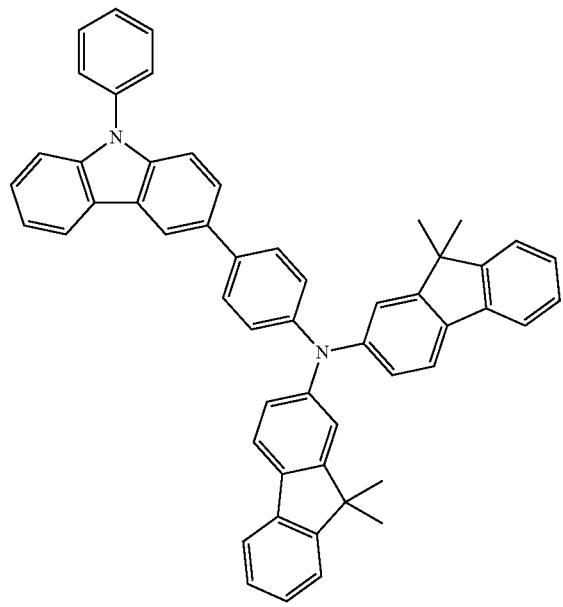
HT10
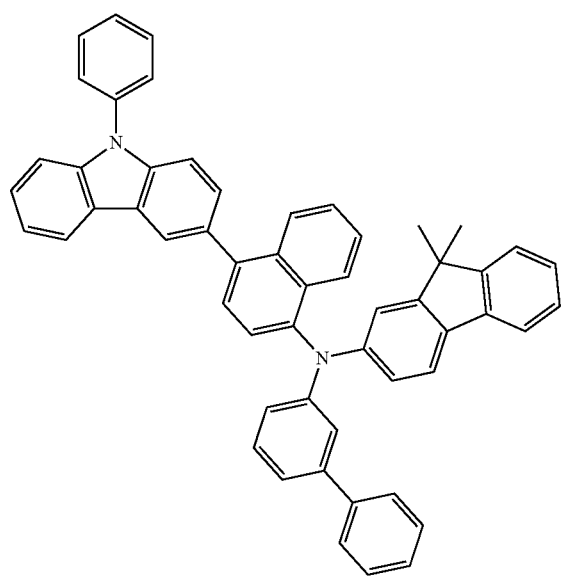
HT11
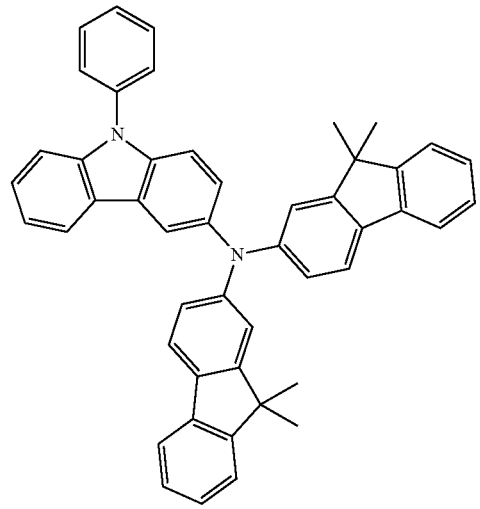
HT12
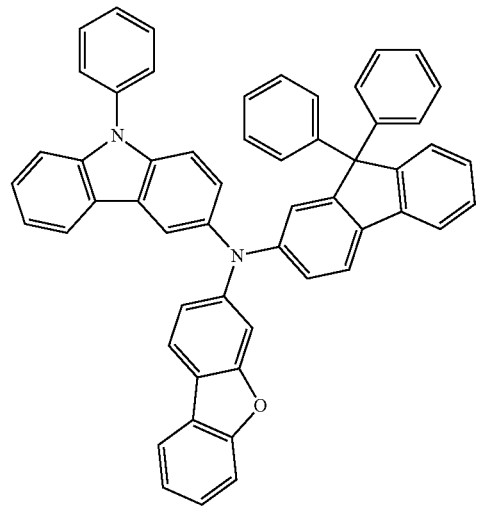
HT13
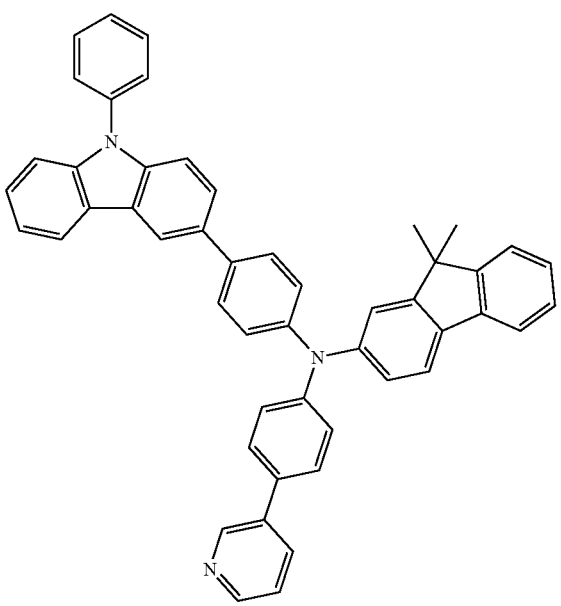

HT14
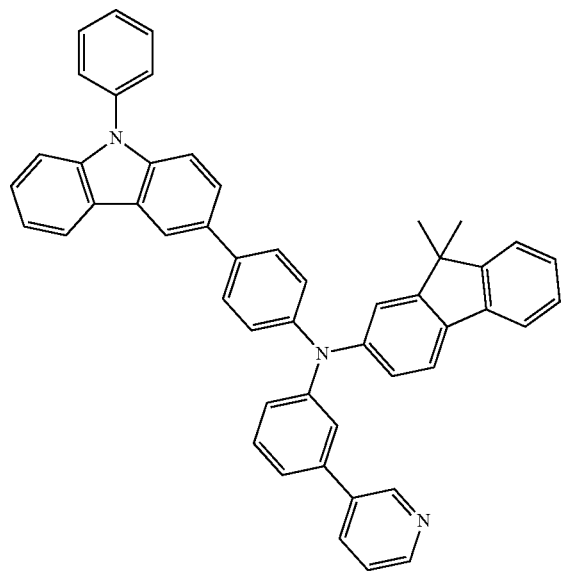
HT15
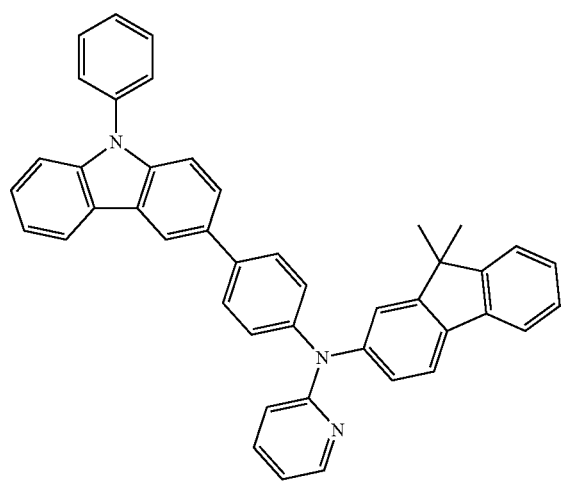
HT16
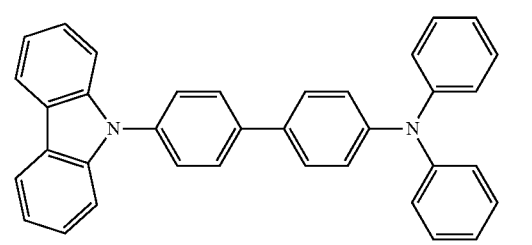
HT17
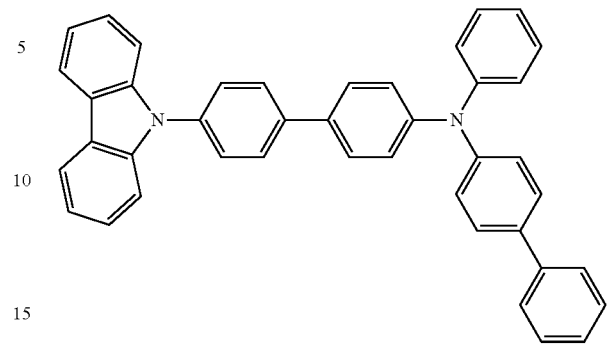
HT18
HT19
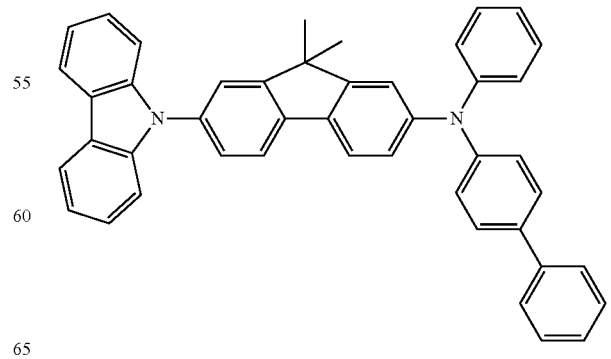

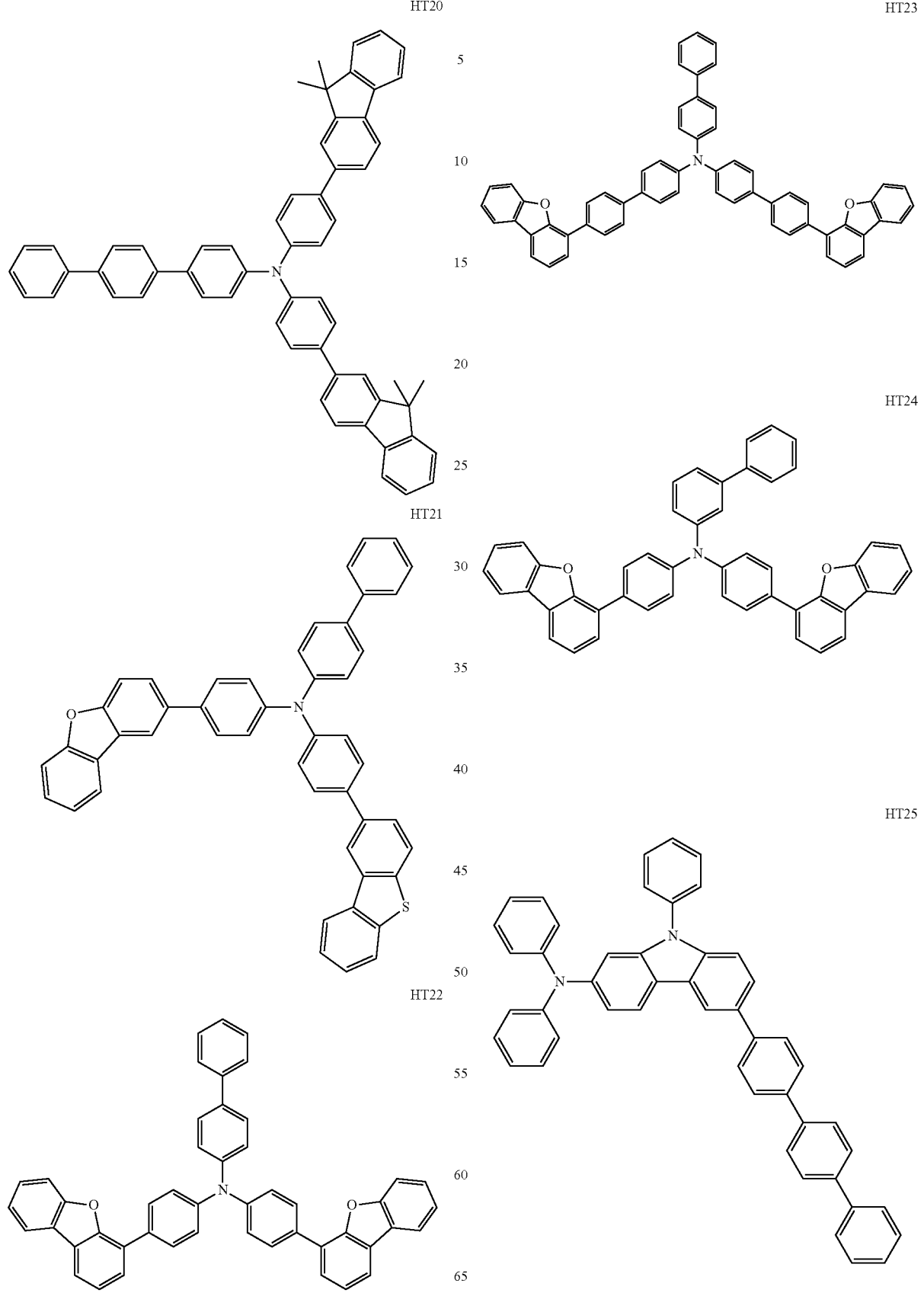

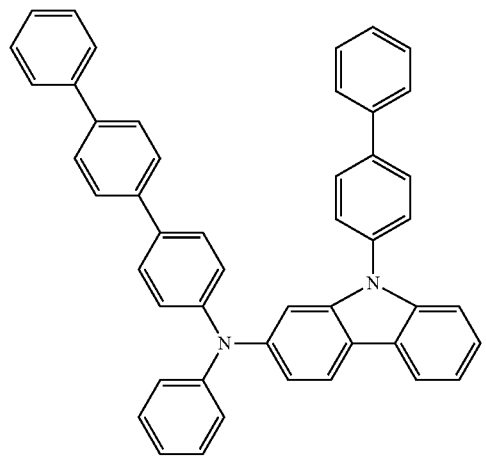
HT26
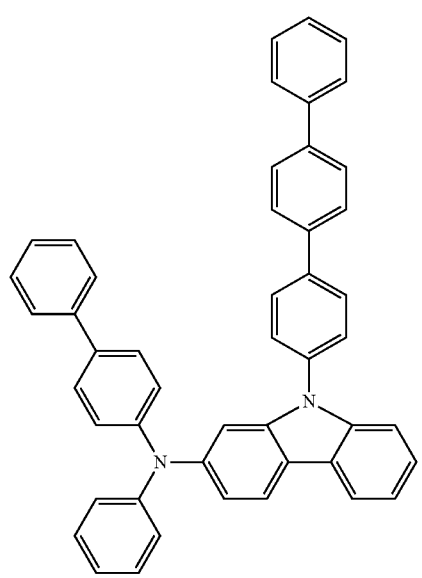
HT27
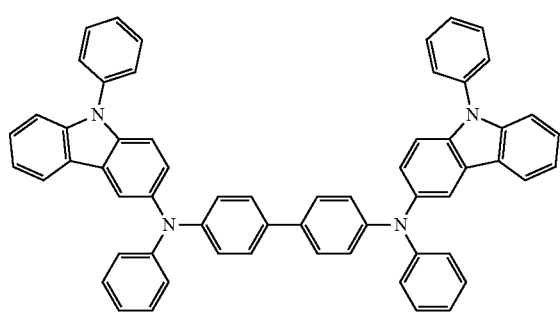
HT28
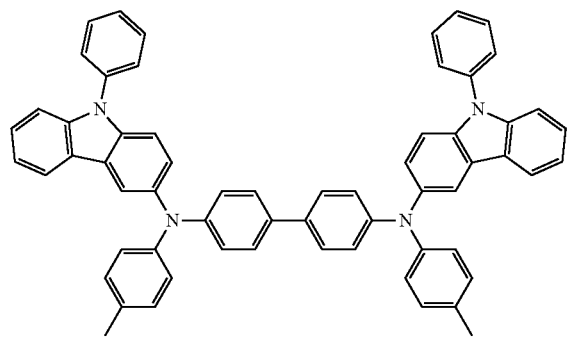
HT29
HT30
HT31
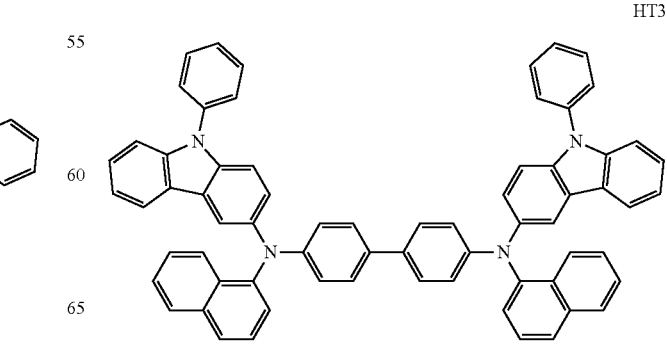
HT32

HT33
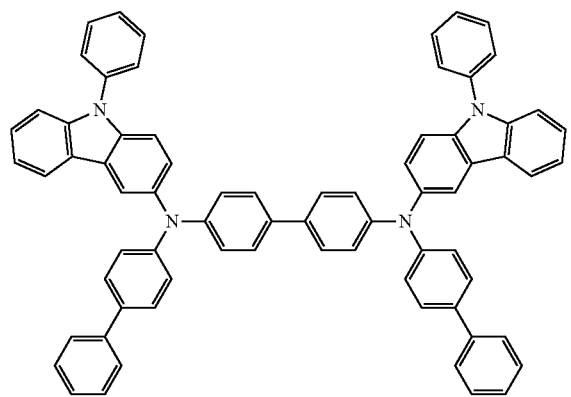
HT36
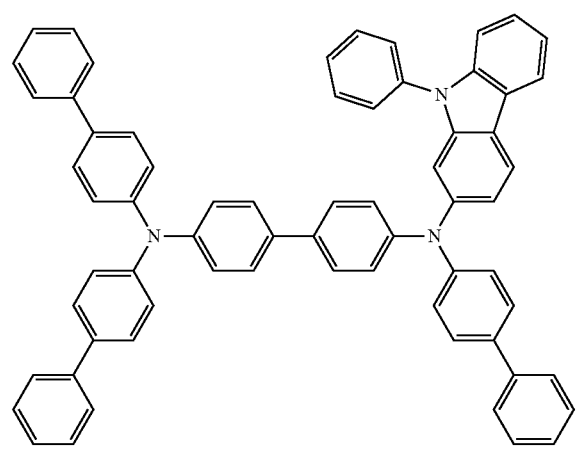
HT34
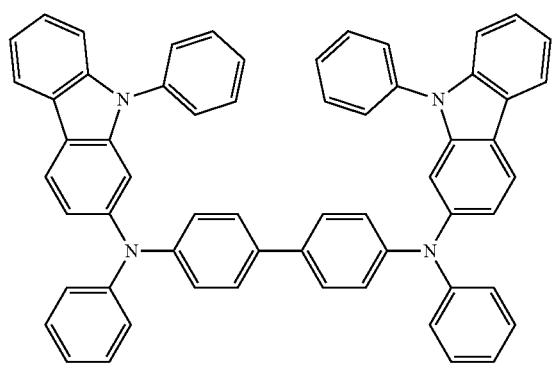
HT37
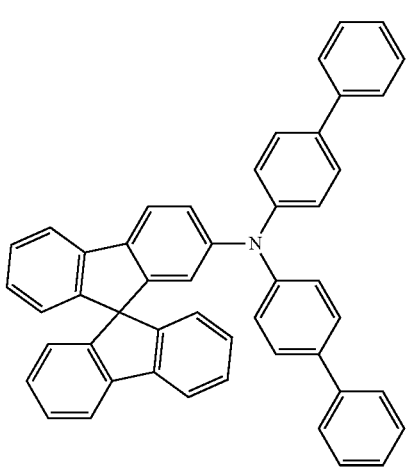
HT35
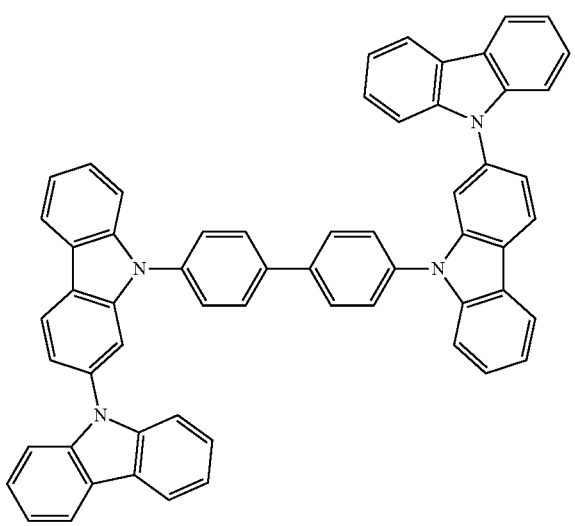
HT38
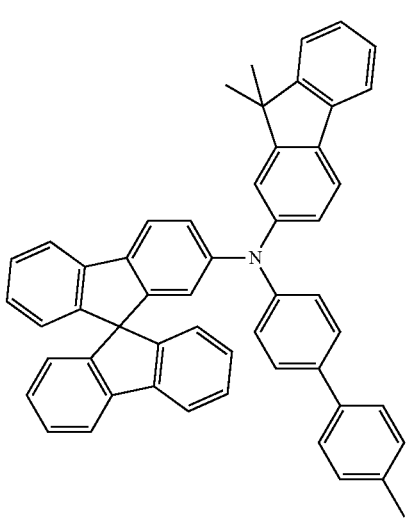

HT39
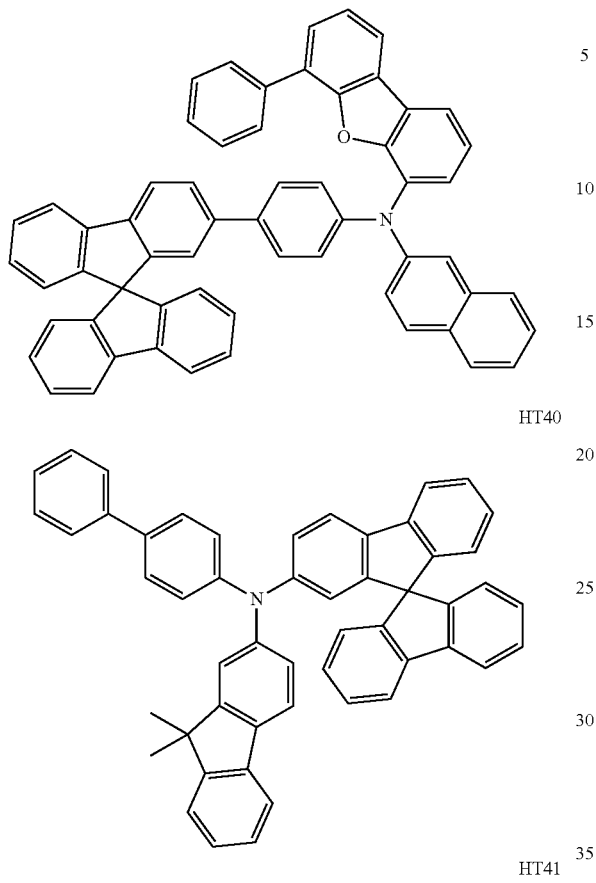
HT40
HT41
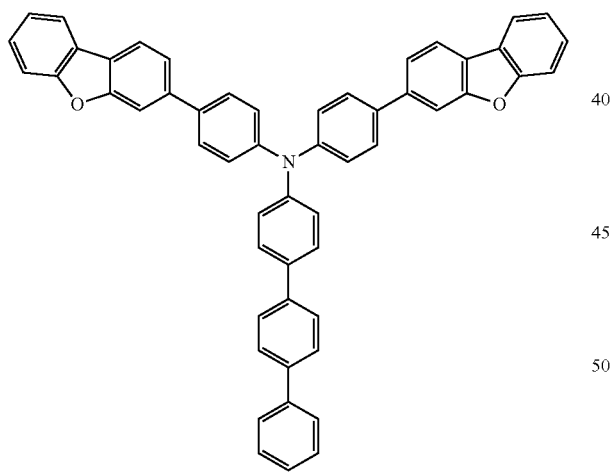
HT42
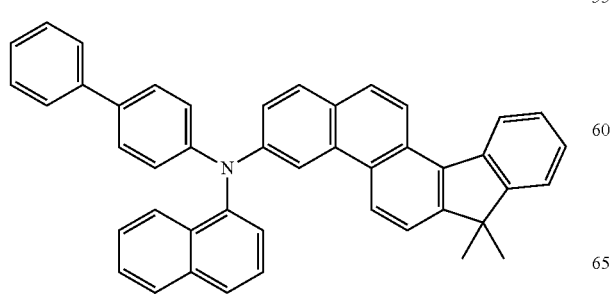
HT43
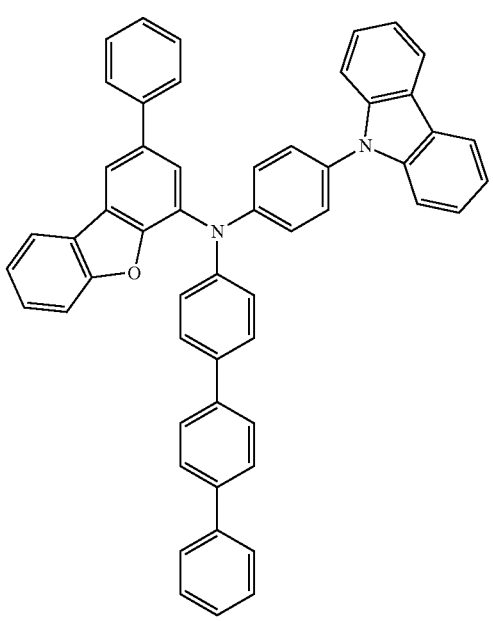
HT44
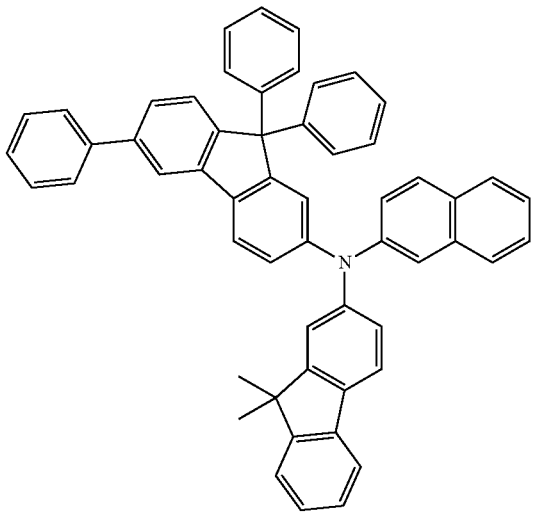

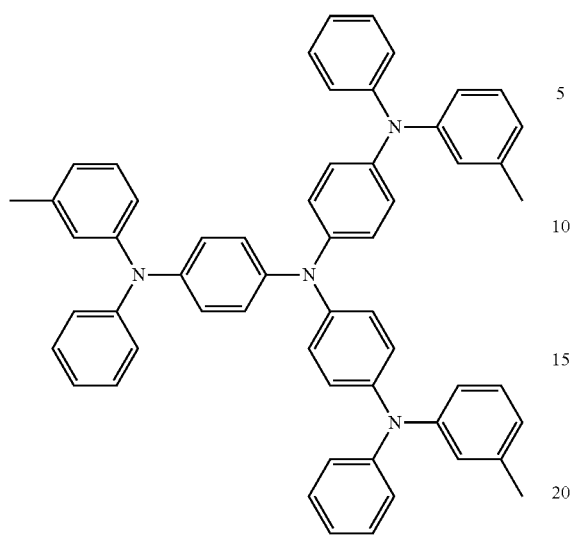
m-MTDATA
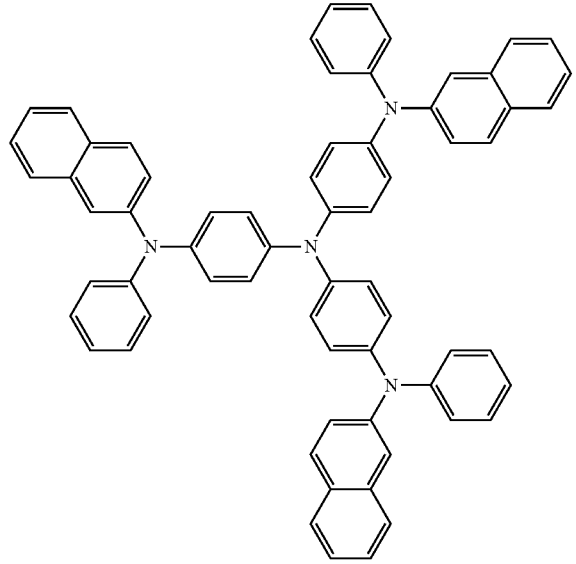
2-TNATA
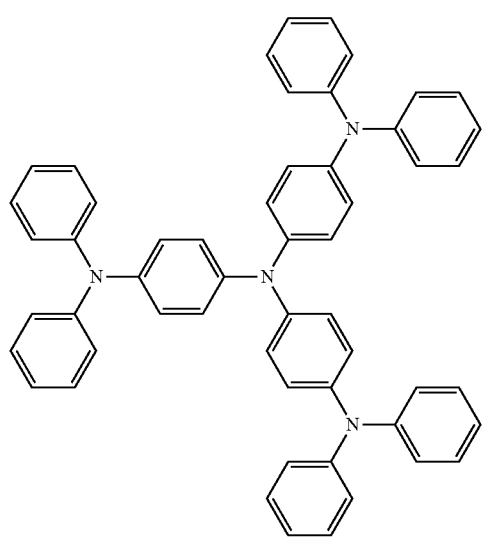
TDATA

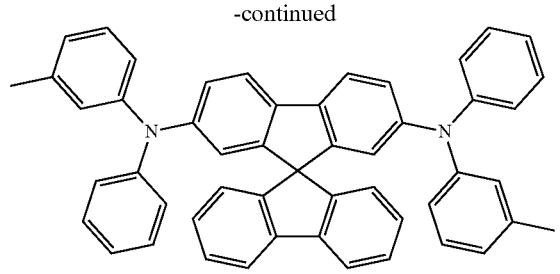

Spiro-TPD

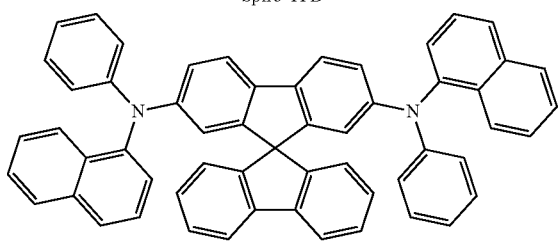

Spiro-NPB

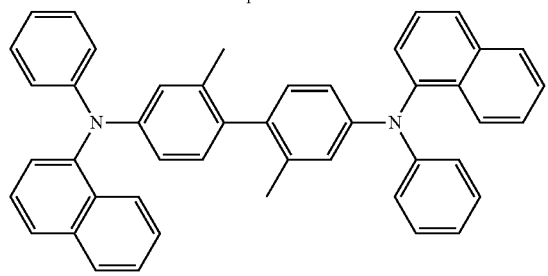

methylated-NPB

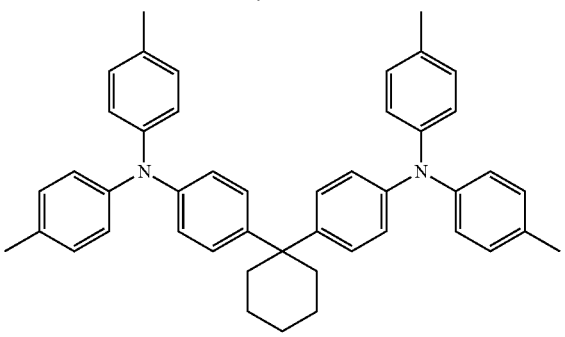

TAPC

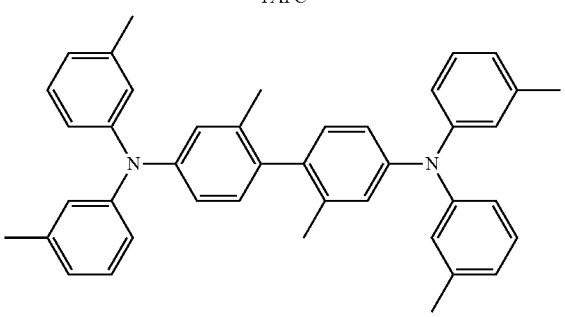

HMTPD

The thickness of the hole transport region 151 may be in a range of about 100 Å to about 10,000 Å, for example, about 100 Å to about 1,000 Å. When the hole transport region 151 includes at least one selected from a hole injection layer 151A and a hole transport layer 151B, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region 151, the hole injection layer 151A, and the hole transport layer 151B are within the ranges above, satisfactory hole transporting characteristics may be obtained without a substantial increase in driving voltage.

The emission auxiliary layer may increase light-emission efficiency by compensating for an optical resonance distance according to the wavelength of light emitted by the emission layer 153, and the electron blocking layer may block the flow of electrons from the electron transport region. The emission auxiliary layer and the electron blocking layer may include the materials as described above.

p-dopant

The hole transport region 151 may further include, in addition to these materials, a charge-generating material for the improvement of conductive properties. The charge-generation material may be homogeneously or non-homogeneously dispersed in the hole transport region 151.

The charge-generation material may be, for example, a p-dopant.

In some exemplary embodiments, the p-dopant may have a lowest unoccupied molecular orbital (LUMO) energy level of equal to or less than −3.5 eV.

The p-dopant may include a quinone derivative, a metal oxide, a cyano group-containing compound, or any combination thereof, but the exemplary embodiments are not limited thereto.

For example, the p-dopant may include:
a metal halogen compound, such as CuI;
a quinone derivative, such as TCNQ and F4-TCNQ;
a metal oxide, such as tungsten oxide or molybdenum oxide;
a cyano group-containing compound such as HAT-CN;
a compound represented by Formula 221; or
any combination thereof,
but the exemplary embodiments are not limited thereto:

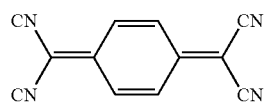

TCNQ

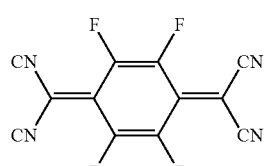

F4-TCNQ

HAT-CN

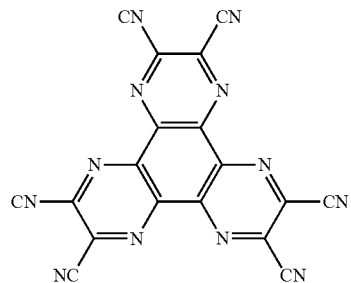

-continued

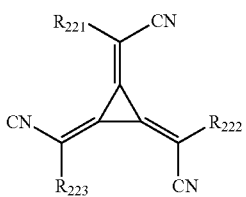

Formula 221

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and at least one of $R_{221}$ to $R_{223}$ may each independently be a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each unsubstituted or substituted with: a cyano group; —F; —Cl; —Br; —I; a $C_1$-$C_{20}$ alkyl group substituted with at least one cyano group; a $C_1$-$C_{20}$ alkyl group substituted with at least one —F; a $C_1$-$C_{20}$ alkyl group substituted with at least one —Cl; a $C_1$-$C_{20}$ alkyl group substituted with at least one —Br; a $C_1$-$C_{20}$ alkyl group substituted with at least one —I; or any combination thereof Emission Layer 153 in Interlayer 150

In some exemplary embodiments, when the light-emitting device 10 is a full-color light-emitting device, the emission layer 153 may be patterned into a red emission layer, a green emission layer, and/or a blue emission layer, according to a sub-pixel. In one or more exemplary embodiments, the emission layer 153 may have a stacked structure of two or more layers of a red emission layer, a green emission layer, and a blue emission layer, in which the two or more layers contact each other or are separated from each other. In one or more exemplary embodiments, the emission layer 153 may include two or more materials of a red light-emitting material, a green light-emitting material, and a blue light-emitting material, in which the two or more materials are mixed with each other in a single layer to emit white light.

The emission layer 153 may include a host and a dopant. The dopant may include a phosphorescent dopant, a fluorescent dopant, or any combination thereof.

An amount of the dopant in the emission layer 153 may be in a range of about 0.01 parts by weight to about 15 parts by weight based on 100 parts by weight of the host. However, the exemplary embodiments are not limited thereto.

In one or more exemplary embodiments, the emission layer 153 may include quantum dots.

The thickness of the emission layer 153 may be in a range of about 100 Å to about 1,000 Å, for example, about 200 Å to about 600 Å. When the thickness of the emission layer 153 is within the ranges above, excellent light-emission characteristics may be obtained without a substantial increase in driving voltage.

Host in Emission Layer

In some exemplary embodiments, the host may include a compound represented by Formula 301:

$$[Ar_{301}]_{xb11}—[(L_{301})_{xb1}—R_{301}]_{xb21}$$ Formula 301 wherein, in Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $LR_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xb1 may be 0, 1, 2, 3, 4, or 5, $R_{301}$ may be hydrogen, deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$), ($Q_{302}$), —C(=O)($Q_{301}$), —S(=O)($Q_{301}$), or —P(=O)($Q_{301}$)($Q_{302}$), xb21 may be 1, 2, 3, 4, or 5, and $Q_{301}$ to $Q_{303}$ may each be the same as described in connection with $Q_1$.

In some exemplary embodiments, when xb11 in Formula 301 is 2 or more, two or more $Ar_{301}$(s) may be linked to each other via a single bond.

In one or more exemplary embodiments, the host may include a compound represented by Formula 301-1, a compound represented by Formula 301-2, or any combination embodiment:

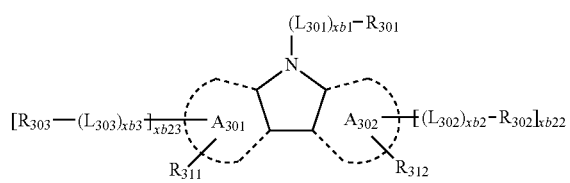

Formula 301-1

-continued

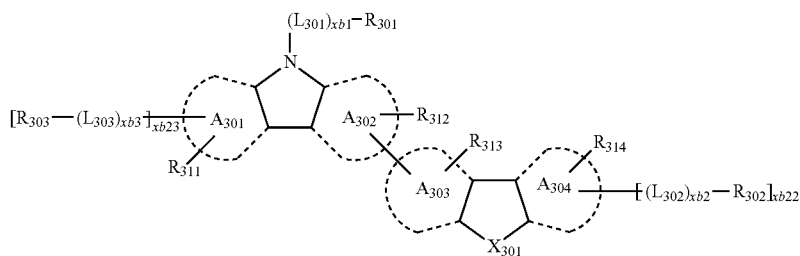

Formula 301-2

In Formulae 301-1 and 301-2, ring $A_{301}$ to ring $A_{304}$ may each independently be a $C_5$-$C_{60}$ carbocyclic group or a $C_1$-$C_{60}$ heterocyclic group, $X_{301}$ may be O, S, N—$[(L_{304})_{xb4}$—$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described above, $L_{302}$ to $L_{304}$ may each independently the same as described in connection with $L_{301}$.

xb2 to xb4 may each independently be the same as described in connection with xb1, and $R_{302}$ to $R_{305}$ and $R_{311}$ to $R_{314}$ may each be the same as described in connection with $R_{301}$.

In one or more exemplary embodiments, the host may include an alkaline earth metal complex. In one or more exemplary embodiments, the host may include a Be complex (for example, Compound H55), a Mg complex, a Zn complex, or any combination thereof.

In one or more exemplary embodiments, the host may include one of Compounds H1 to H120, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof, but the exemplary embodiments are not limited thereto:

H1

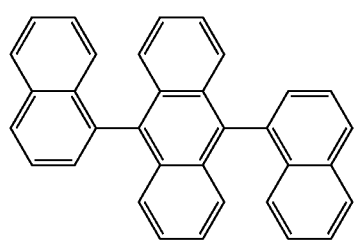

H2

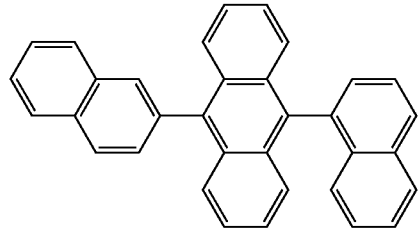

H3

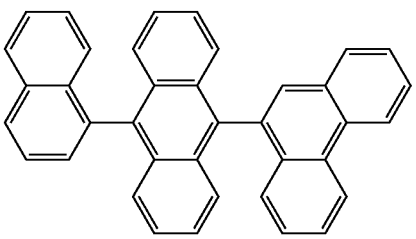

H4

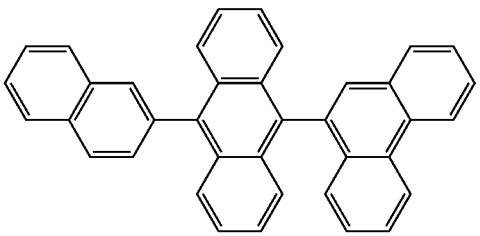

H5

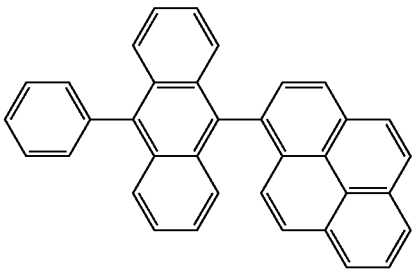

H6

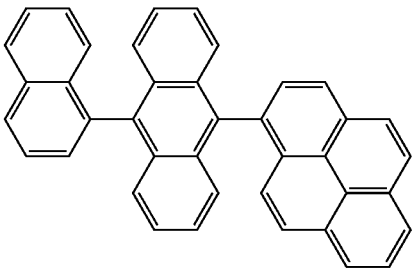

H7

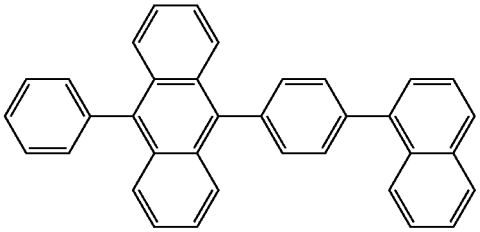

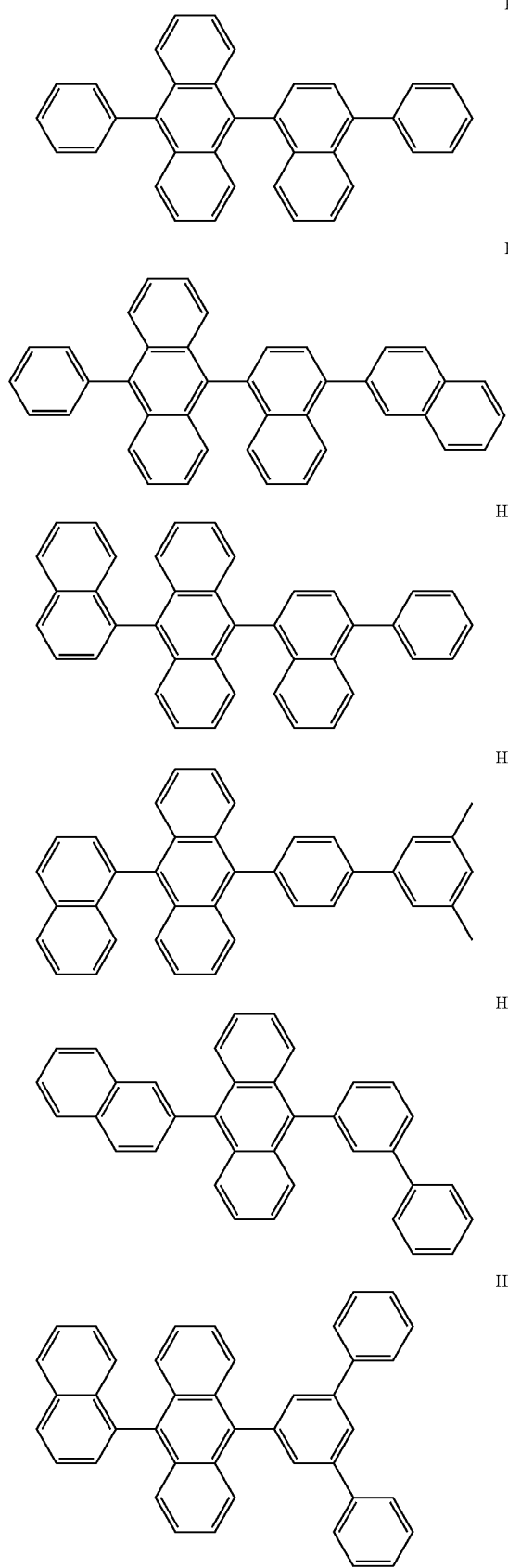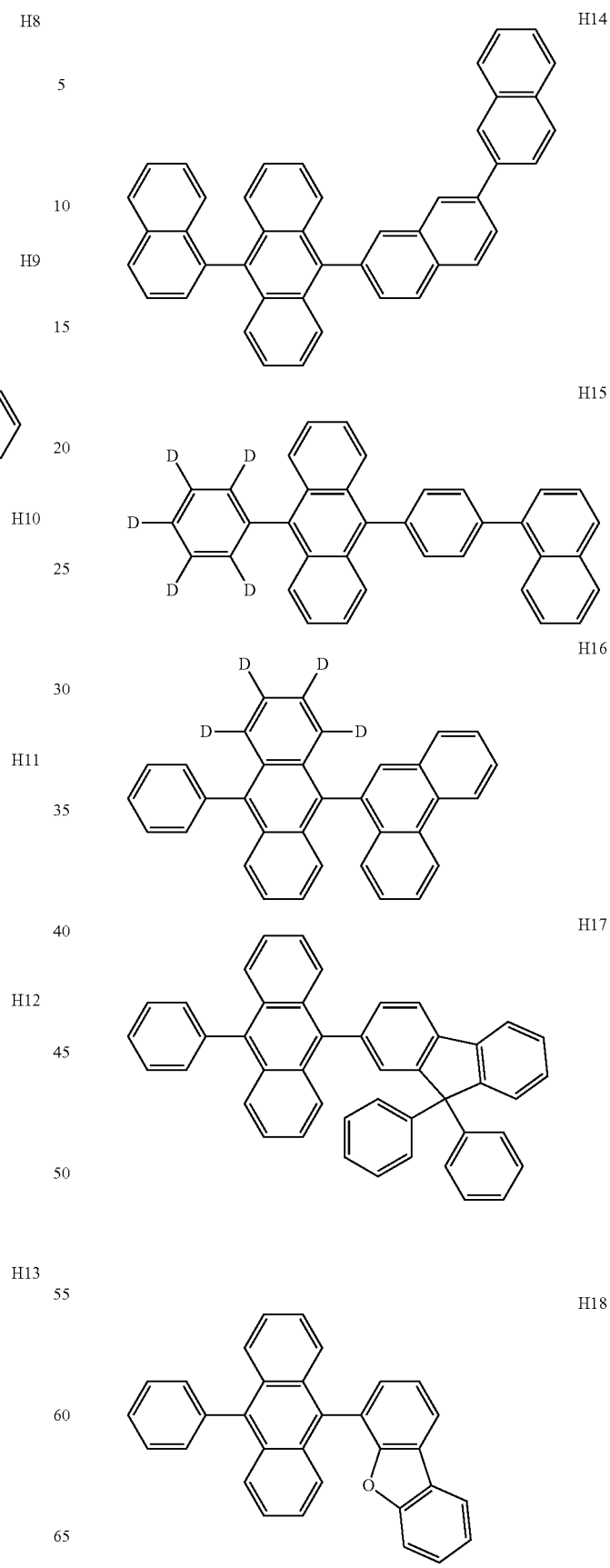

H19
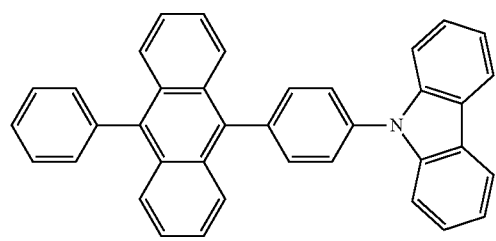
H20
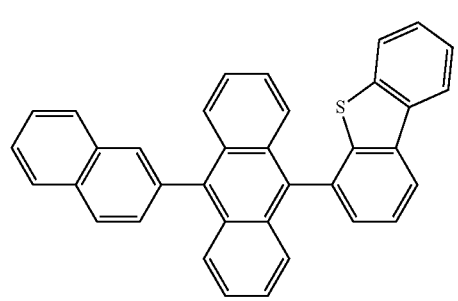
H21
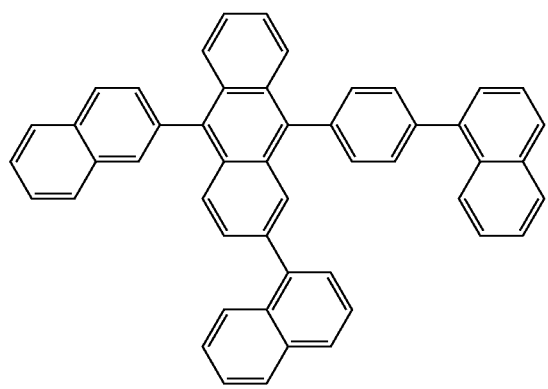
H22
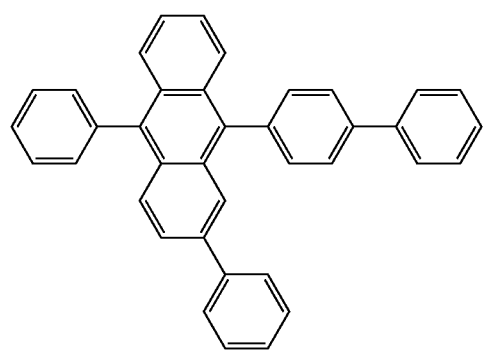
H23
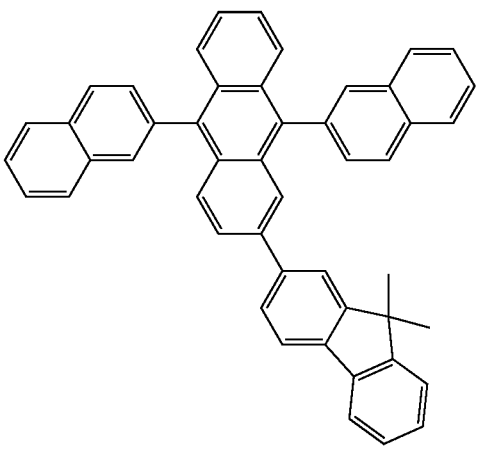
H24
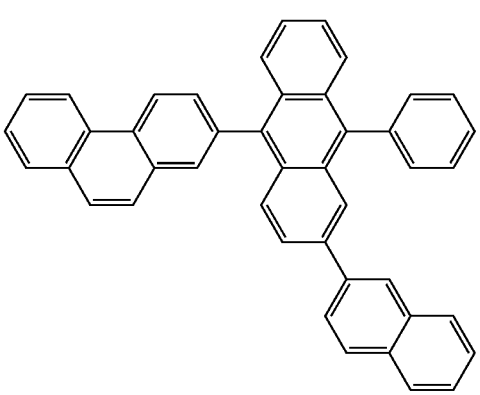
H25
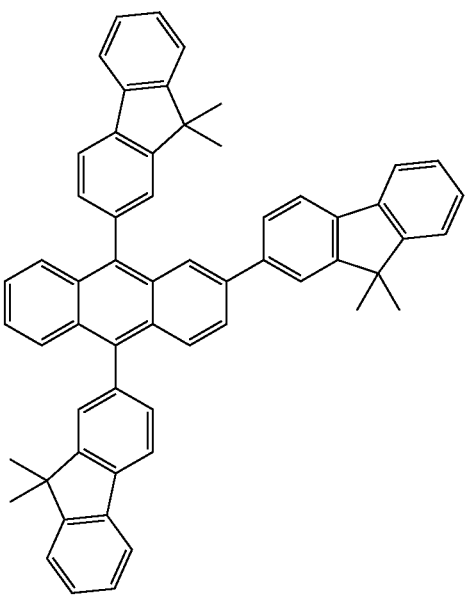

H26
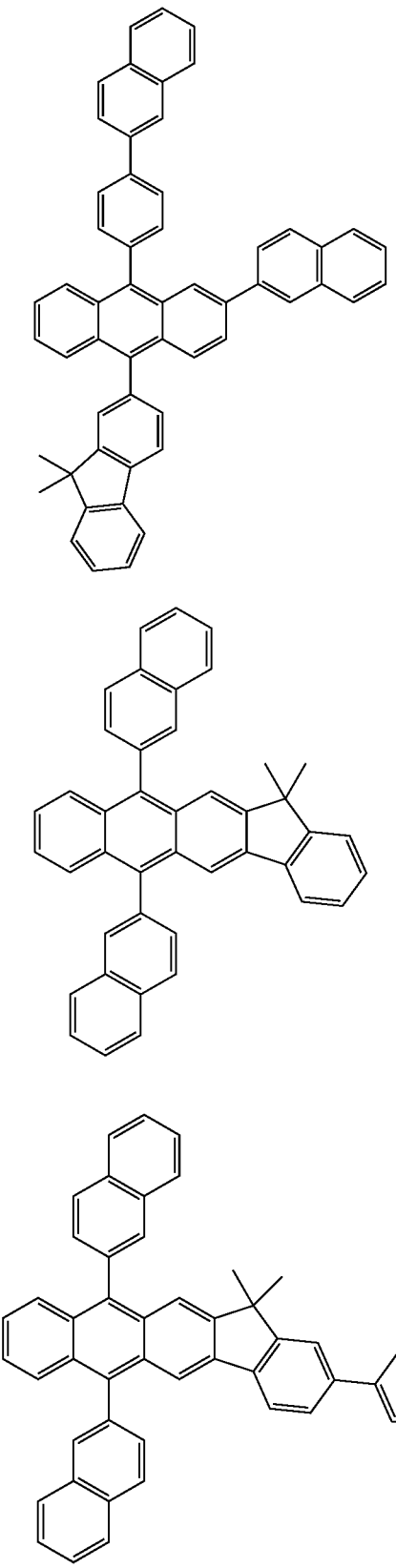
H27
H28
H29
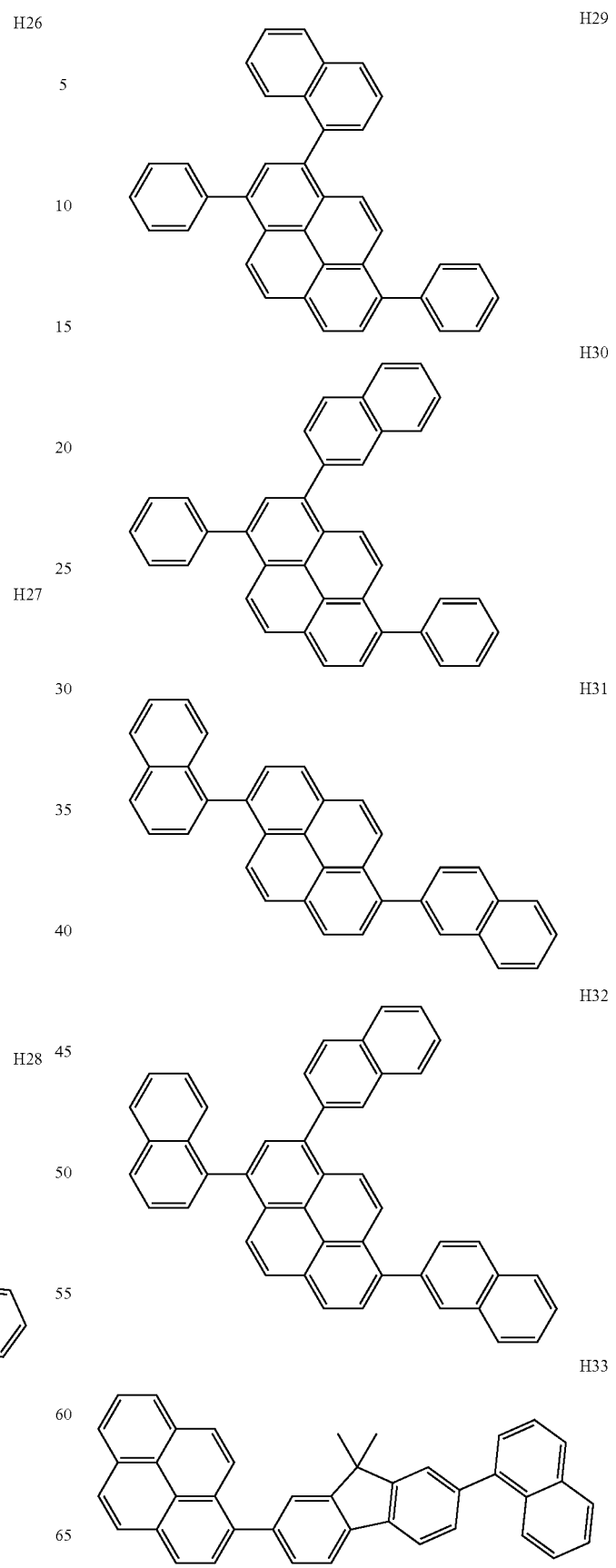
H30
H31
H32
H33

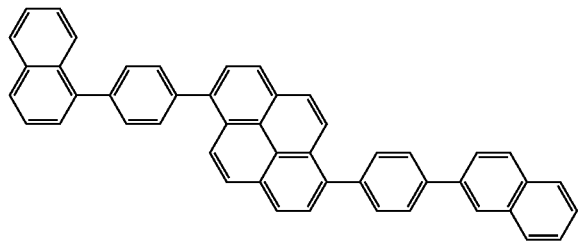
H34
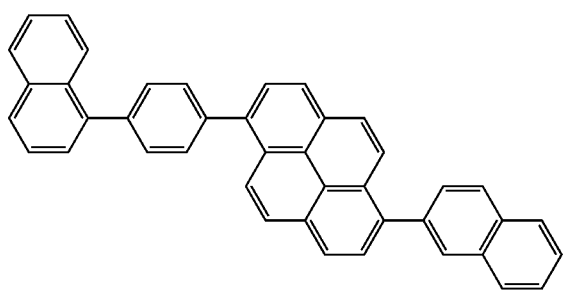
H35
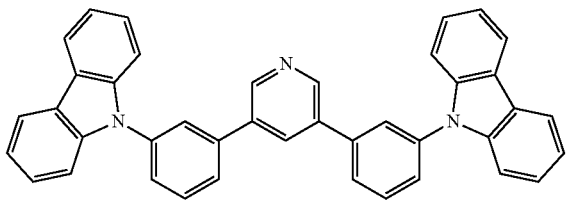
H38
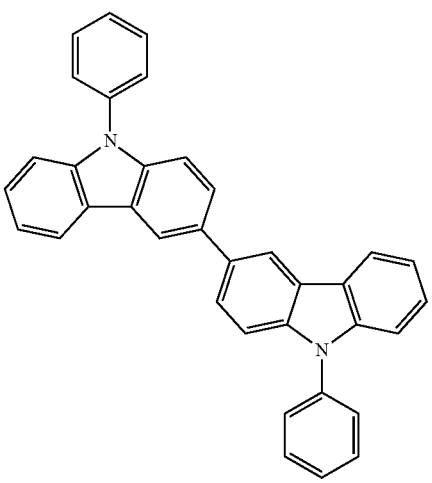
H39
H36
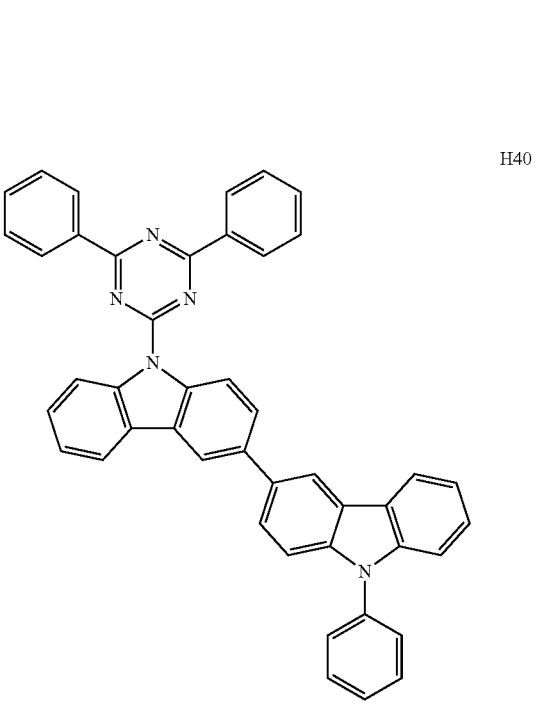
H37
H40

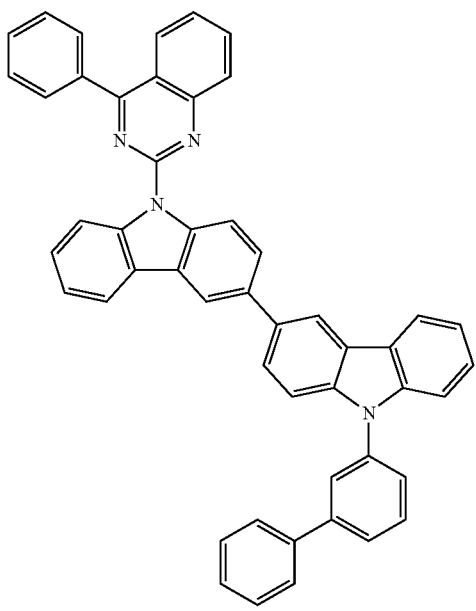
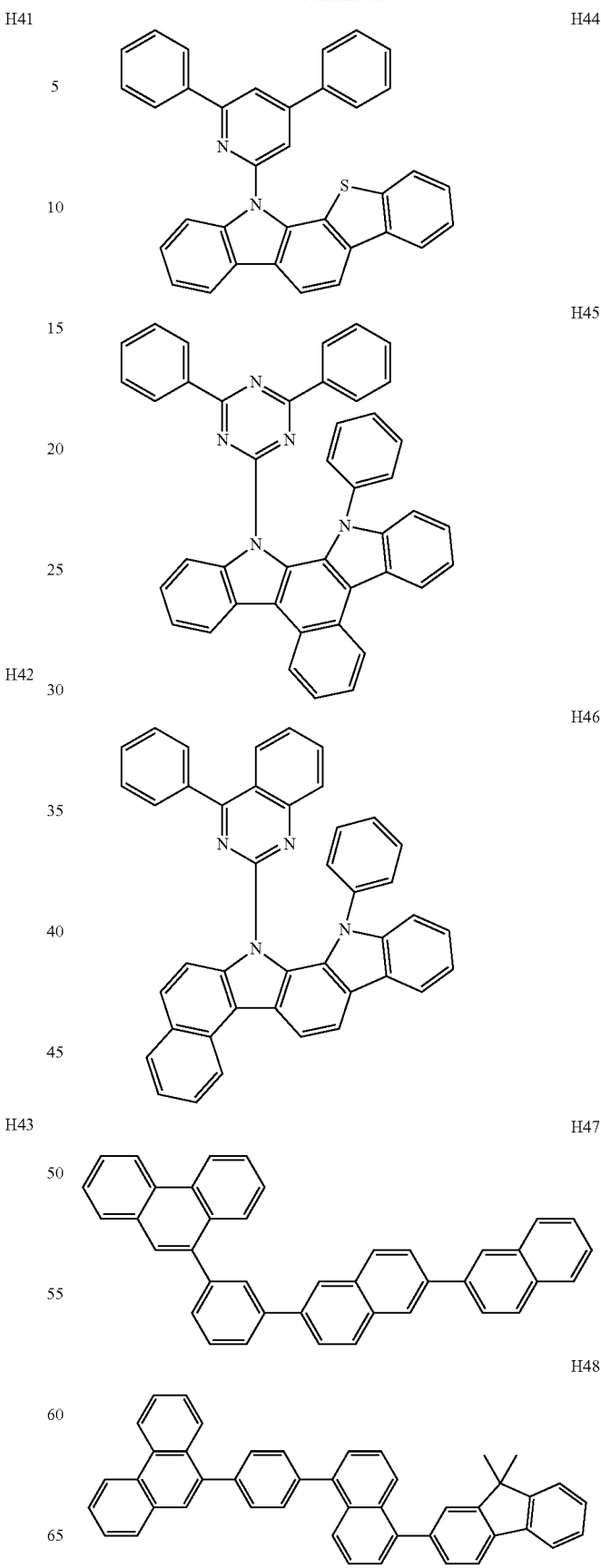

H49
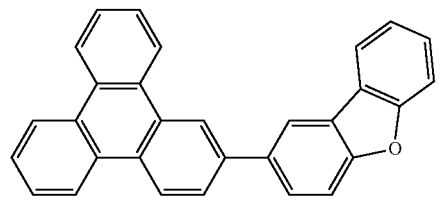
H50
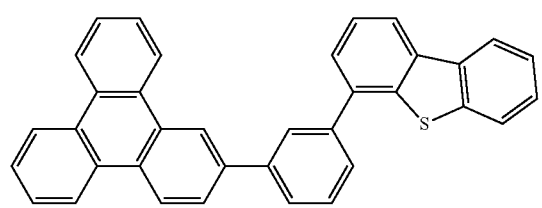
H51
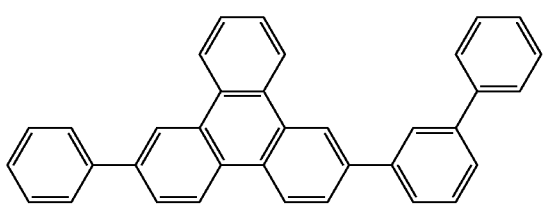
H52
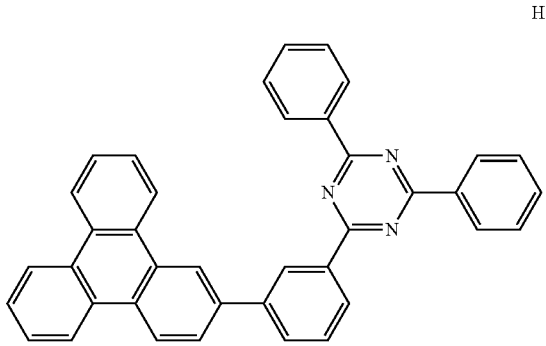
H53
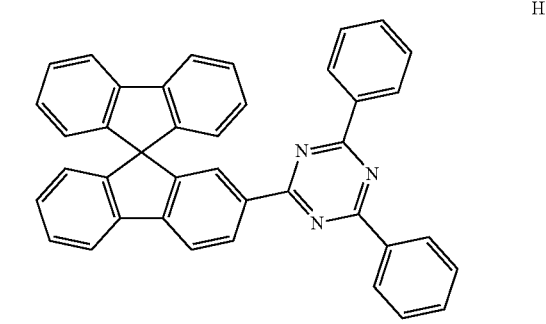
H54
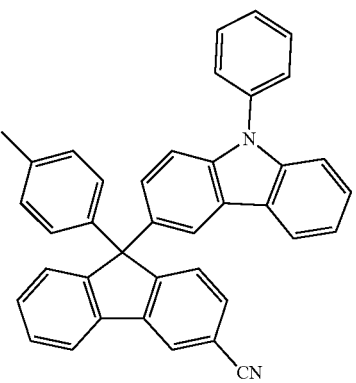
H55
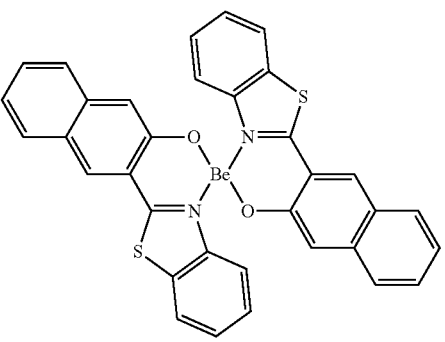
H56
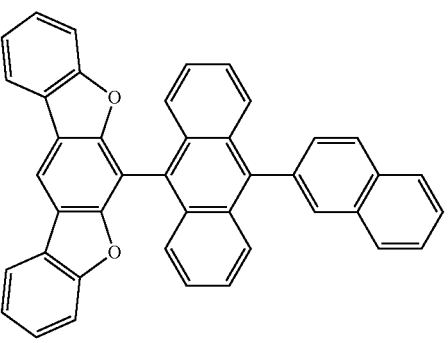
H57
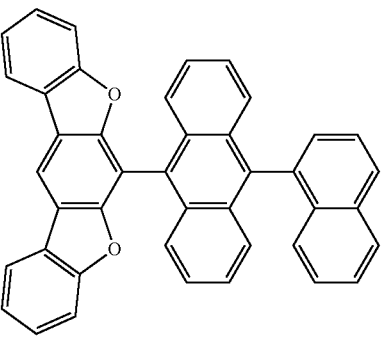

H58
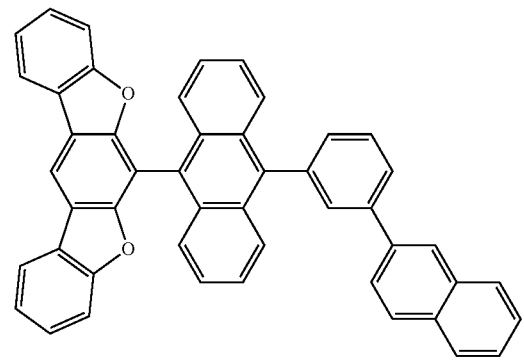
H59
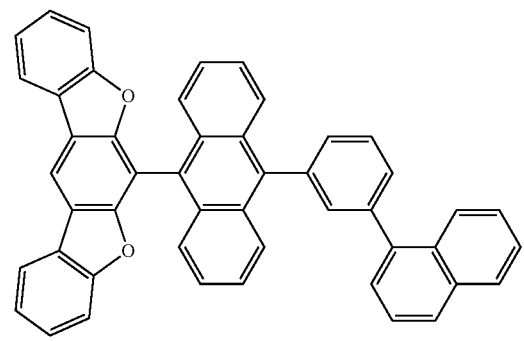
H60
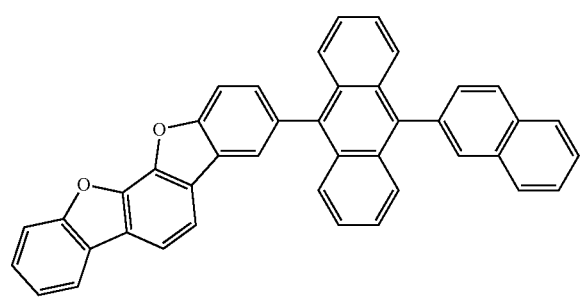
H61
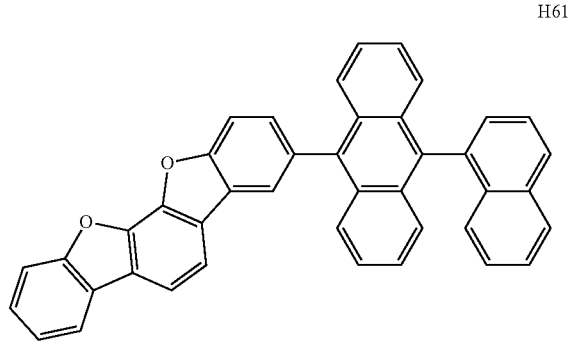
H62
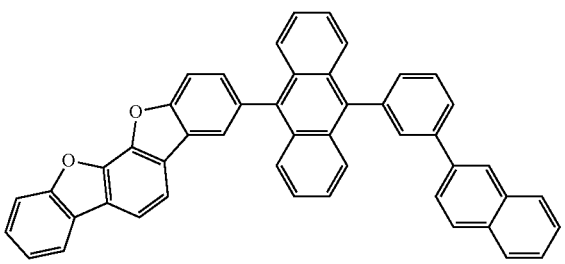
H63
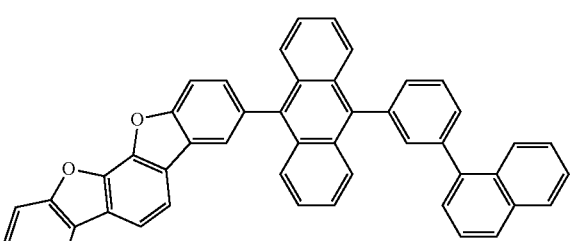
H64
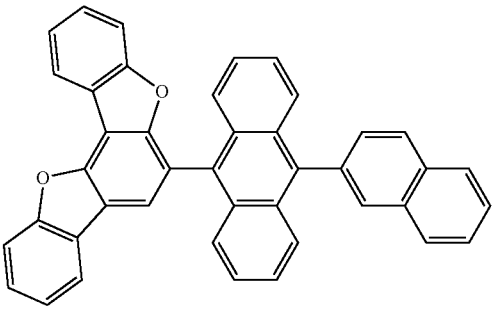
H65
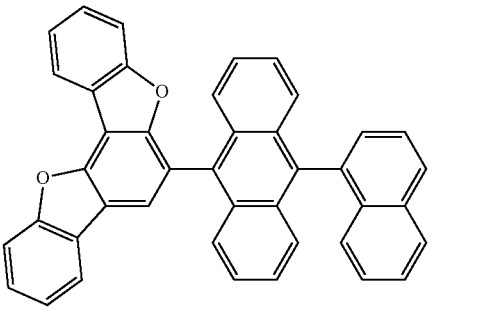
H66
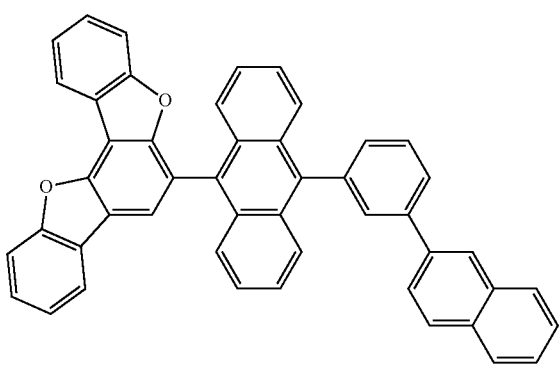

H67
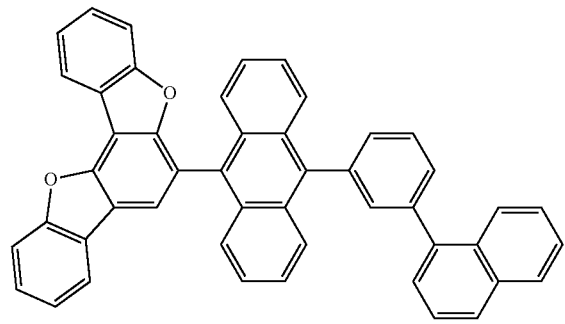
H68
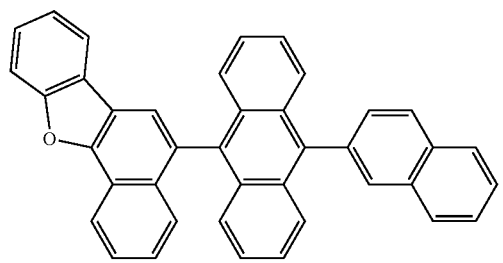
H69
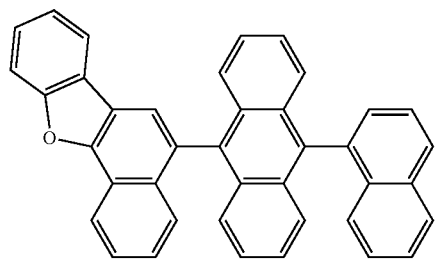
H70
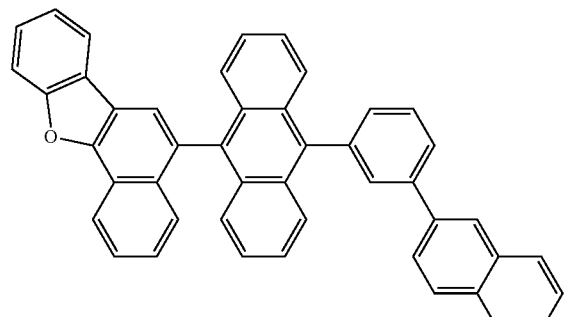
H71
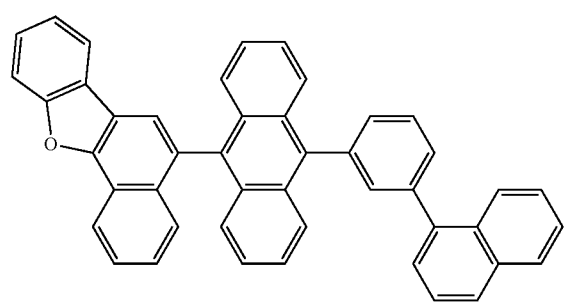
H72
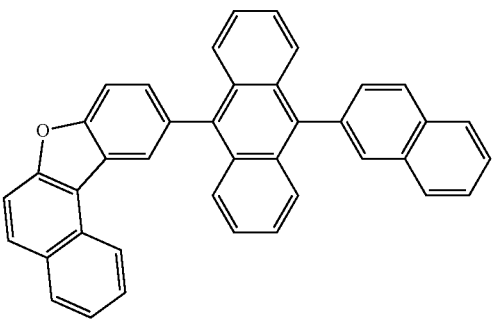
H73
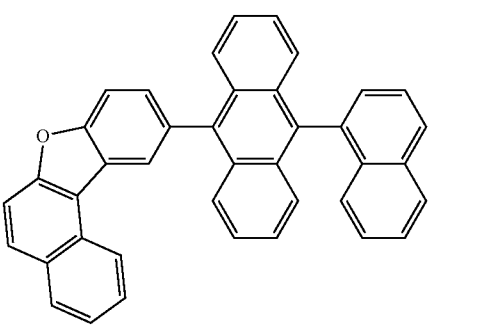
H74
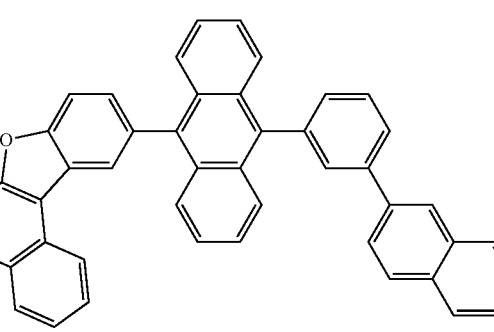
H75
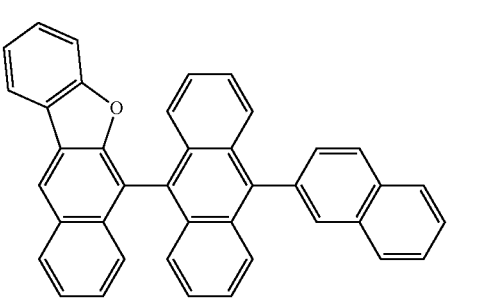
H76

H77
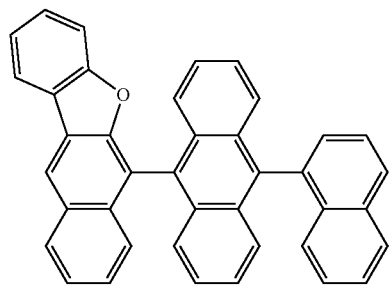
H78
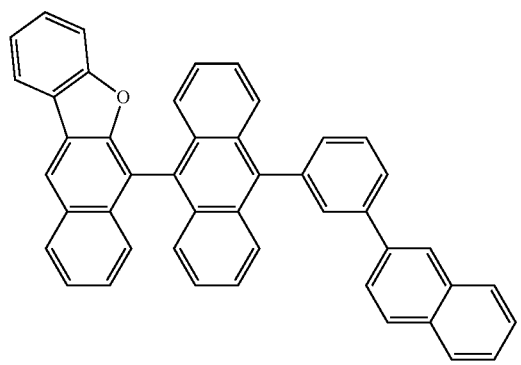
H79
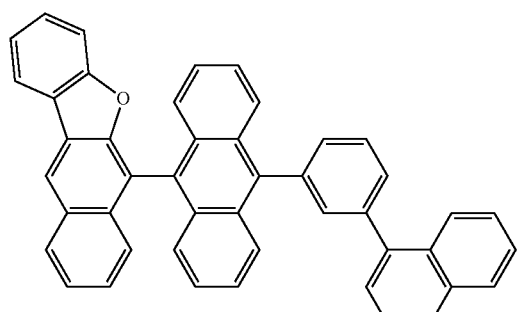
H80
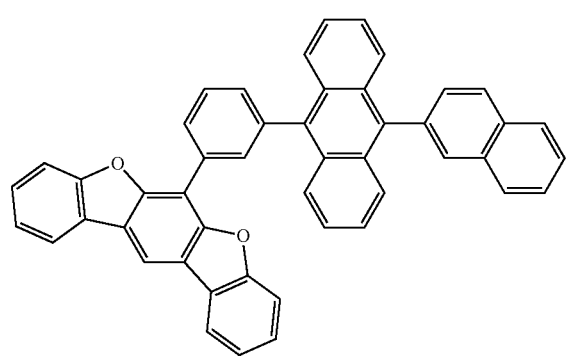
H81
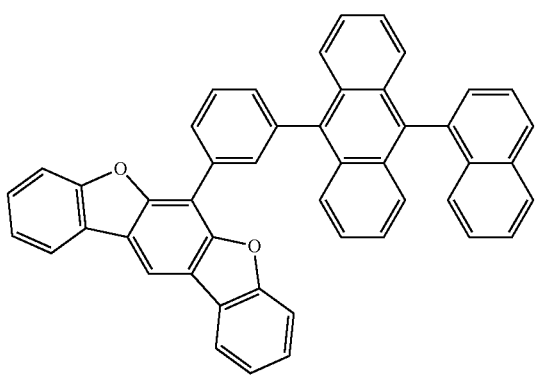
H82
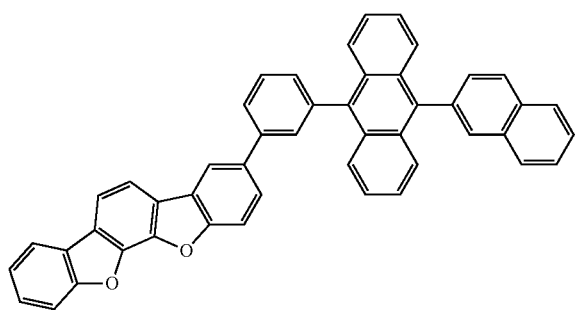
H83
H84

-continued
H85
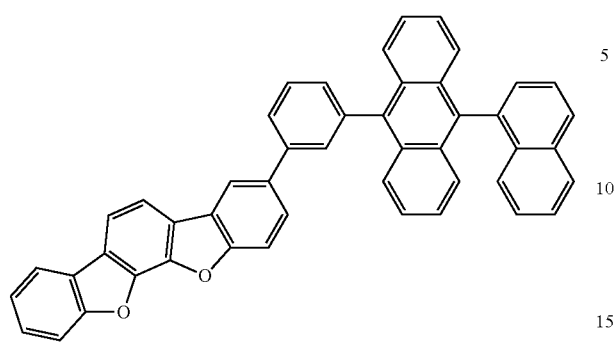
H86
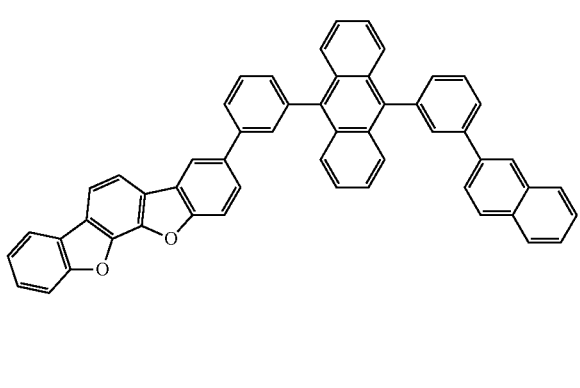
H87
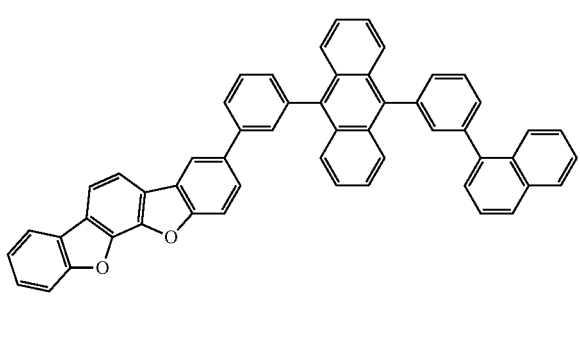
H88
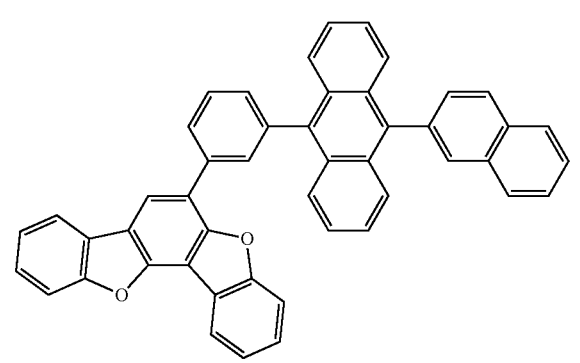
-continued
H89
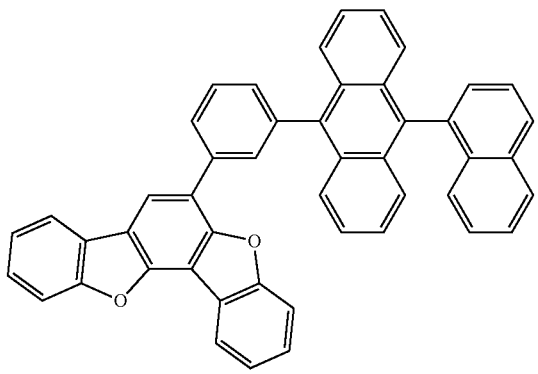
H90
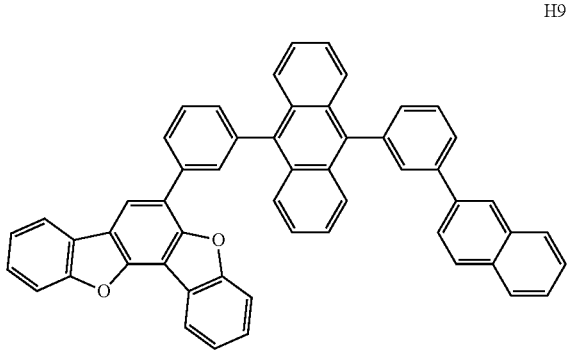
H91
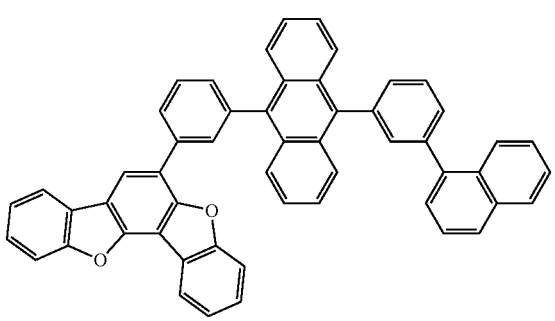
H92
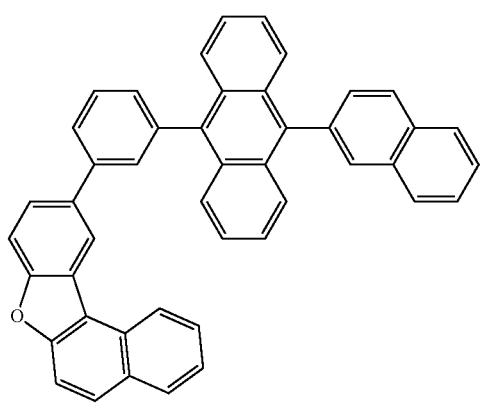

H93
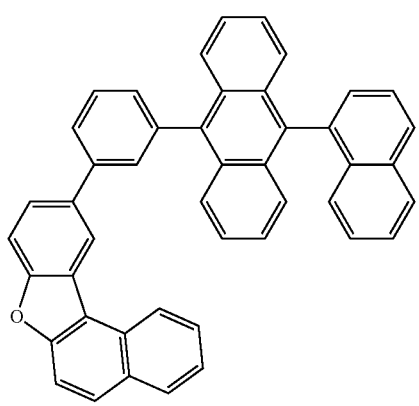
H94
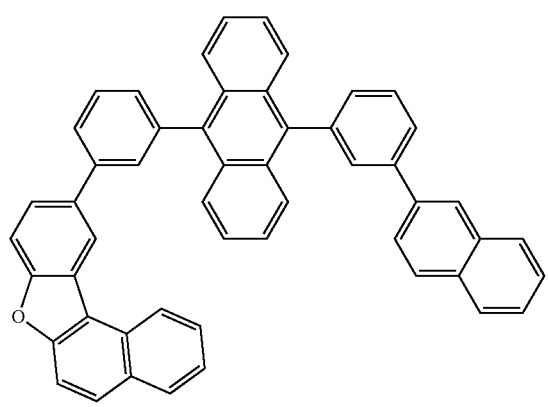
H95
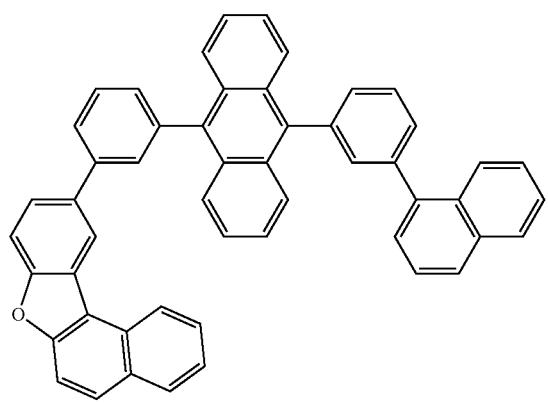
H96
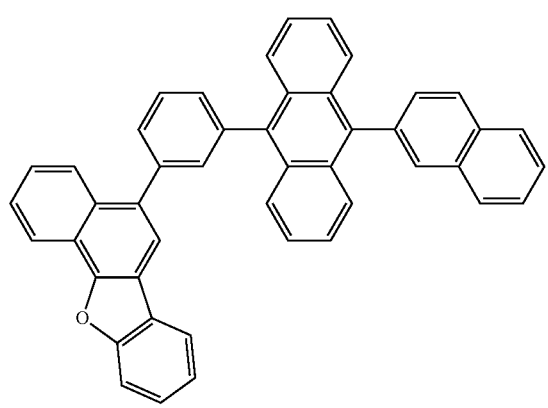
H97
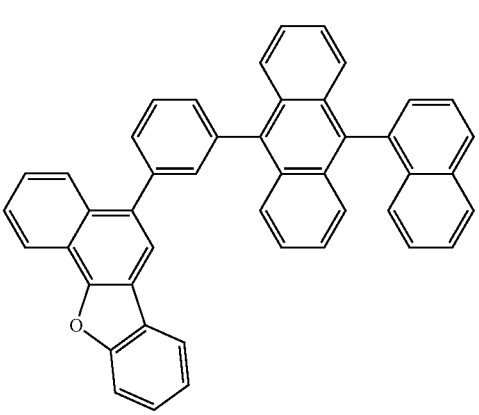
H98
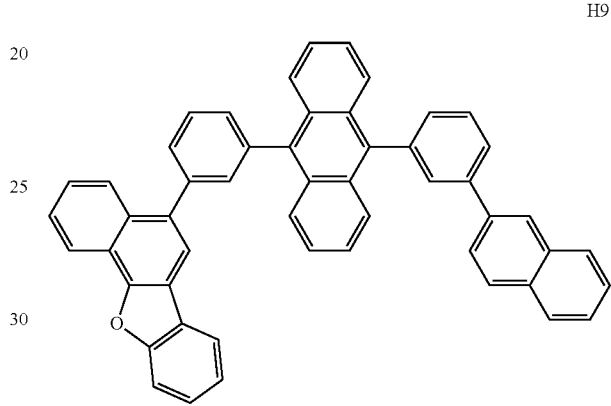
H99
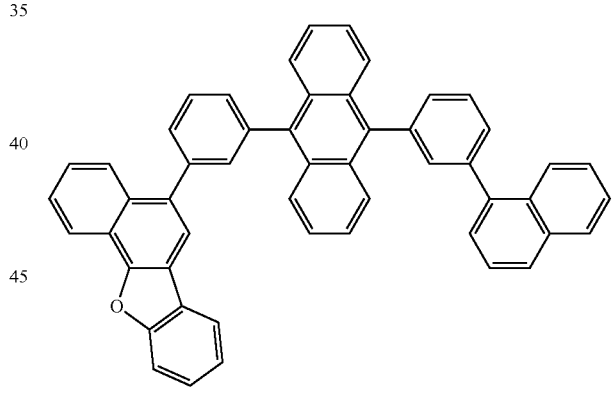
H100
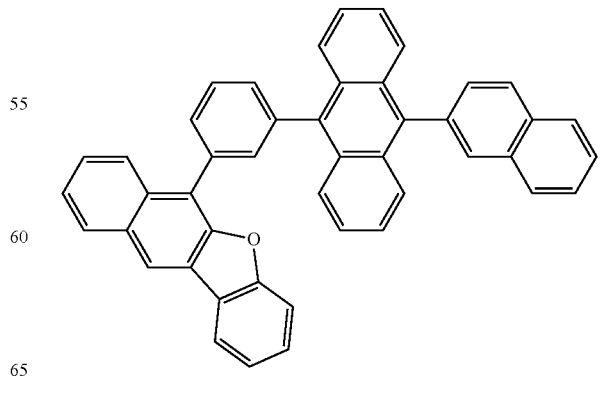

H101
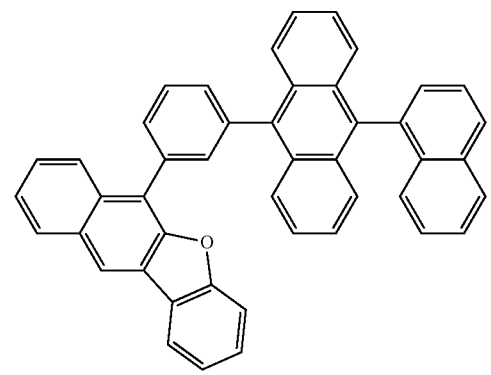
H102
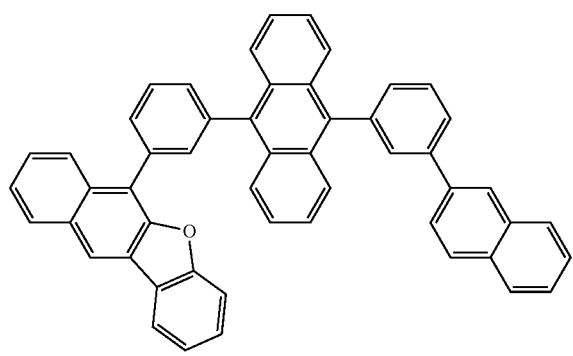
H103
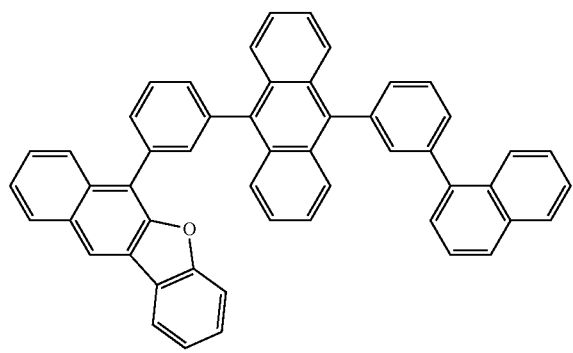
H104
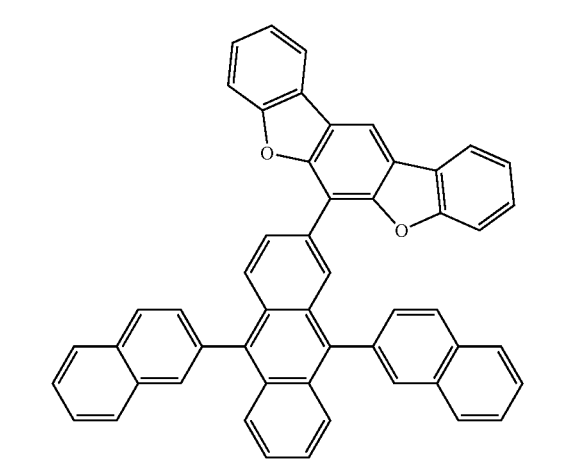
H105
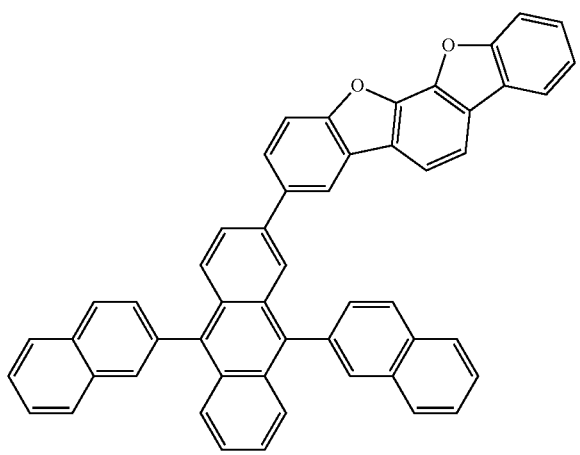
H106
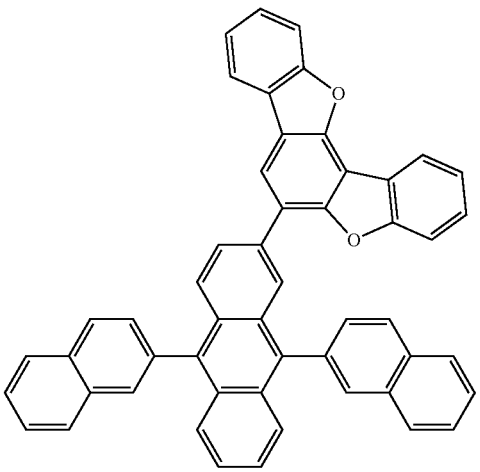
H107
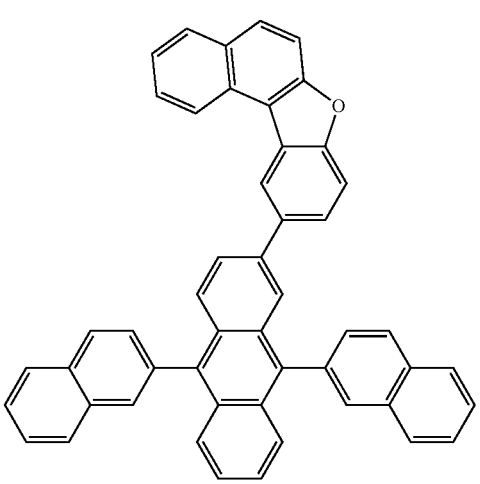

H108
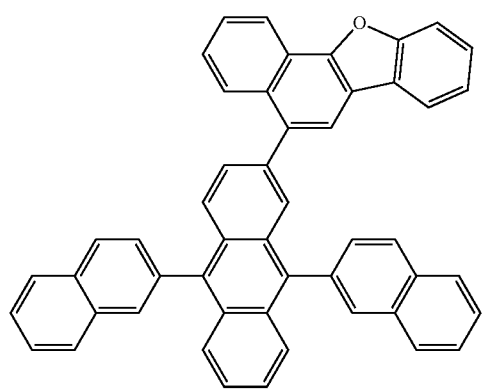
H109
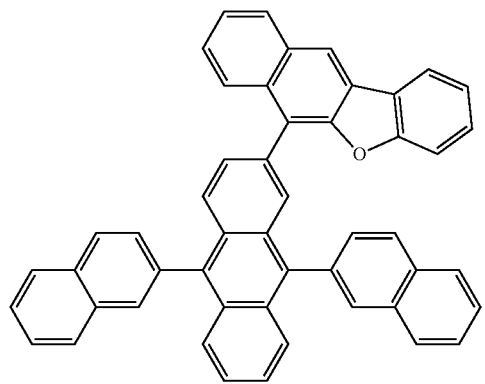
H110
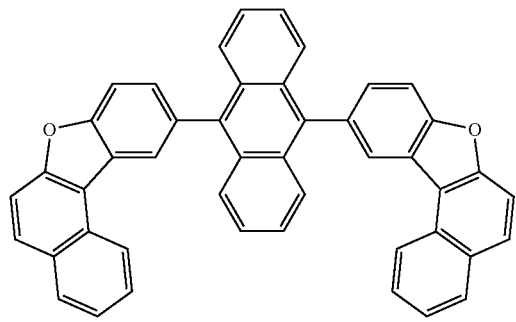
H111
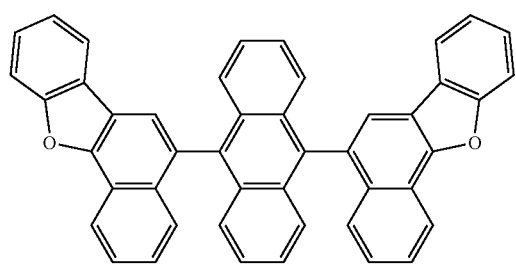
H112
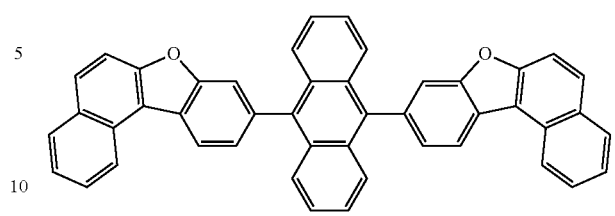
H113
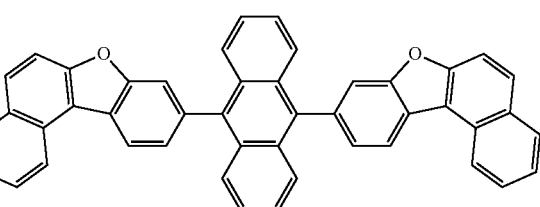
H114
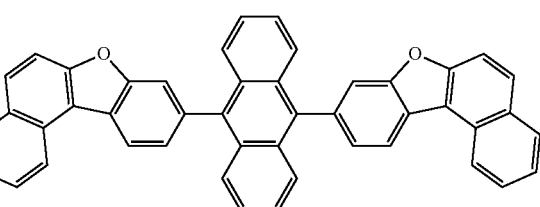
H115
H116

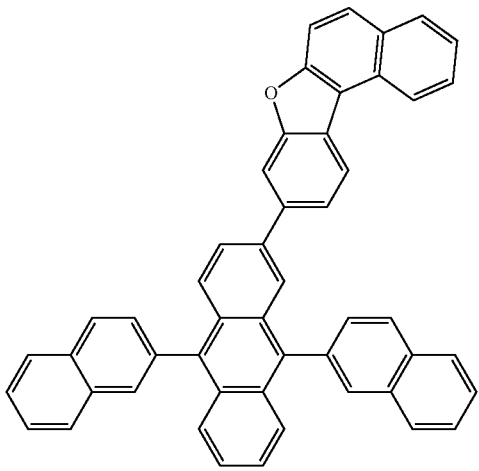

H117

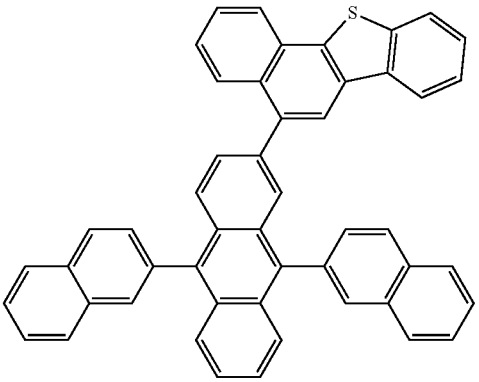

H120

H118

H119

Phosphorescent Dopant Included in Emission Layer in Interlayer 150

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In some exemplary embodiments, the phosphorescent dopant may include an organometallic compound represented by Formula 401:

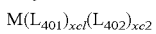

Formula 401

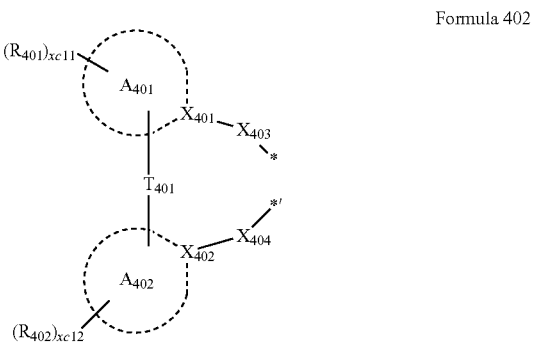

Formula 402

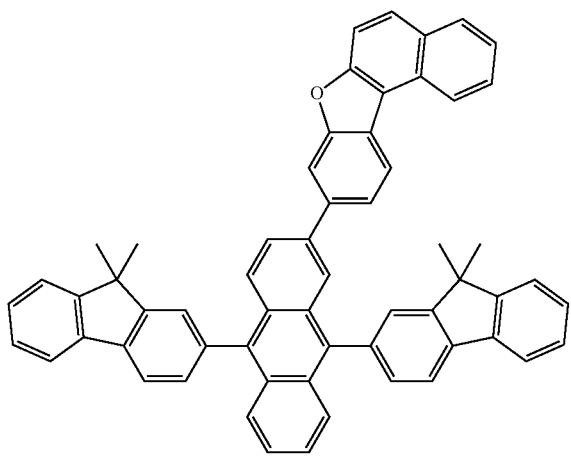

wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more $L_{401}(s)$ may be identical to or different from each other, $L_{402}$ may be an organic ligand, and xc2 may be 0, 1, 2, 3, or 4, wherein, when xc2 is 2 or more, two or more $L_{402}(s)$ may be identical to or different from each other, $X_{401}$ and $X_{402}$ may each independently be nitrogen or carbon, ring $A_{401}$ and ring $A_{402}$ may each independently be a $C_5$-$C_{60}$ carbocyclic group or a $C_1$-$C_{60}$ heterocyclic group, $T_{401}$ may be a single bond, *—O—*', *—S—*', *—C(=O)—*', *—N(Q_{411})—*', *—C(Q_{411})(Q_{412})—*', *—C(Q_{411})=C(Q_{412})—*', *—C(Q_{411})=*', or *=C=*', $X_{403}$ and $X_{404}$ may each independently be a chemical bond (for example, a covalent bond or a coordinate bond), O, S, $N(Q_{413})$, $B(Q_{413})$, $P(Q_{413})$, $C(Q_{413})(Q_{414})$, or $Si(Q_{413})(Q_{414})$, $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, or —$P(=O)(Q_{401})(Q_{402})$, $Q_{401}$ to $Q_{403}$ may each be the same as described in connection with $Q_1$, xc11 and xc12 may each independently be an integer from 0 to 10, and

* and *' in Formula 402 each indicate a binding site to M in Formula 401.

In some exemplary embodiments, in Formula 402, i) $X_{401}$ may be nitrogen, and $X_{402}$ may be carbon, or ii) each of $X_{401}$ and $X_{42}$ may be nitrogen.

In one or more exemplary embodiments, when xc1 in Formula 402 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ may each be the same as described in connection with $T_{401}$.

$L_{402}$ in Formula 401 may be an organic ligand. For example, $L_{402}$ may be a halogen group, a diketone group (for example, an acetylacetonate group), a carboxylic acid group (for example, picolinate group), —C(=O), an isonitril group, a —CN group, a phosphorus group (for example, a phosphine group or a phosphite group), or any combination thereof, but the exemplary embodiments are not limited thereto.

The phosphorescent dopant may include, for example, one of Compounds PD1 to PD25, or any combination, but the exemplary embodiments are not limited according:

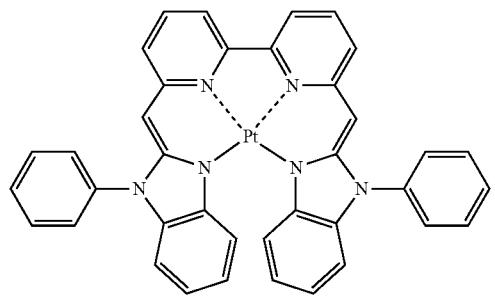
PD1

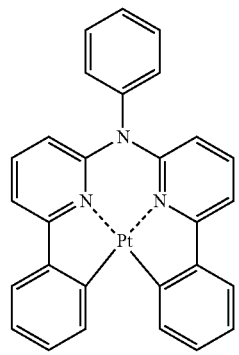
PD2

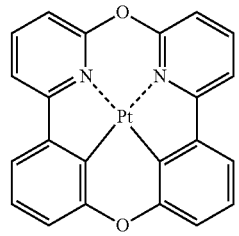
PD3

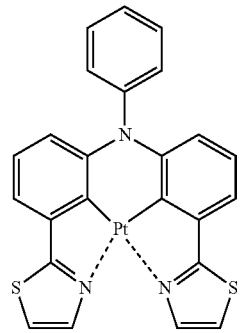
PD4

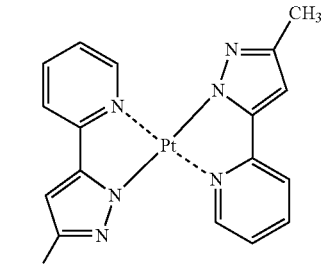
PD5

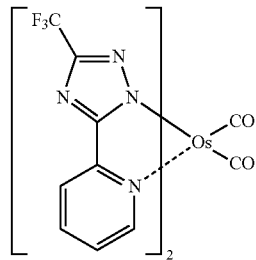
PD6

-continued
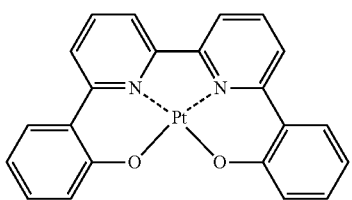
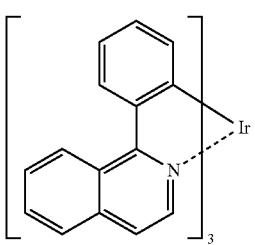
PD8
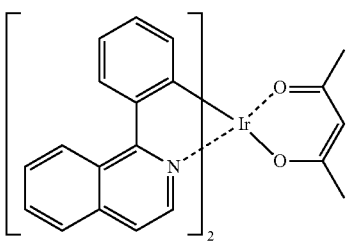
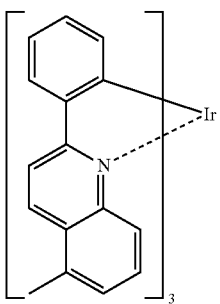
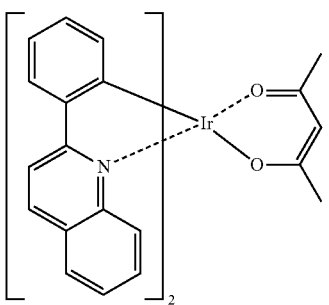
-continued
PD7
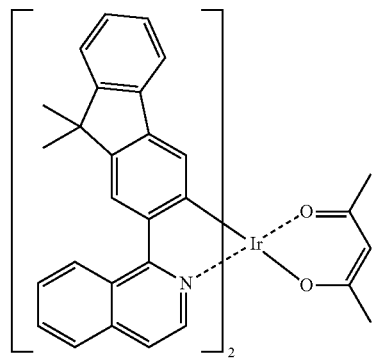
PD12
PD9
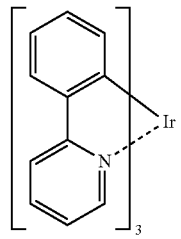
PD13
PD10
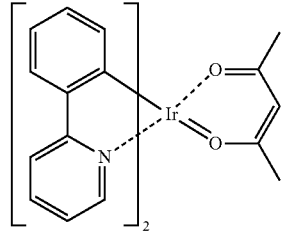
PD14
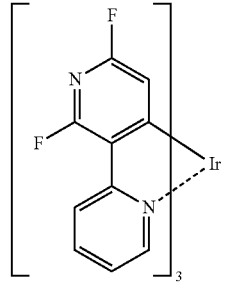
PD15
PD11
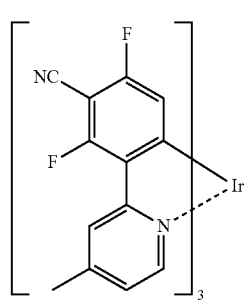
PD16

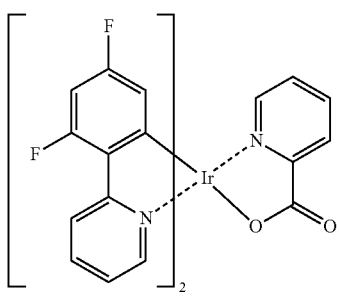
PD17
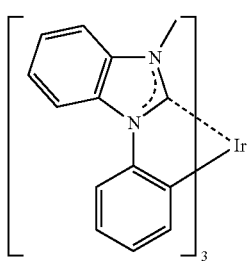
PD18
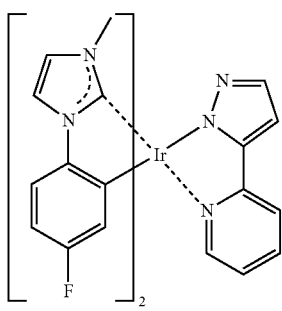
PD19
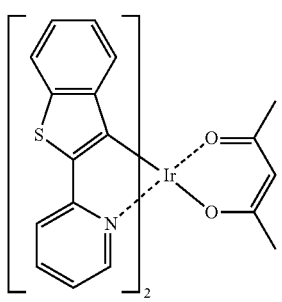
PD20
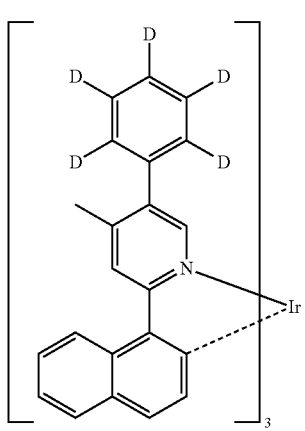
PD21
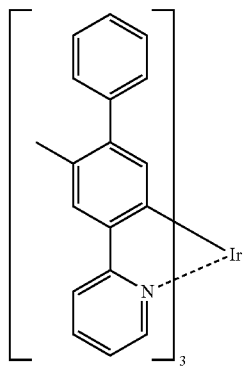
PD22
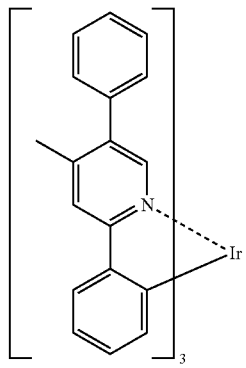
PD23
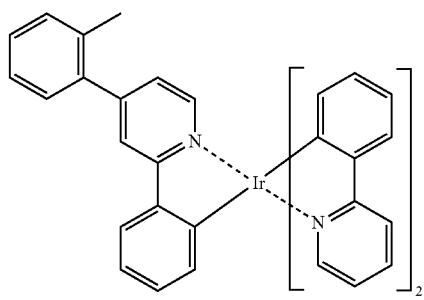
PD24
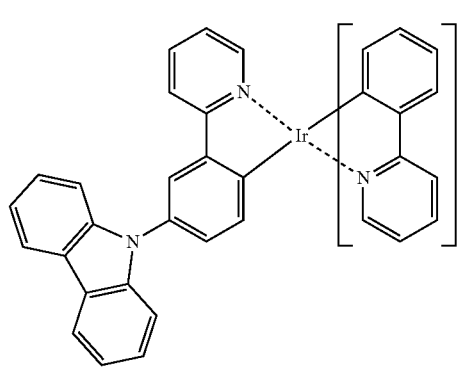
PD25
Fluorescent Dopant in Emission Layer
The fluorescent dopant may include an amine group-containing compound, a styryl group-containing compound, or any combination thereof.
In some exemplary embodiments, the fluorescent dopant may include a compound represented by Formula 501:

Formula 501

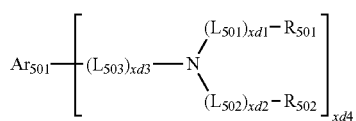

wherein, in Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd3 may each independently be 0, 1, 2, or 3, $R_{501}$ and $R_{502}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and xd4 may be 1, 2, 3, 4, 5, or 6.

For example, $Ar_{501}$ in Formula 501 may be a condensed cyclic ring (for example, an anthracene group, a chrysene group, a pyrene group, etc.) in which three or more monocyclic groups are condensed.

In one or more exemplary embodiments, xd4 in Formula 501 may be 2, but the exemplary embodiments are not limited thereto.

For example, the fluorescent dopant may include: one of Compounds FD1 to FD36; DPVBi; DPAVBi; or any combination thereof:

FD1
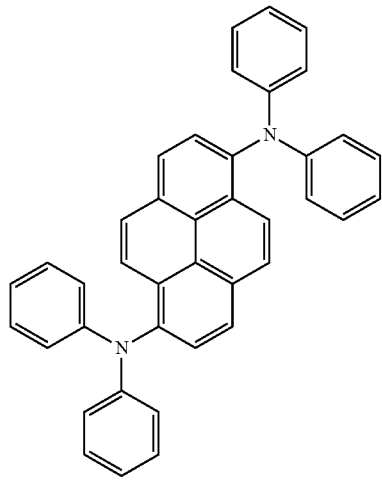

FD2
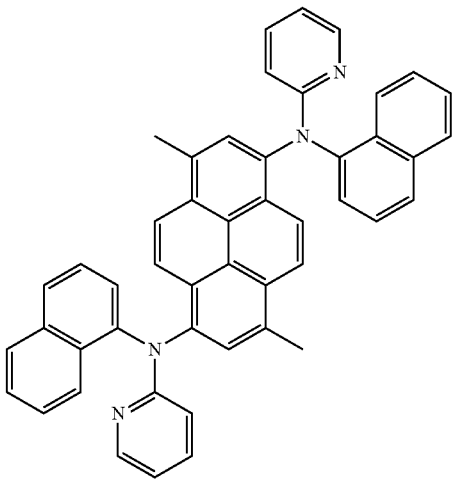

FD3
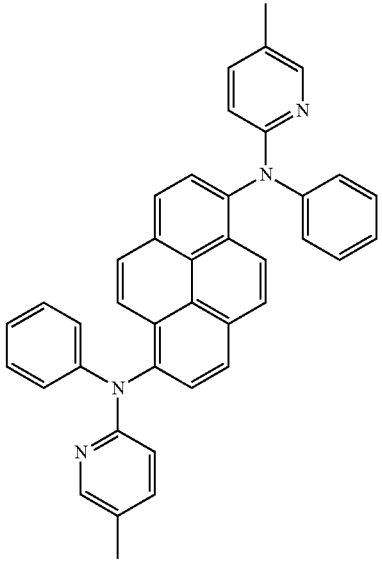

FD4
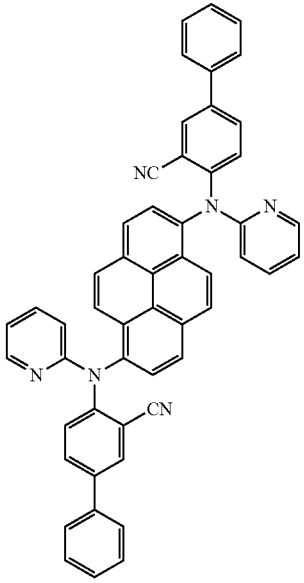

FD5
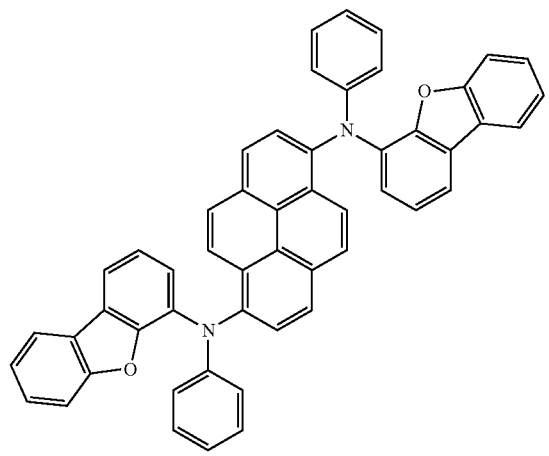
FD6
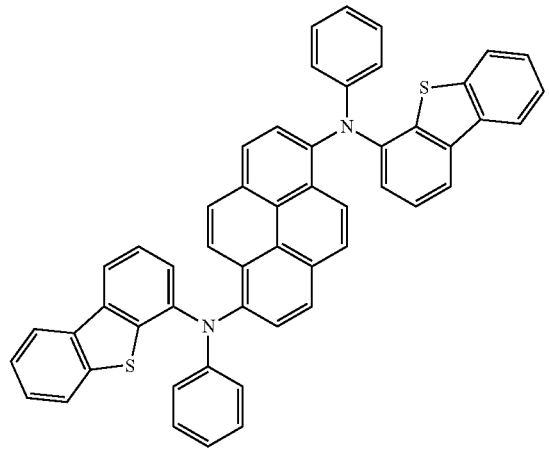
FD7
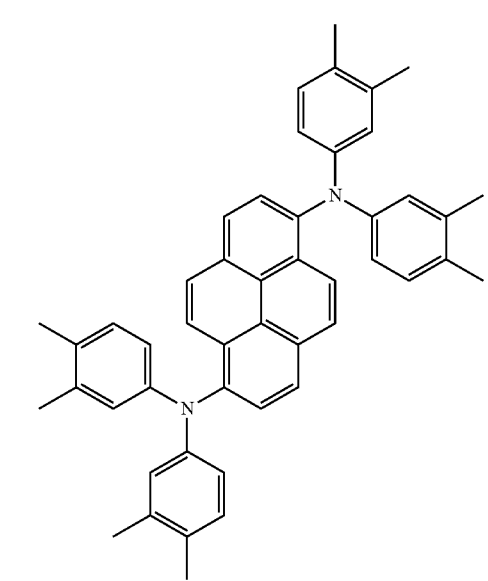
FD8
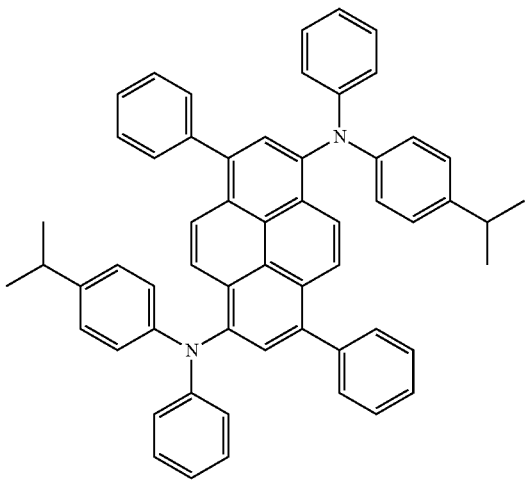
FD9
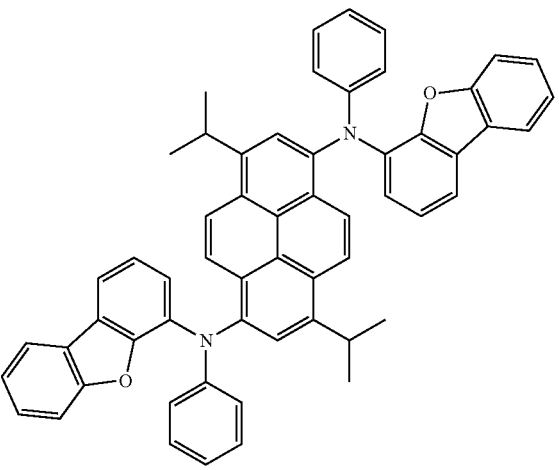
FD10
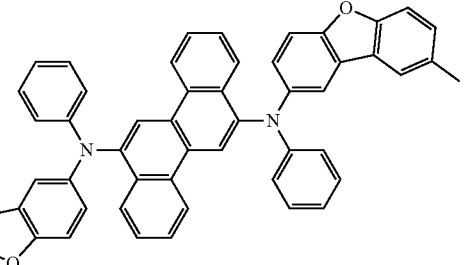
FD11
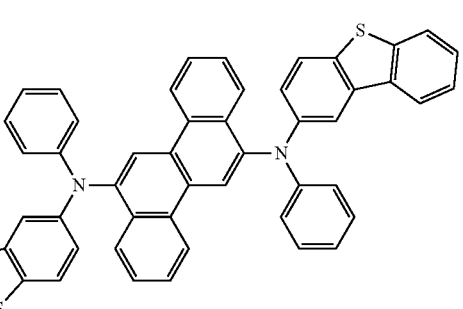

FD12
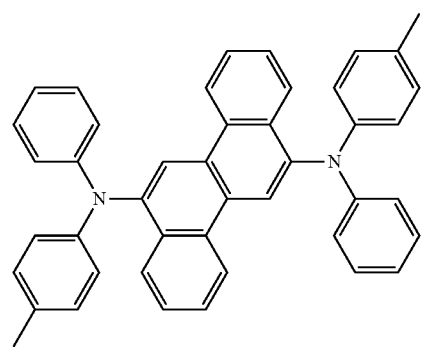
FD13
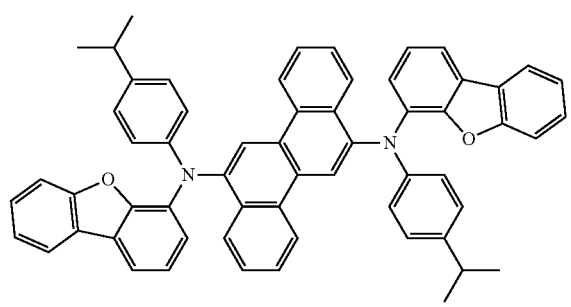
FD14
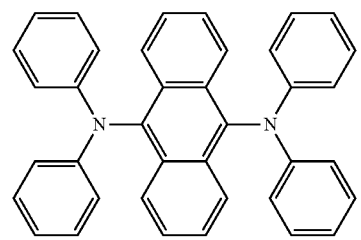
FD15
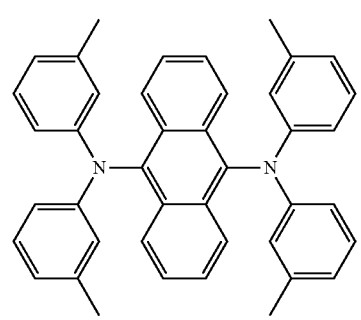
FD16
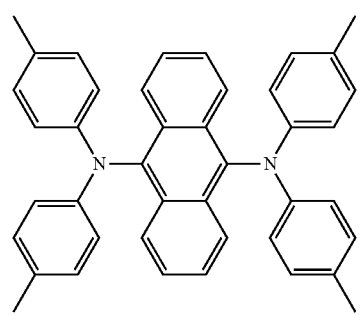
FD17
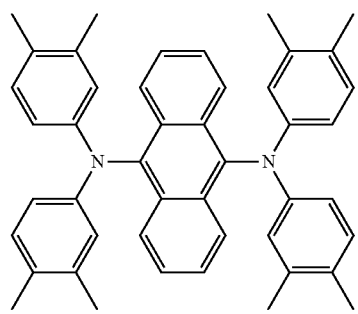
FD18
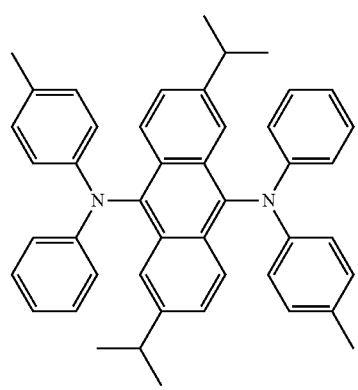
FD19
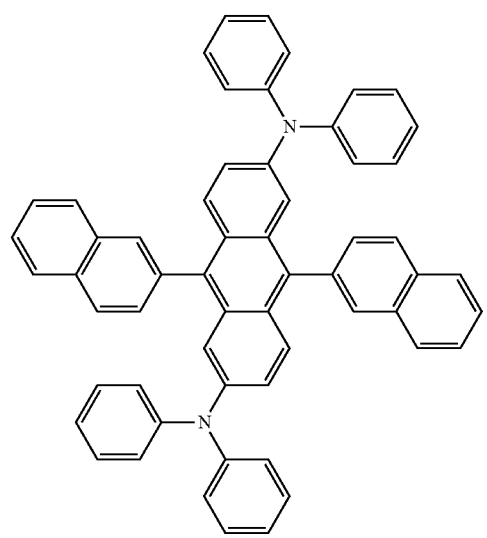
FD20
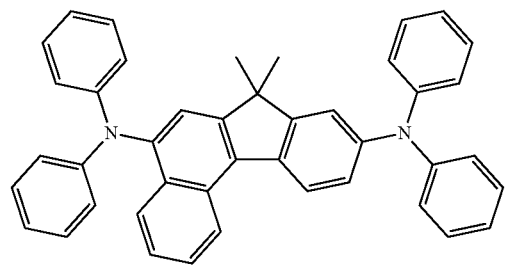

FD21
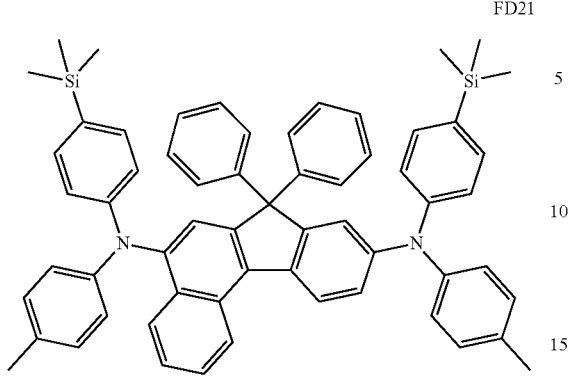
FD22
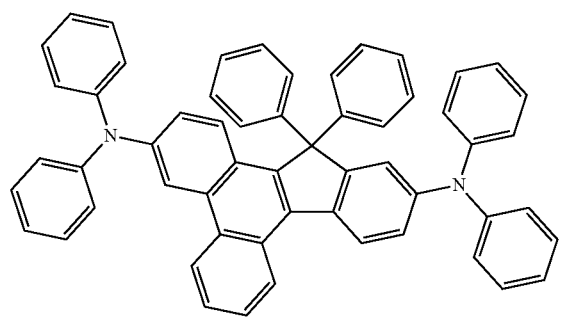
FD23
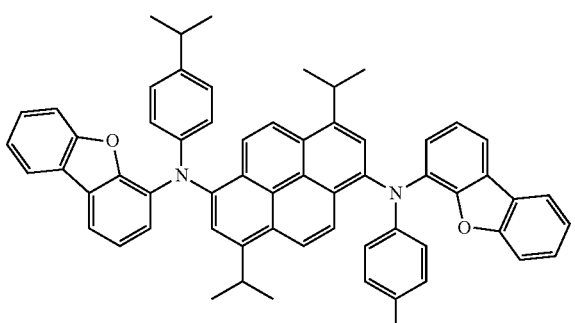
FD24
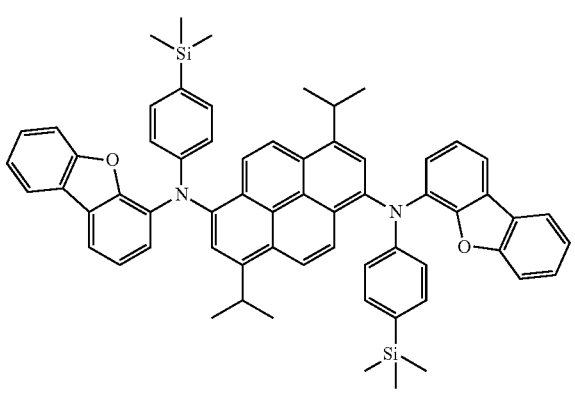
FD25
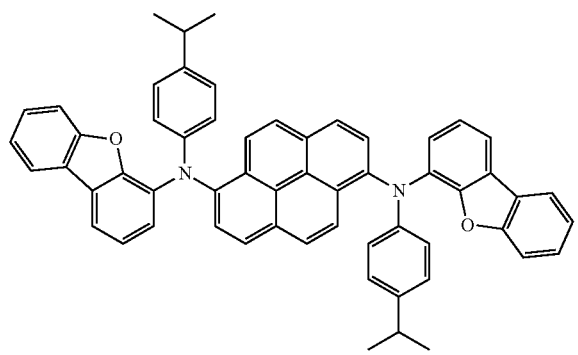
FD26
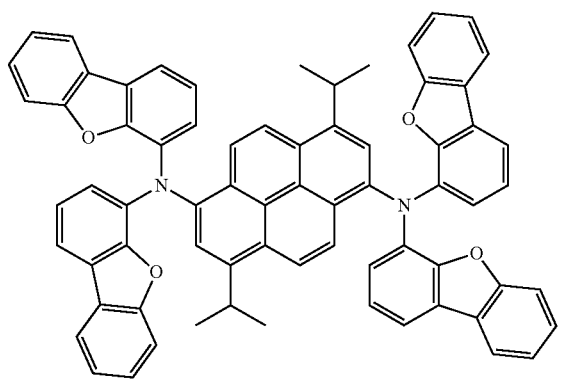
FD27
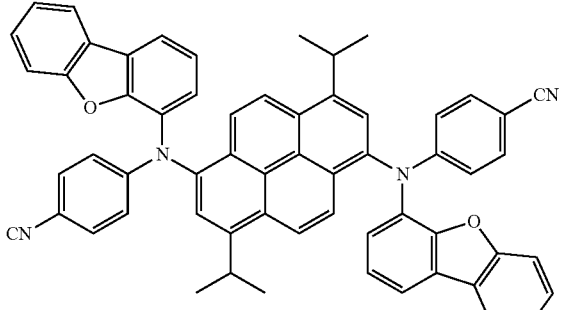
FD28
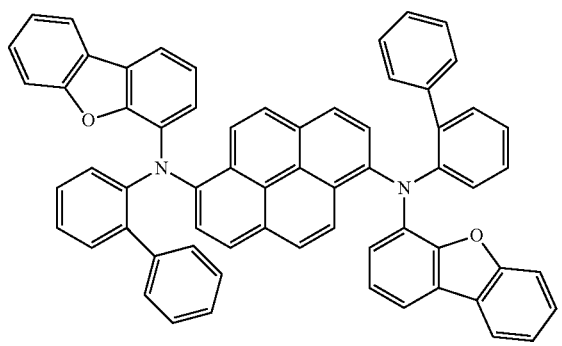

-continued
FD29
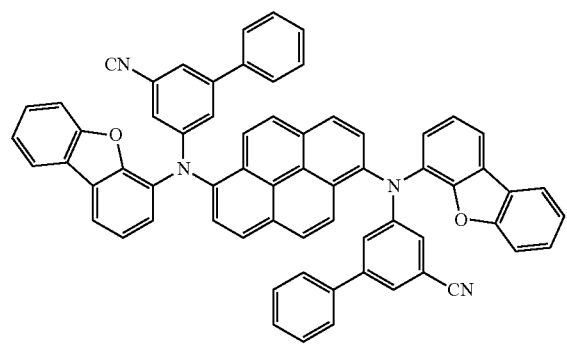
FD30
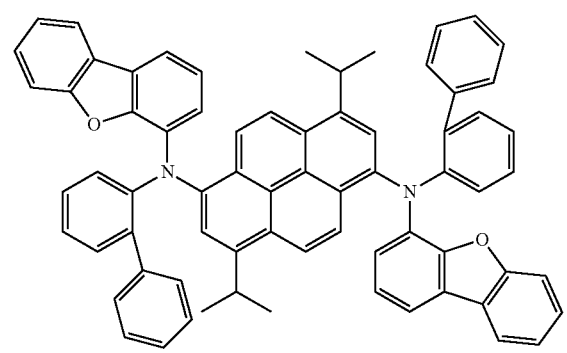
FD31
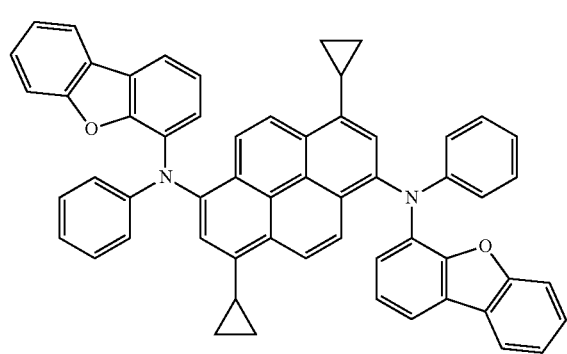
FD32
-continued
FD33
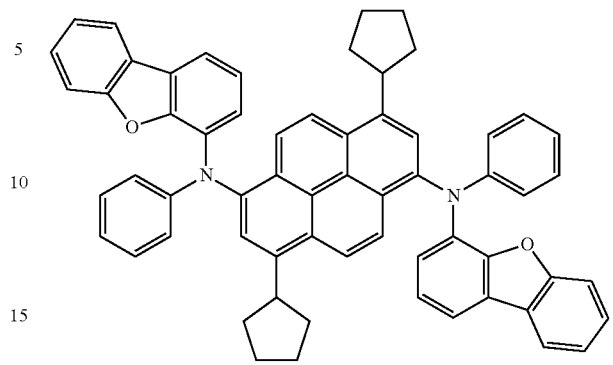
FD34
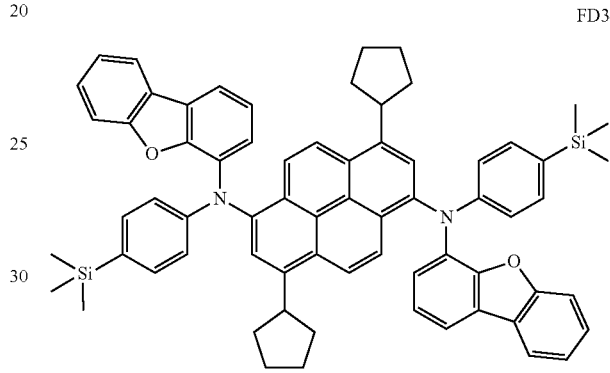
FD35
FD36
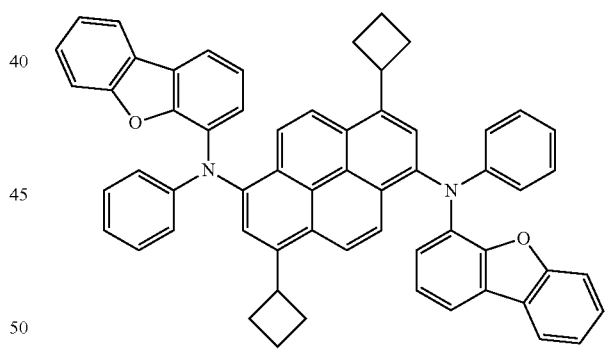

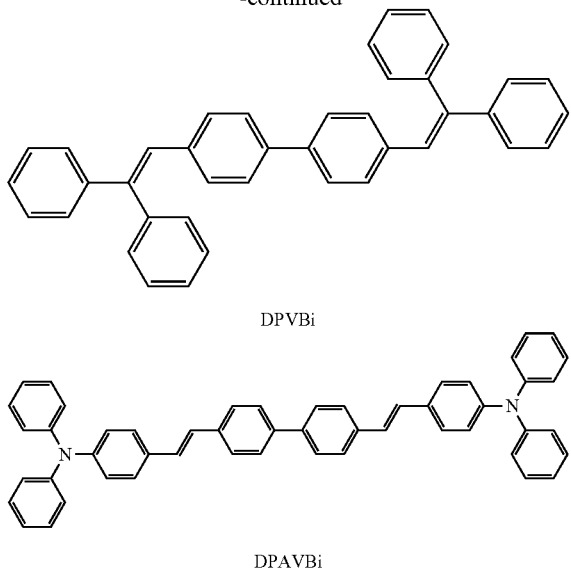

DPVBi

DPAVBi

Quantum Dot in Emission Layer

The emission layer 153 may include a quantum dot.

As used herein, a quantum dot refers to a crystal of a semiconductor compound and may include any material emitting emission wavelengths of different lengths according to the size of the crystal. Therefore, exemplary embodiments of quantum dot material are not particularly limited. The diameter of the quantum dot is not particularly limited either, but may be, for example, in a range of about 1 nm to about 10 nm.

The quantum dot in the emission layer 153 including the quantum dot may be synthesized by a wet chemical process, a metal organic chemical vapor deposition process, a molecular beam epitaxy process, or any process similar thereto.

According to the wet chemical process, a precursor material may be added to an to organic solvent to grow a quantum dot particle crystal. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled. In some exemplary embodiments, the quantum dot may include a Groups III-VI semiconductor compound; a Groups I, III, and VI semiconductor compound; a Groups II-VI semiconductor compound; a Groups III-V semiconductor compound; a Groups IV-VI semiconductor compound; a Group IV element or compound; or any combination thereof.

For example, the Groups III-VI semiconductor compound may include a binary compound, such as $In_2S_3$. For example, the Groups I, III, and VI semiconductor compound may include a ternary compound, such as AgInS, $AgInS_2$, CuInS, or $CuInS_2$; or any combination thereof.

For example, the Groups II-VI semiconductor compound may include a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

For example, the Groups III-V semiconductor compound may include a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InNAs, InNSb, InPAs, or InPSb, a quaternary compound, such as GaAlNAs, GaAlNP, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof.

For example, the Group IV-VI semiconductor compound may include a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

For example, the Group IV element or compound may include a single element, such as Si or Ge; a binary compound, such as SiC or SiGe; or any combination thereof.

In this regard, respective elements included in the binary compound, the ternary compound, or the quaternary compound may exist in particles at an uniform concentration, or may exist in the same particle in a state in which a concentration distribution is partially different.

The quantum dot may have a single structure having a uniform concentration of each element included in the corresponding quantum dot or a dual structure of a core-shell. In some exemplary embodiments, the material included in the core may be different from the material included in the shell.

The shell of the quantum dot may function as a protective layer for maintaining semiconductor characteristics by preventing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot are a metal or non-metal oxide, a semiconductor compound, or any combination thereof. For example, the metal or non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound, such as $MgAl_2O_4$, $CoFe_2O_4$, $NiFe_2O_4$, or $CoMn_2O_4$, but the exemplary embodiments are not limited thereto. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the exemplary embodiments are not limited thereto.

A full width of half maximum (FWHM) of an emission wavelength spectrum of the quantum dot may be equal to or less than about 45 nm, for example, equal to or less than 40 nm, for example, equal to or less than about 30 nm. When the FWHM of the emission wavelength spectrum of the quantum dot is within the ranges above, color purity or color reproduction may be improved. In addition, light emitted through such a quantum dots may be irradiated omnidirectionally. Accordingly, a wide viewing angle may be increased.

In addition, the quantum dot may be specifically, a spherical, pyramidal, multi-arm, or cubic nanoparticle, a nanotube, a nanowire, a nanofiber, or nanoplate particle, but the exemplary embodiments are not limited thereto.

By adjusting the size of the quantum dot, the energy band gap may also be s adjusted, thereby obtaining light of various wavelengths in the quantum dot emission layer.

Therefore, by using quantum dots of different sizes, a light-emitting device that emits light of various wavelengths may be implemented. In some exemplary embodiments, the size of the quantum dot may be selected to emit red, green and/or blue light. In addition, the size of the quantum dot may be formed by combining light of various colors, so as to emit white light.

Electron Transport Region in Interlayer 150

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole blocking layer, an electron control layer, an electron transport layer, an electron injection layer, or any combination thereof, but the exemplary embodiments are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein in each structure, layers are sequentially stacked on the emission layer 153. However, the exemplary embodiments of the structure of the electron transport region are not limited thereto.

The electron transport region (for example, the buffer layer, the hole blocking layer, the electron control layer, or the electron transport layer in the electron transport region) may include a metal-free compound including at least one π-electron deficient nitrogen-containing cyclic group, which may easily accept electrons.

The "π-electron deficient nitrogen-containing cyclic group" may be a $C_1$-$C_{60}$ heterocyclic group which has, as a ring-forming moiety, at least one *—N=*' moiety.

For example, the "π-electron-deficient nitrogen-containing cyclic group" may be i) a first ring, ii) a condensed cyclic group in which two or more first rings are condensed to each other, or iii) a condensed cyclic group in which at least one first ring and at least one second ring are condensed, wherein the first ring is a heteromonocyclic group (for example, an imidazole group, a pyridine group, a triazine group, etc.) which includes, as a ring-forming moiety, at least one *—N=*' moiety, and the second ring is a cyclic group (for example, a benzene group, a dibenzofuran group, a carbazole group, etc.) which does not include, as a ring-forming moiety, *—N=*' moiety.

Examples of the π-electron deficient nitrogen-containing cyclic group are a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, and an imidazopyridazine group, but the exemplary embodiments are not limited thereto.

For example, the electron transport region may include a compound represented by Formula 601 and including at least one π-electron deficient nitrogen-containing cyclic group:

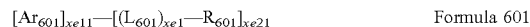

$$[Ar_{601}]_{xe11}—[(L_{601})_{xe1}—R_{601}]_{xe21} \quad \text{Formula 601}$$

wherein, in Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xe1 may be 0, 1, 2, 3, 4, or 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be the same as described in connection with $Q_1$, and xe21 may be 1, 2, 3, 4, or 5.

In some exemplary embodiments, at least one of $Ar_{601}$, $L_{601}$, and $R_{601}$ in Formula 601 may each independently include at least one 7c-electron deficient nitrogen-containing ring.

In one or more exemplary embodiments, when xe1 1 in Formula 601 is 2 or more, two or more $Ar_{601}$(s) may be linked to each other via a single bond.

In one or more exemplary embodiments, $A_{601}$ in Formula 601 may be a substituted or unsubstituted anthracene group.

In one or more exemplary embodiments, the electron transport region may include a compound represented by Formula 601-1:

Formula 601-1

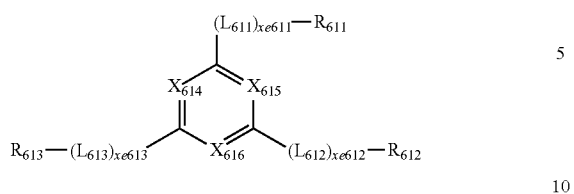

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a biphenyl group, a terphenyl group, or a naphthyl group.

For example, xe1 and xe611 to xe613 in Formula 601 and 601-1 may each independently be 0, 1, or 2.

The electron transport region may include one of Compounds ET1 to ET36, 2,9-dimethyl-4,7-diphenyl-1,10-phenanthroline (BCP), 4,7-diphenyl-1,10-phenanthroline (Bphen), tris-(8-hydroxyquinoline)aluminum (Alq₃), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof, but the exemplary embodiments are not limited thereto:

ET1

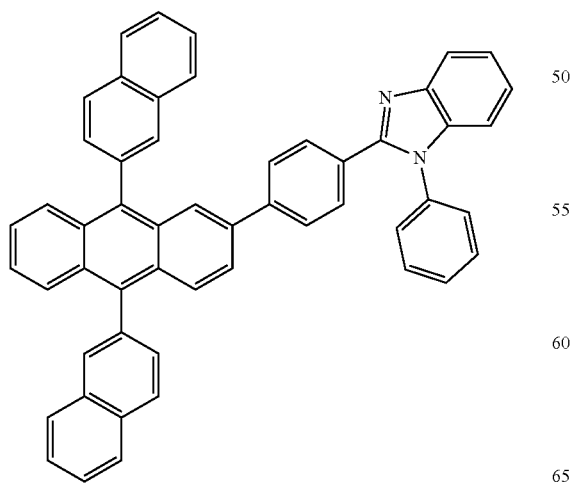

ET2

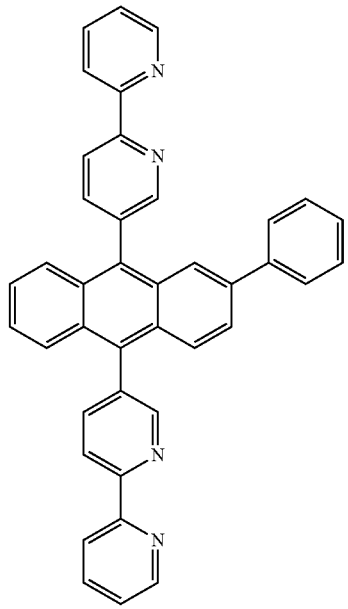

ET3

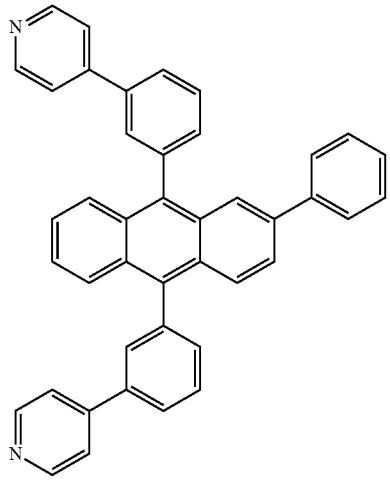

ET4

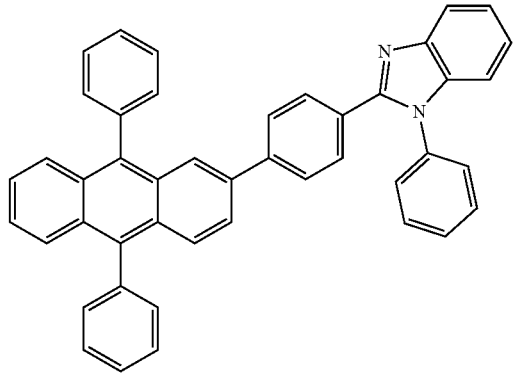

ET5
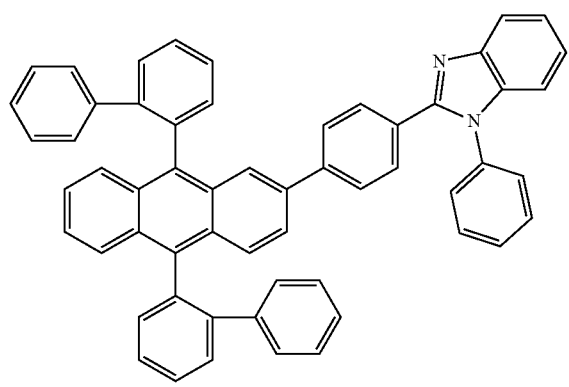
ET8
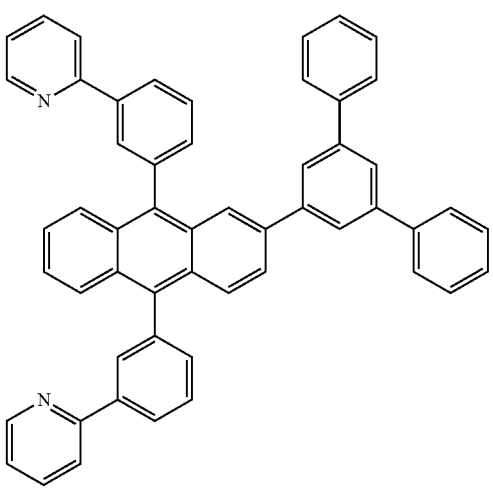
ET6
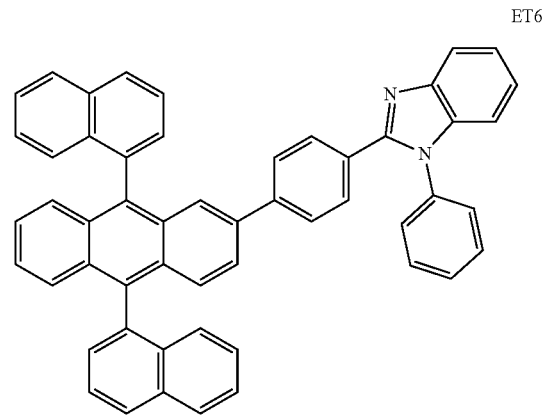
ET7
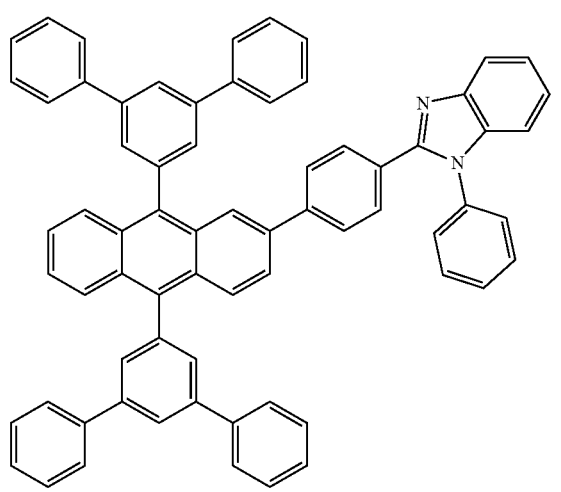
ET9
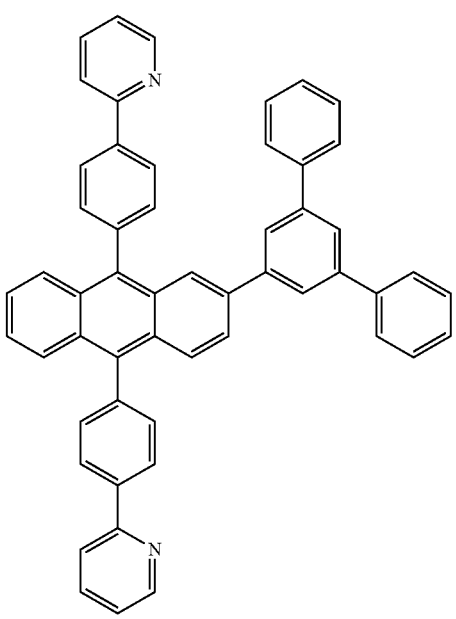

ET10
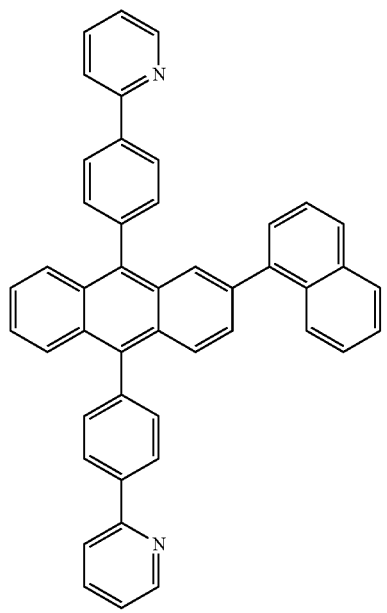
ET11
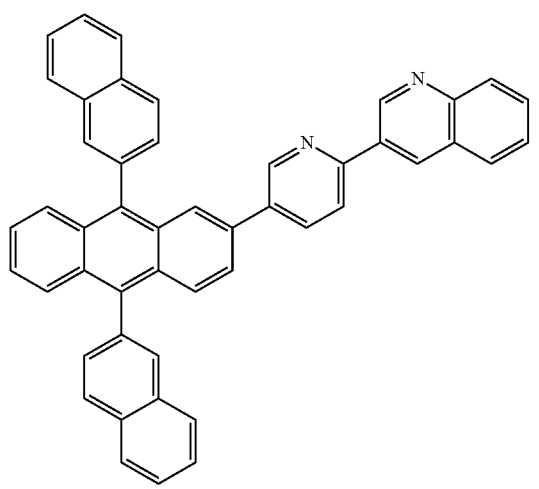
ET12
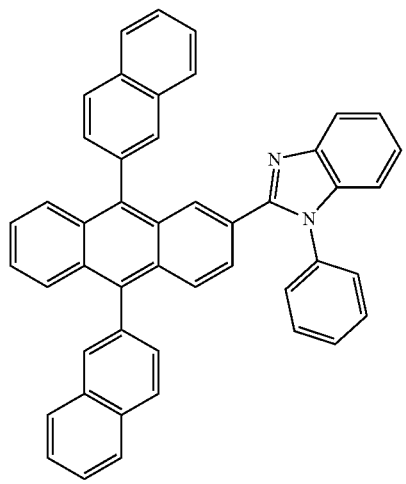
ET13
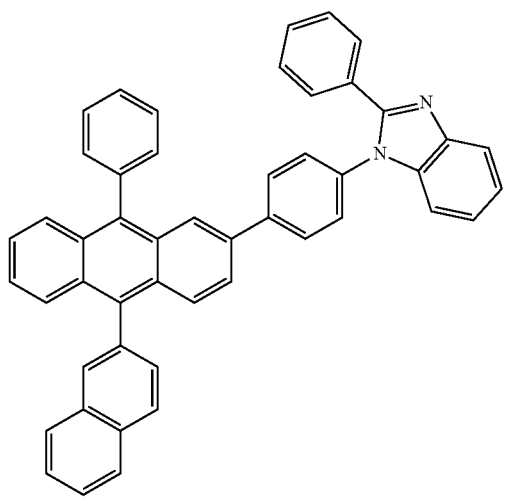
ET14
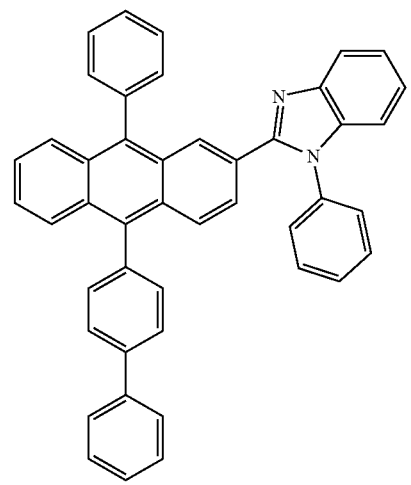
ET15
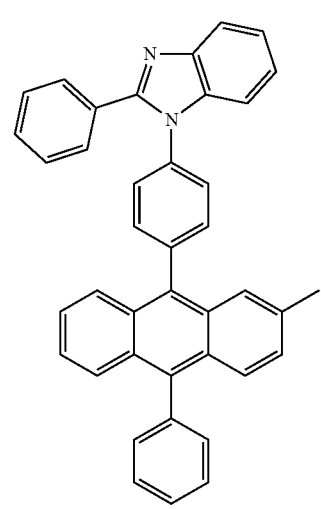

ET16
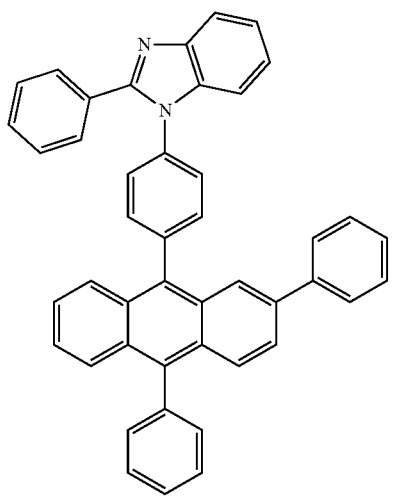
ET17
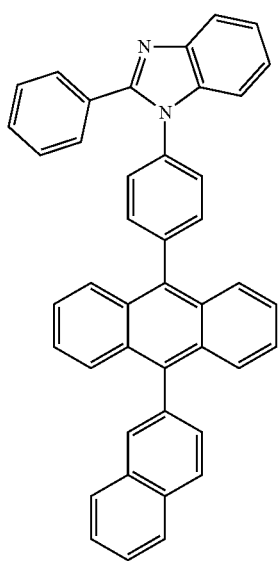
ET18
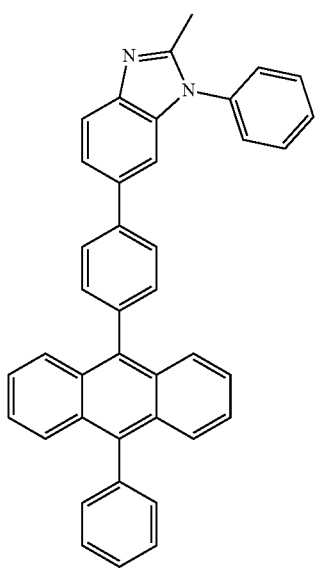
ET19
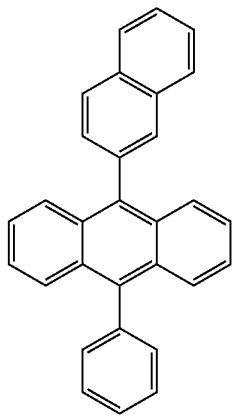
ET20
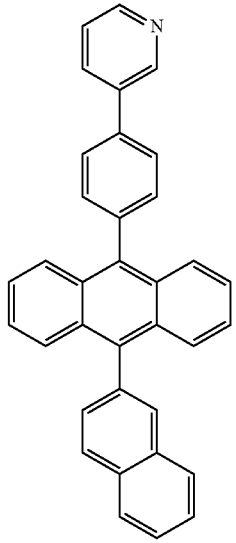
ET21
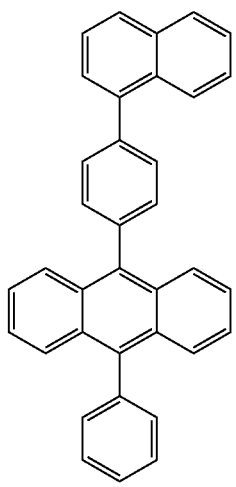

ET22
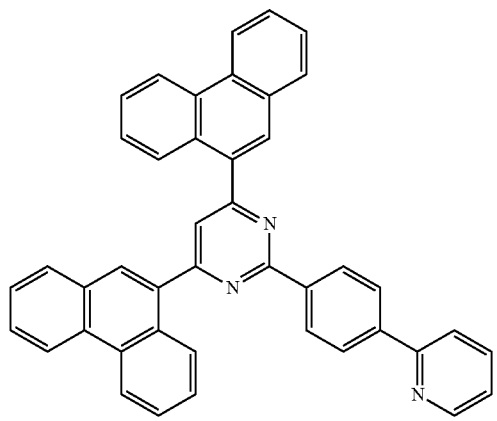
ET25
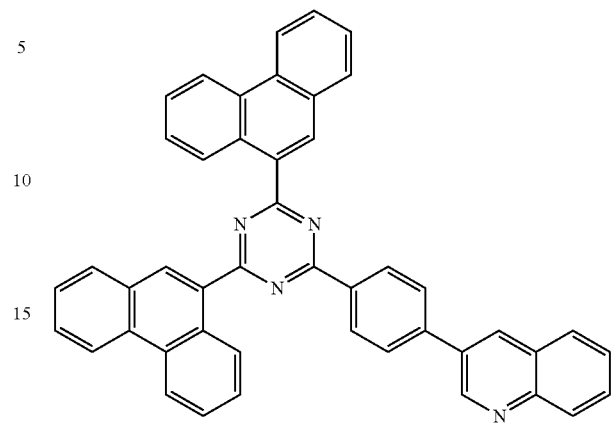
ET23
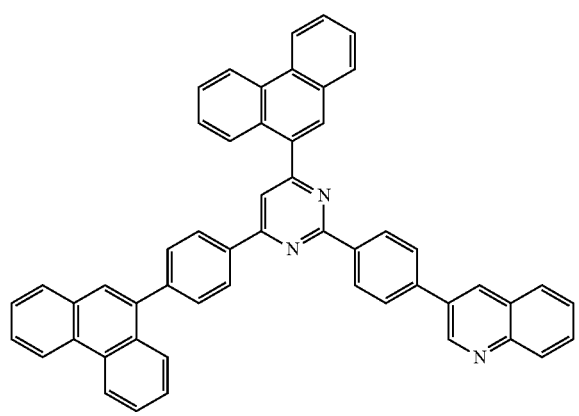
ET26
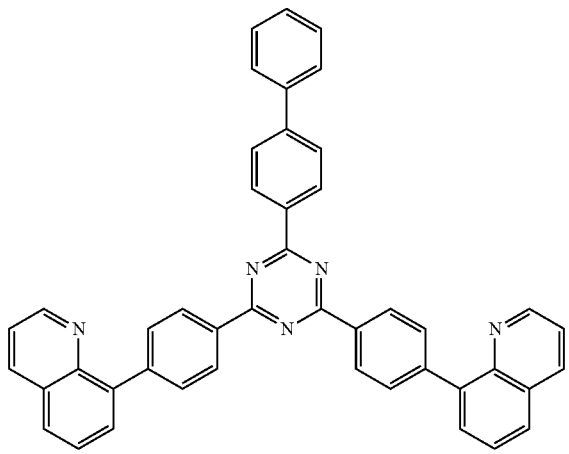
ET24
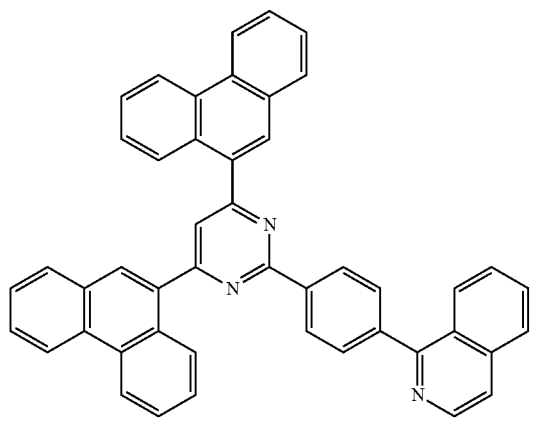
ET27
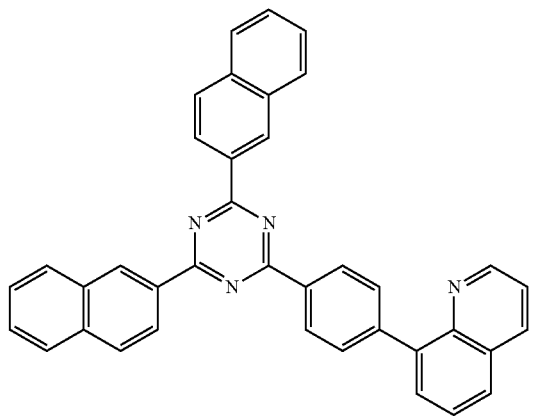

ET28
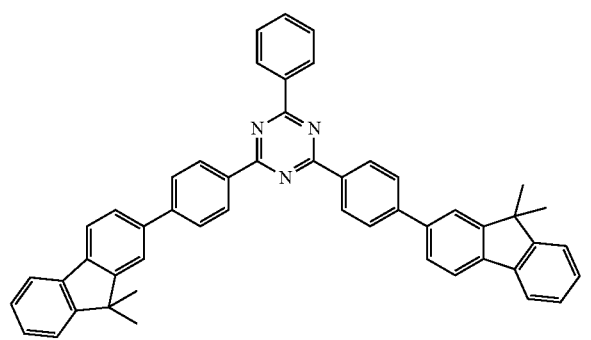
ET29
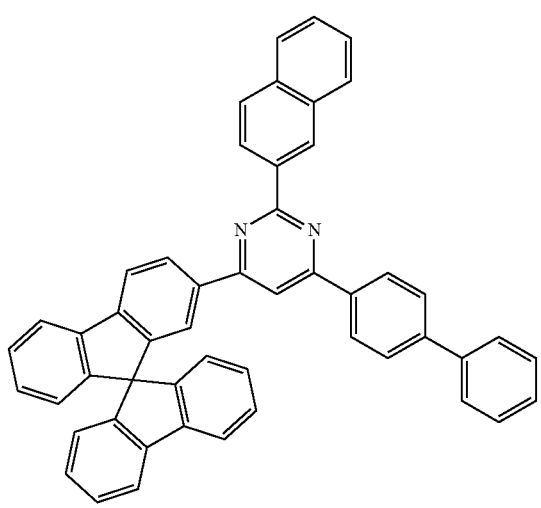
ET30
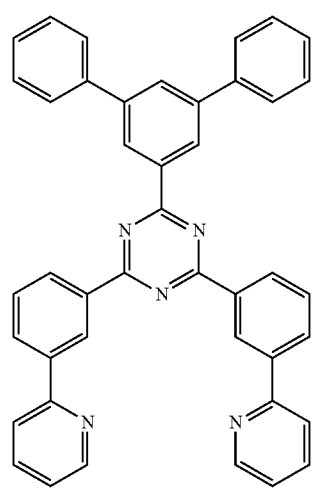
ET31
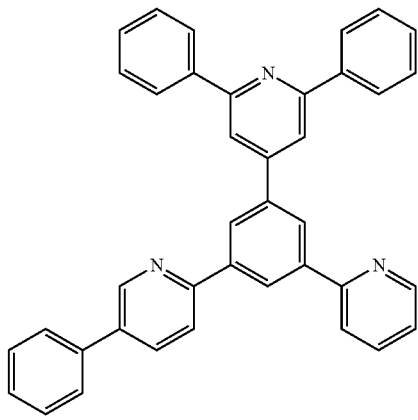
ET32
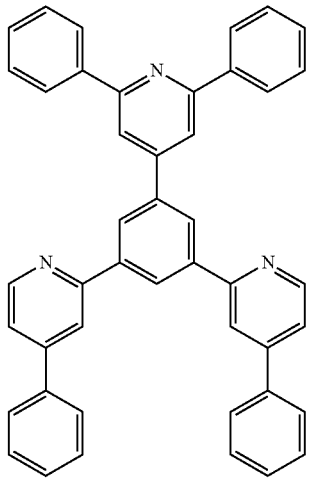
ET33
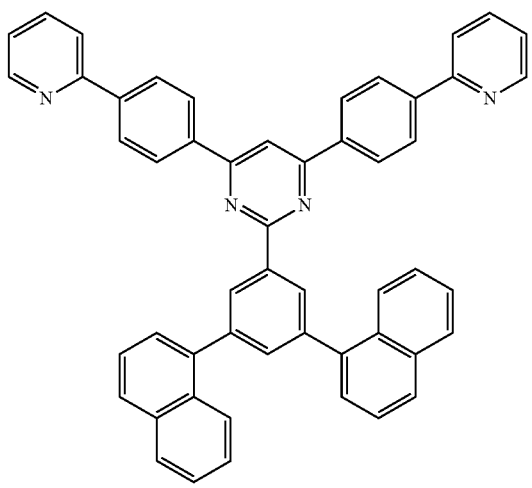

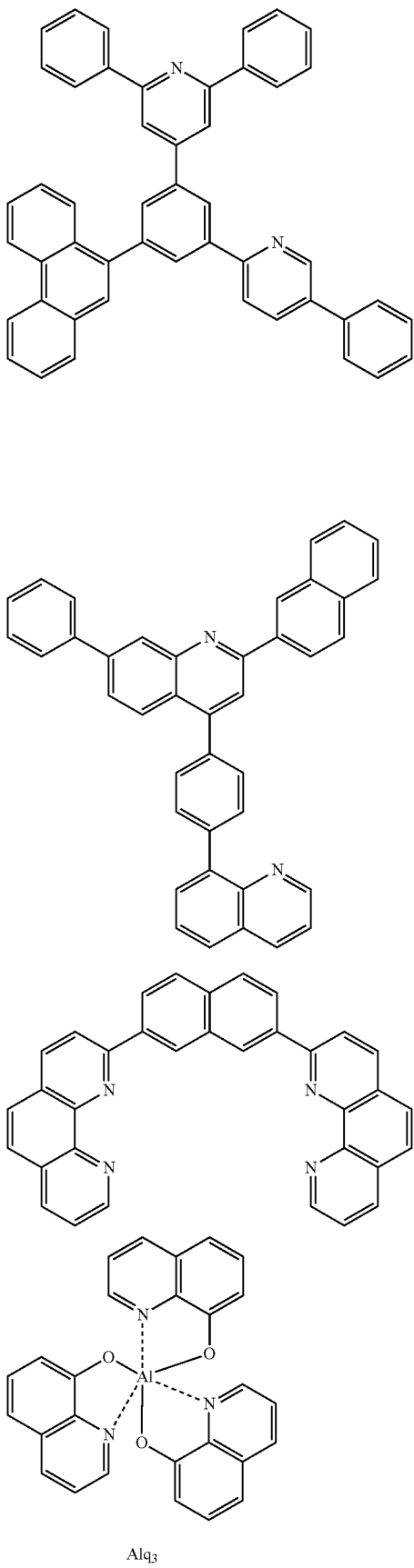

Alq₃

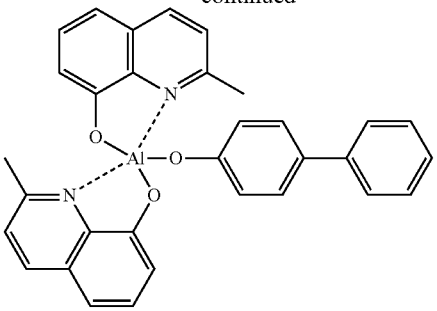

BAlq

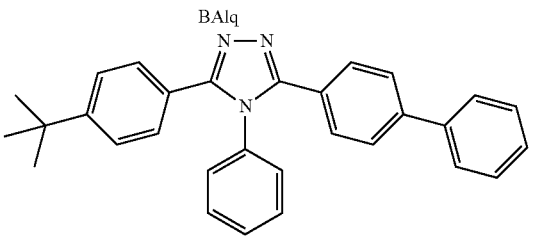

TAZ

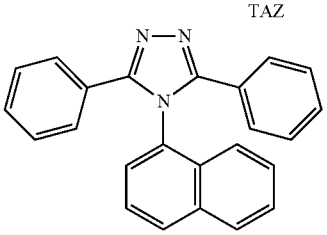

NTAZ

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within the ranges above, excellent hole blocking characteristics or excellent electron control characteristics may be obtained without a substantial increase in driving voltage.

The thickness of the electron transport layer may be in a range of about 100 Å to about 1,000 Å, for example, about 150 Å to about 500 Å. When the thickness of the electron transport layer is within the ranges above, satisfactory electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof, but the exemplary embodiments are not limited thereto.

For example, the metal-containing material may include a Li complex. The Li complex may include, for example, Compound ET-D1 (8-Hydroxyquinolinato)lithium (LiQ) or ET-D2:

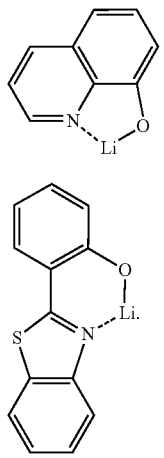

ET-D1

ET-D2

The electron transport region may include an electron injection layer that facilitates the injection of electrons from the second electrode 190. The electron injection layer may directly contact the second electrode 190.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combinations thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides or halides (for example, fluorides, chlorides, bromides, or iodides) of the alkali metal, the alkaline earth metal, and the rare earth metal, or any combination thereof.

The alkali metal-containing compound may be alkali metal oxides, such as $Li_2O$, $Cs_2O$, or $K_2O$, and alkali metal halides, such as LiF, NaF, CsF, KF, LiI, NaI, CsI, or KI, or any combination thereof. The alkaline earth-metal containing compound may include alkaline earth-metal oxides, such as BaO, SrO, CaO, $Ba_xSr_{1-x}O$ (0<x<1), or $Ba_xCa_{1-x}O$ (0<x<1). The rare earth metal-containing compound may include $YbF_3$, $ScF_3$, $ScO_3$, $Y_2O_3$, $Ce_2O_3$, $GdF_3$, $TbF_3$, $YbI_3$, $ScI_3$, $TbI_3$, or any combination thereof.

The alkali metal complex, the alkaline earth-metal complex, and the rare earth metal complex may include i) one of ions of the alkali metal, the alkaline earth metal, and the rare earth metal and ii) as a ligand linked to the metal ion, for example, hydroxyquinoline, hydroxyan isoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenylbenzothiazole, bipyridine, phenanthroline, cyclopentadiene, or any combination thereof, but the exemplary embodiments are not limited thereto.

The electron injection layer consist of an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, the compound represented by Formula 601). When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

The thickness of the electron injection layer may be in a range of about 1 Å to about 100 Å, for example, about 3 Å to about 90 Å. When the thickness of the electron injection layer is within the ranges above, satisfactory electron injection characteristics may be without a substantial increase in driving voltage.

Second Electrode 190

The second electrode 190 is located on the middle layer 150 having such a structure. The second electrode 190 may be a cathode, which is an electron injection electrode, and as a material for forming the second electrode 190, a metal, an alloy, an electrically conductive compound, or any combination thereof, each having a low work function, may be used.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), an indium tin oxide (ITO), an indium zinc oxide (IZO), or any combination thereof, but the exemplary embodiments are not limited thereto. The second electrode 190 may be a transmissive electrode, a semi-transmissive electrode, or a reflective electrode. The second electrode 190 may have a single-layered structure or a multi-layered structure including two or more layers.

Capping Layer

A first capping layer may be located outside the first electrode 110, and/or a second capping layer may be located outside the second electrode 190. In detail, the light-emitting device 10 may have a structure in which the first capping layer, the first electrode 110, the interlayer 150, and the second electrode 190 are sequentially stacked in this stated order, a structure in which the first electrode 110, the interlayer 150, the second electrode 190, and the second capping layer are sequentially stacked in this stated order, or a structure in which the first capping layer, the first electrode 110, the interlayer 150, the second electrode 190, and the second capping layer are sequentially stacked in this stated order.

Light generated in an emission layer of the interlayer 150 of the light-emitting device 10 may be extracted toward the outside through the first electrode 110 and the first capping layer, each of which may be a semi-transmissive electrode or a transmissive electrode, or light generated in an emission layer of the interlayer 150 of the light-emitting device 10 may be extracted toward the outside through the second electrode 190 and the second capping layer, each of which may be a semi-transmissive electrode or a transmissive electrode. The first capping layer and the second capping layer may increase external luminescence efficiency according to the principle of constructive interference.

The first capping layer and the second capping layer may each independently be an organic capping layer including an organic material, an inorganic capping layer including an inorganic material, or a composite capping layer including an organic material and an inorganic material. The first capping layer and the second capping layer may each have a refractive index of equal to or greater than about 1.6 at a wavelength of 589 nm.

At least one of the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof. In some exemplary embodiments, at least one of the first capping layer and the second capping layer may each independently include an amine group-containing compound.

In one or more exemplary embodiments, at least one of the first capping layer and second capping layer may each independently include the compound represented by Formula 201, the compound represented by Formula 202, or any combination thereof. In one or more exemplary embodiments, at least one of the first capping layer and the second capping layer may each independently include one of Compounds HT28 to HT33, one of Compounds CP1 to CP5, or any combination thereof, but the exemplary embodiments are not limited thereto:

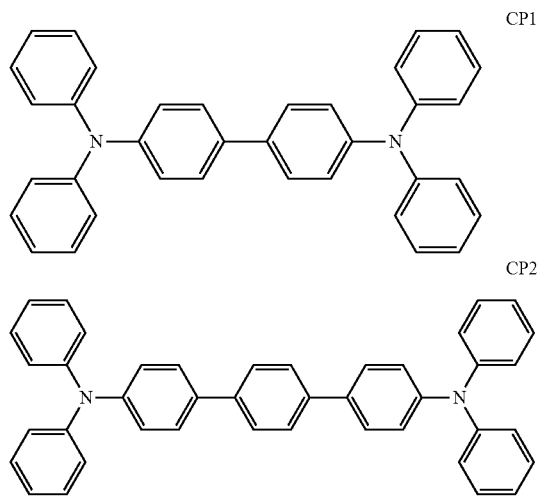

CP1

CP2

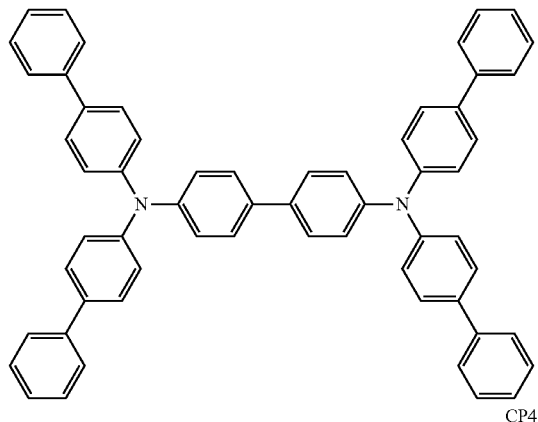

CP3

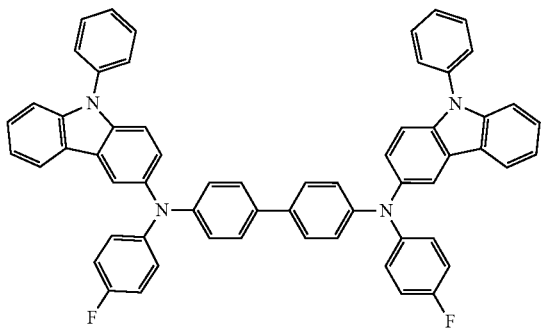

CP4

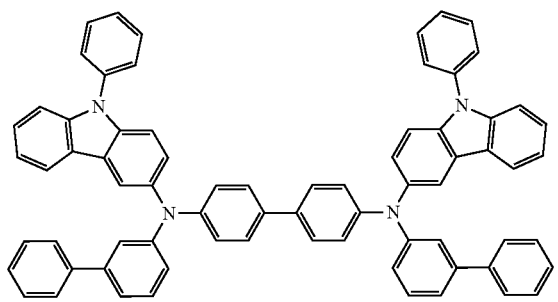

CP5

Apparatus

The light-emitting device may be included in various apparatuses, such as a light-emitting apparatus, an authentication apparatus, or an electronic apparatus, which includes the light-emitting device.

The light-emitting apparatus may further include, in addition to the light-emitting device, a color filter, a color conversion layer, or both a color filter and a color conversion layer. The color filter or the color conversion layer may be located in at least one traveling direction of light emitted from the light-emitting device. For example, the light emitted from the light-emitting device may be blue light or white light, but the exemplary embodiments are not limited thereto. The light-emitting device may be the same as described above.

The light-emitting apparatus may include a first substrate. The first substrate may include a plurality of subpixel areas, and the color filter or the color conversion layer may include a plurality of subpixel areas respectively corresponding to the plurality of color filter areas. A pixel-defining film may be located between the plurality of subpixel areas to define each of the subpixel areas. The color filter may further include a light-blocking pattern located between adjacent color filter areas of the plurality of color filter areas, and the color conversion layer may further a light-blocking pattern located between adjacent color conversion areas of the plurality of color conversion areas.

The plurality of color filter areas or the plurality of color conversion areas may include: a first area emitting first color light; a second area emitting second color light; and/or a third area emitting third color light, and the first color light, the second color light, and/or the third color light may have different maximum luminescence wavelengths from one another. For example, the first color light may be red light, the second color light may be green light, and the third color light may be blue light, but the exemplary embodiments are not limited thereto. For example, the plurality of color filter areas or the plurality of color conversion areas may each include quantum dots, but the exemplary embodiments are not limited thereto. In detail, the first area may include red quantum dots, the second area may include green quantum dots, and the third area may not include quantum dots. The quantum dots may be the same as described above. Each of the first area, the second area and/or the third area may further include a scatter, but the exemplary embodiments are not limited thereto.

In some exemplary embodiments, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum luminescence wavelengths from one another. In detail, the first light may be blue light, the first first-color light may be red light, the second first-color light may be green light, and the third first-color light may be blue light, but the exemplary embodiments are not limited thereto.

The light-emitting apparatus may further include a thin-film transistor in addition to the light-emitting device as described above. The thin-film transistor may include a source electrode, a drain electrode, and an active layer, wherein any one of the source electrode and the drain electrode may be eclectically connected to any one of the first electrode and the second electrode of the light-emitting device. The thin-film transistor may further include a gate electrode, a gate insulation layer, or the like.

The active layer may include crystalline silicon, amorphous silicon, organic semiconductor, oxide semiconductor, or the like, but the exemplary embodiments are not limited thereto. The light-emitting apparatus may further include a sealing portion for sealing the light-emitting device. The sealing portion may be located between the color filter and the light-emitting device. The sealing portion allows light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin-film encapsulation layer, the light-emitting apparatus may be flexible.

The light-emitting apparatus may be used as various displays, light sources, and the like. The authentication apparatus may be, for example, a biometric authentication apparatus for authenticating an individual by using biometric information of a biometric body (for example, a finger tip, a pupil, or the like). The authentication apparatus may further include, in addition to the light-emitting device, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various measuring instruments, meters (for example, meters for a vehicle, an aircraft, and a vessel), projectors, and the like, but the exemplary embodiments are not limited thereto.

Preparation Method of a Light-Emitting Device

An exemplary method of preparing the light-emitting device according to another aspect of the invention includes: forming the hole transport region on the first electrode, wherein the forming of the hole transport region includes a solution process using the hole-transporting ink composition including the adhesion-promoting compound and the hole-transporting compound. According to the exemplary method of preparing the light-emitting device, the hole transport region is formed by using the hole-transporting ink composition so that the self-assembled monolayer, which contacts the first electrode, and a layer including the hole-transporting compound may be simultaneously formed.

The hole-transporting ink composition includes the adhesion-promoting compound, thus having, during a solution process, excellent wettability and excellent in-pixel uniformity (IPU). In this regard, a substantially uniform film may be formed by using the hole-transporting ink composition in an appropriate amount, and accordingly, the solution process may be improved and the light-emitting device having high excellent characteristics, such as luminance, high efficiency, a long lifespan, and a low driving voltage, may be obtained.

Figure 3A:
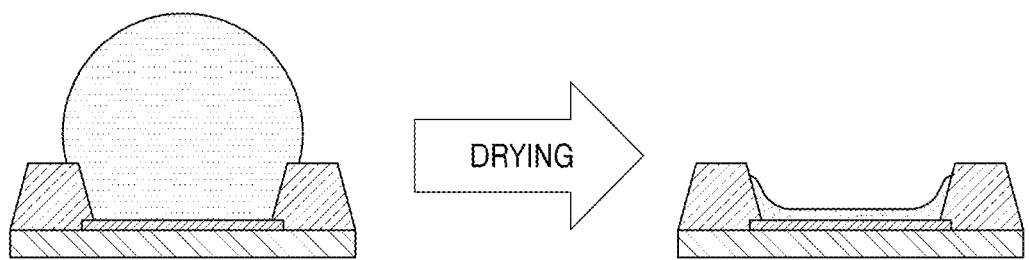
FIGS. 3A and 3B are schematic views illustrating a process of an ink composition of the art and an exemplary embodiment of a hole-transporting ink composition made according to principles of the invention.
Figure 3B:
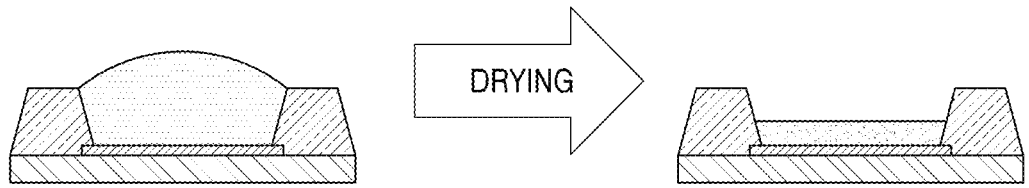

FIGS. 3A and 3B are schematic views illustrating a process of an ink composition of the art and an exemplary embodiment of a hole-transporting ink composition made according to principles of the invention. FIG. 3A schematically shows a process using an ink composition of the related art. In a general inkjet process, a large amount of an ink composition is required to fill all pixels, and a coffee ring phenomenon occurs upon drying, resulting in formation of an uneven film. This is shown in FIG. 3A as the thickness of the film is greater at its outer edges than the remaining portion of the film. However, in the case of using a hole-transporting ink composition made according to the principles and some exemplary embodiments of the invention, as shown e.g., in FIG. 3B, a relatively small amount of the hole-transporting ink composition is used, and a coffee ring phenomenon occurring upon drying is substantially reduced or prevented, resulting in formation of a substantially uniform film.

Additionally, the emission layer and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

General Definitions Including Substituents

The term "interlayer" as used herein refers to a single layer and/or all layers between a first electrode and a second electrode of a light-emitting device. A material included in the "interlayer" is not limited to an organic material.

The term "$C_1$-$C_{60}$ alkyl group" as used herein refers to a linear or branched aliphatic hydrocarbon monovalent group having 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and examples thereof include an ethynyl group, and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1]pentyl group, a bicyclo[2.1.1]hexyl group, a bicyclo[2.2.1]heptyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group with 1 to 10 carbon atoms containing a heteroatom (for example, N, O, Si, P, S, or any combination thereof) as a ring-forming atom, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group with 1 to 10 carbon atoms containing a heteroatom (for example, N, O, Si, P, S, or any combination thereof) as a ring-forming atom, wherein the ring has at least one a double bond. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent heterocyclic aromatic system having a heteroatom (for example, N, O, Si, P, S, or any combination thereof) as a ring-forming atom and 1 to 60 carbon atoms, and the term "$C_1$-$C_{60}$ heteroarylene group" as used herein refers to a bivalent heterocyclic aromatic system having a heteroatom (for example, N, O, Si, P, S, or any combination thereof) as a ring-forming atom and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be fused with each other.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "monovalent non-aromatic fused polycyclic group" as used herein refers to a monovalent group (for example, having 8 to 60 carbon atoms) having two or more rings fused with each other, only carbon atoms as ring-forming atoms, and no aromaticity in its entire molecular structure. Examples of the monovalent non-aromatic fused polycyclic group are an indenyl group, a fluorenyl group, a spiro-bifluorenyl group, a benzofluorenyl group, an indeno-phenanthrenyl group, and an indenoanthracenyl group. The term "divalent non-aromatic fused polycyclic group" as used herein refers to a divalent group having a structure corresponding to the monovalent non-aromatic fused polycyclic group.

The term "monovalent non-aromatic fused heteropolycyclic group" as used herein s refers to a monovalent group (for example, having 1 to 60 carbon atoms) in which two or more rings are fused to each other, which includes, as a ring-forming atom, a heteroatom (for example, N, O, Si, P, and S, or any combination thereof) other than carbon, and which has no aromaticity in its entire molecular structure. Examples of the monovalent non-aromatic fused heteropolycyclic group are a pyrrolyl group, a thiophenyl group, a furanyl group, an indolyl io group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to the monovalent non-aromatic fused heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a compound, such as benzene, a monovalent group, such as a phenyl group, or a divalent group, such as a phenylene group. In one or more exemplary embodiments, depending on the number of substituents connected to the $C_5$-$C_{60}$ carbocyclic group, the $C_5$-$C_{60}$ carbocyclic group may be a trivalent group or a quadrivalent group.

Examples of the $C_5$-$C_{60}$ carbocyclic group are a cyclopentadiene group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and an indenoanthracene group.

The term "$C_1$-$C_{60}$ heterocyclic group" as used herein refers to a monocyclic or polycyclic group which includes 1 to 60 carbon atoms and, as a ring-forming atom, a heteroatom (for example, N, O, Si, P, S, or any combination), in addition to carbon (the carbon number may be 1 to 60). The $C_1$-$C_{60}$ heterocyclic group may be an aromatic heterocyclic group or a non-aromatic heterocyclic group. The $C_1$-$C_{60}$ heterocyclic group may be a compound such as a pyridine, a monovalent group such as a pyridinyl group, or a divalent group such as a pyridinylene group. In one or more exemplary embodiments, depending on the number of substituents connected to the $C_1$-$C_{60}$ heterocyclic group, the $C_1$-$C_{60}$ heterocyclic group may be a trivalent group or a quadrivalent group.

Examples of the $C_1$-$C_{60}$ heterocyclic group are a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, an imidazopyridazine group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and a benzothienodibenzothiophene group.

A substituent of the substituted $C_5$-$C_{60}$ carbocyclic group, the substituted $C_1$-$C_{60}$ heterocyclic group, the substituted $C_1$-$C_{60}$ alkylene group, the substituted $C_2$-$C_{60}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic fused polycyclic group, the substituted divalent non-aromatic fused heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic fused polycyclic group, and the substituted monovalent non-aromatic fused heteropolycyclic group may be:

- deuterium, —F, —Cl, —Br, —I, a hydroxyl group, a cyano group, or a nitro group;
- a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with at least one of deuterium, —F, —Cl, —Br, —I, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, or a monovalent non-aromatic fused heteropolycyclic group, each unsubstituted or substituted with at least one of deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$);
- —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$); or
- any combination thereof.

$Q_1$ to $Q_3$, $Q_{11}$ to $Q_{13}$, $Q_{21}$ to $Q_{23}$, and $Q_{31}$ to $Q_{33}$ as used herein may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group.

The term "Ph" as used herein refers to a phenyl group, the term "Me" as used herein refers to a methyl group, the term "Et" as used herein refers to an ethyl group, the term "tert-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

As used herein, the term "atom" may mean an element or its corresponding radical bonded to one or more other atoms.

The terms "hydrogen" and "deuterium" refer to their respective atoms and corresponding radicals, and the terms "—F, —Cl, —Br, and —I" are radicals of, respectively, fluorine, is chlorine, bromine, and iodine.

As used herein, a substituent for a monovalent group, e.g., alkyl, may also be, independently, a substituent for a corresponding divalent group, e.g., alkylene.

* and *' as used herein, unless defined otherwise, each refer to a binding site to a neighboring atom in a corresponding formula.

Hereinafter, a compound made according to some exemplary embodiments of the invention and a light-emitting device constructed according to some exemplary embodiments of the invention will be described in detail with reference to Synthesis Examples and Examples. The wording "B was used instead of A" used in describing Synthesis Examples refers to that an identical molar equivalent of B was used in place of A.

EXAMPLES

Preparation Example 1

A hole-transporting ink composition was prepared by using (3-aminopropyl)trimethoxy silane (1 wt %) as an adhesion-promoting compound, a polymer (10 wt %), as a hole-transporting compound, having a weight average molecular weight of 20,000 and including a repeating unit with a structure represented by Formula HIL1 and with the remainder being isoamyl benzoate as a solvent.

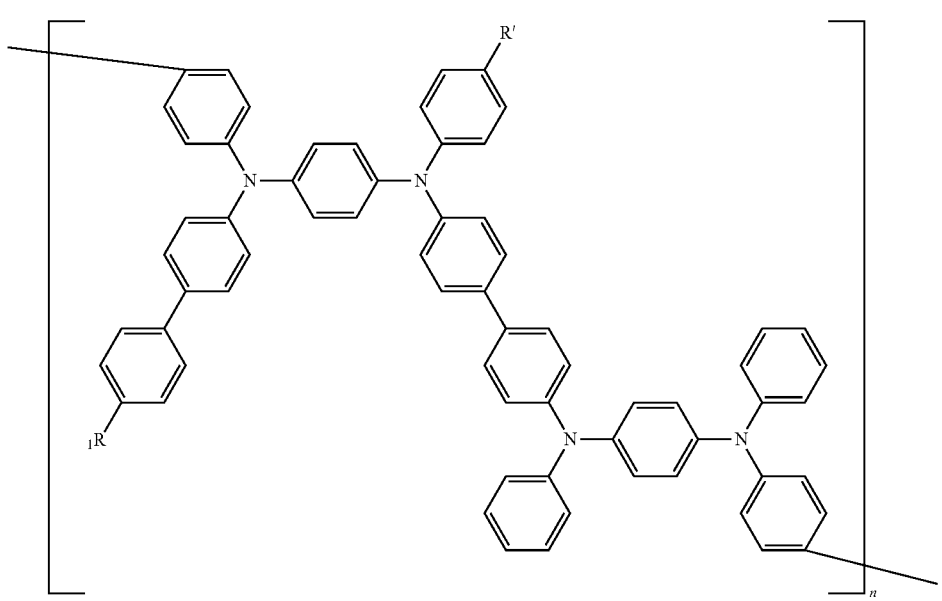

Formula HIL1

(n is an integer, and R and R' are each an aliphatic hydrocarbon having 6 or more carbon atoms)

Comparative Preparation Example 1

An ink composition was prepared in the same manner as in Preparation Example is 1, except that the adhesion-promoting compound was not used.

Evaluation Example: Evaluation of Wettability and In-Pixel Uniformity (IPU)

To pixels partitioned on a liquid-repellent substrate, the ink compositions prepared according to Preparation Example 1 and Comparative Preparation Example 1 were applied according to an inkjet printing method, so as to evaluate wettability and IPU of the ink compositions.

FIG. 4 is a depiction of results of evaluating wettability and in-pixel uniformity of a comparative and exemplary embodiments of hole-transporting ink compositions. The results are shown in FIG. 4. In the wetting evaluation item in FIG. 4, "OK" indicates that the wettability of the ink composition is sufficient, and "dewet" indicates that a dewetting phenomenon occurs due to low wettability of the ink composition.

Referring to FIG. 4, it was significantly and unexpectedly found that the hole-transporting ink composition made according to some exemplary embodiments was able to achieve excellent wettability and excellent IPU at the same time even when a small amount of the hole-transporting ink composition was applied, and that a film formed by a soluble process using the hole-transporting ink composition accordingly had excellent quality.

When the ink composition of some exemplary embodiments was used in a light-emitting device, the light-emitting device exhibit significantly and unexpectedly excellent effects in terms of luminance, luminescence efficiency, a lifespan, and a driving voltage.

Accordingly, hole-transporting ink compositions made according to the principles and exemplary embodiments of the invention may have significantly improved wettability and excellent IPU during a solution process. Therefore, a light-emitting device prepared by using the hole-transporting ink composition may exhibit excellent characteristics, such as high luminance, high efficiency, a long lifespan, and a low driving voltage.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A hole-transporting ink composition for a light emitting device, the hole-transporting ink composition comprising:
   an adhesion-promoting compound represented by Formula 1; and
   a hole-transporting compound comprising a polymeric compound including a repeating unit made from a compound represented by Formula 201 or 202:

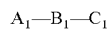

Formula 1

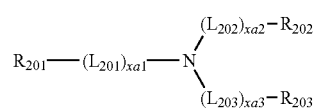

Formula 201

-continued

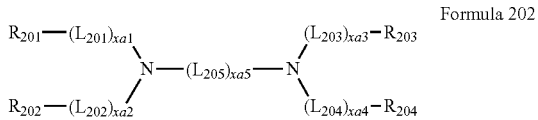
Formula 202 wherein, in Formula 1,
$A_1$ is $-Si(Q_1)(Q_2)(Q_3)$, $-S(Q^1)$, $-P(=O)(Q_1)(Q_2)$, or $-C(=O)(Q_1)$,
$B_1$ is a substituted or unsubstituted $C_1$-$C_{60}$ alkylene group, a substituted or unsubstituted $C_2$-$C_{60}$ alkenylene group, or a substituted or unsubstituted $C_2$-$C_{60}$ alkynylene group,
$C_1$ is $-O(Q_4)$, $-S(Q_4)$, $-C(=O)(Q_4)$, $-N(Q_4)(Q_5)$, a substituted or unsubstituted acryl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ fluoroalkyl group, and
$Q_1$ to $Q_5$ are each, independently from one another, hydrogen, deuterium, $-F$, $-Cl$, $-Br$, $-I$, a is hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, or a substituted or unsubstituted monovalent non-aromatic fused heteropolycyclic group, in Formulae 201 and 202
$L_{201}$ to $L_{204}$ are each independently a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-C10 heterocycloalkenylene group, a substituted or unsubstituted C6-C60 arylene group, a substituted or unsubstituted C1-C60 heteroarylene group, a substituted or unsubstituted divalent non-aromatic fused polycyclic group, or a substituted or unsubstituted divalent non-aromatic fused heteropolycyclic group,
$L_{205}$ is a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted C1-C10 heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted C6-C60 arylene group, a substituted or unsubstituted $C_1$-$C_{60}$ heteroarylene group, a substituted or unsubstituted divalent non-aromatic fused polycyclic group, or a substituted or unsubstituted divalent non-aromatic fused heteropolycyclic group,
xa1 to xa4 are each independently 0, 1, 2, or 3, and
xa5 is an integer from 2 to 10,
in Formula 201,
$R_{201}$ and $R_{202}$ are each independently a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted C1-$C_{10}$ heterocycloalkenyl group, a substituted or unsubstituted monovalent non-aromatic fused polycyclic group, or a substituted or unsubstituted monovalent non-aromatic fused heteropolycyclic group, and
$R_{203}$ is a substituted or unsubstituted $C_3$-$C_{10}$cycloalkyl group, a substituted or unsubstituted C1-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, or a substituted or unsubstituted monovalent non-aromatic fused heteropolycyclic group, and
in Formula 202,
$R_{201}$ to $R_{204}$ and $Q_{201}$ are each independently a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, or a substituted or unsubstituted monovalent non-aromatic fused heteropolycyclic group,
provided that in Formula 202, each of R201 to R203 does not comprise a substituted or unsubstituted fluorenyl group.

2. The hole-transporting ink composition of claim 1, wherein the adhesion-promoting compound comprises a silane compound or a thiol compound.

3. The hole-transporting ink composition claim 1, wherein the adhesion-promoting compound comprises a self-assembled monomolecule for forming a self-assembled monolayer.

4. A hole-transporting ink composition for a light emitting device, the hole-transporting ink composition comprising:
an adhesion-promoting compound represented by Formula 1; and a hole-transporting compound comprising a polymeric compound having a weight average molecular weight of about 20,000 and a repeating unit represented by Formula HIL1:

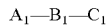   Formula 1

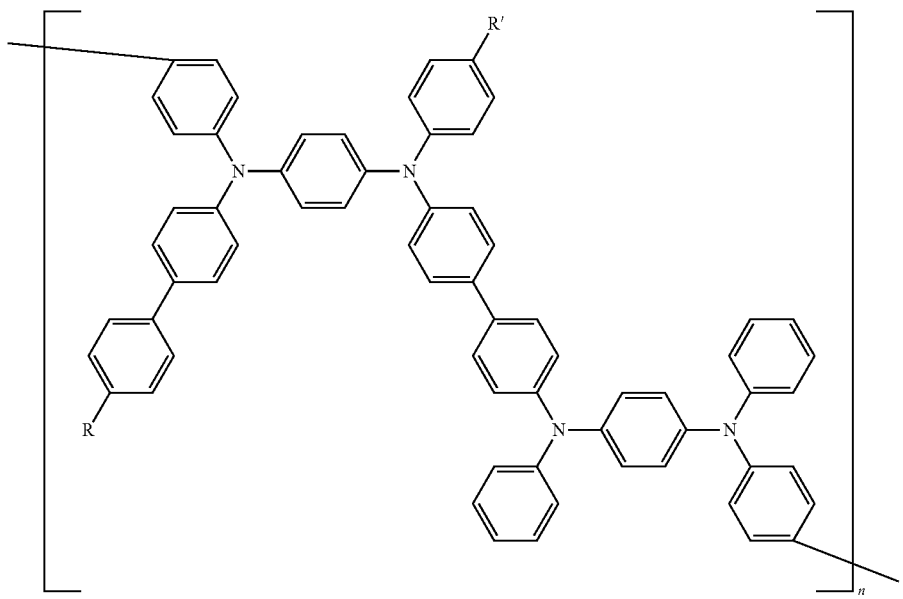

wherein, in Formula 1, $A_1$ is —Si($Q_1$)($Q_2$)($Q_3$), —S($Q^1$), —P(=O)($Q_1$)($Q_2$), or —C(=O)($Q_1$), $B_1$ is a substituted or unsubstituted $C_1$-$C_{60}$ alkylene group, a substituted or unsubstituted $C_2$-$C_{60}$ alkenylene group, or a substituted or unsubstituted $C_2$-$C_{60}$ alkynylene group, $C_1$ is —O($Q_4$), —S($Q_4$), —C(=O)($Q_4$), —N($Q_4$)($Q_5$), a substituted or unsubstituted acryl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ fluoroalkyl group, and $Q_1$ to $Q_5$ are each, independently from one another, hydrogen, deuterium, —F, —Cl, —Br, —I, a is hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, or a substituted or unsubstituted monovalent non-aromatic fused polycyclic group, or a substituted or unsubstituted monovalent non-aromatic fused heteropolycyclic group, in Formulae HIL1, n is an integer greater than zero and R and R' are each independently —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

5. The hole-transporting ink composition of claim 1, wherein the hole-transporting ink composition further comprises a solvent, the solvent comprises a non-polar solvent, and the adhesion-promoting compound is soluble in the non-polar solvent.

6. The hole-transporting ink composition of claim 5, wherein based on 100 parts by weight of the hole-transporting ink composition, an amount of the adhesion-promoting compound is in a range of about 0.1 parts by weight to about 10 parts by weight, and an amount of the hole-transporting compound is in a range of about 0.1 parts by weight to about 50 parts by weight.

7. The hole-transporting ink composition of claim 1, wherein the hole-transporting ink composition does not include a luminescent material.

8. The hole-transporting ink composition of claim 5, wherein the hole-transporting ink composition consists of the adhesion-promoting compound, the hole-transporting compound, and the solvent.

* * * * *